(12) United States Patent
Kitamura

(10) Patent No.: US 10,727,304 B2
(45) Date of Patent: Jul. 28, 2020

(54) SEMICONDUCTOR DEVICE

(71) Applicant: FUJI ELECTRIC CO., LTD., Kawasaki-shi, Kanagawa (JP)

(72) Inventor: Shoji Kitamura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/446,043

(22) Filed: Jun. 19, 2019

(65) Prior Publication Data

US 2019/0305089 A1 Oct. 3, 2019

Related U.S. Application Data

(62) Division of application No. 15/367,065, filed on Dec. 1, 2016, now Pat. No. 10,374,043.

(30) Foreign Application Priority Data

Dec. 25, 2014 (JP) .................................. 2014-263509
Jun. 17, 2015 (JP) .................................. 2015-122451

(51) Int. Cl.
*H01L 29/16* (2006.01)
*H01L 29/872* (2006.01)
(Continued)

(52) U.S. Cl.
CPC ...... *H01L 29/1608* (2013.01); *H01L 21/0465* (2013.01); *H01L 29/0615* (2013.01);
(Continued)

(58) Field of Classification Search
CPC ............. H01L 29/0615; H01L 29/0619; H01L 29/0623; H01L 29/6606; H01L 29/8611; H01L 29/872
See application file for complete search history.

(56) References Cited

U.S. PATENT DOCUMENTS 4,672,738 A 6/1987 Stengl et al.
2010/0291762 A1* 11/2010 Tarui ..................... H01L 21/046
438/519
(Continued)

FOREIGN PATENT DOCUMENTS

JP S6184830 A 4/1986
JP 2008034646 A 2/2008
(Continued)

*Primary Examiner* — Ermias T Woldegeorgis
(74) *Attorney, Agent, or Firm* — Rabin & Berdo, P.C.

(57) ABSTRACT

In an edge termination structure portion, first and second JTE regions are disposed concentrically surrounding an active region. Between the first and second JTE regions, a p-type electric field relaxation region is disposed that includes a first subregion and a second subregion alternately and repeatedly arranged concentrically surround a periphery of the first JTE region. An average impurity concentration of the electric field relaxation region is higher that the impurity concentration of the first JTE region adjacent on the inner side and lower than the impurity concentration of the second JTE region adjacent on the outer side. First subregions have widths that decrease the farther outward they are arranged. Second subregions have widths that are substantially the same independent of position. The first subregions and the first JTE region have equal impurity concentrations. The second subregions and the second JTE region have equal impurity concentrations.

12 Claims, 55 Drawing Sheets

(51) Int. Cl.
*H01L 21/04* (2006.01)
*H01L 29/36* (2006.01)
*H01L 29/66* (2006.01)
*H01L 29/06* (2006.01)
*H01L 29/861* (2006.01)

(52) U.S. Cl.
CPC ...... *H01L 29/0619* (2013.01); *H01L 29/0623* (2013.01); *H01L 29/36* (2013.01); *H01L 29/6606* (2013.01); *H01L 29/872* (2013.01); *H01L 29/8611* (2013.01)

(56) References Cited

U.S. PATENT DOCUMENTS

| | | |
|---|---|---|
| 2011/0195563 A1 | 8/2011 | Okuno et al. |
| 2011/0220913 A1 | 9/2011 | Hatakeyama |
| 2011/0233714 A1 | 9/2011 | Lu |
| 2013/0140582 A1 | 6/2013 | Kawakami et al. |
| 2014/0353678 A1* | 12/2014 | Kawakami ............ H01L 21/266 257/76 |
| 2016/0218187 A1 | 7/2016 | Mochizuki et al. |

FOREIGN PATENT DOCUMENTS

| | | |
|---|---|---|
| JP | 2011165856 A | 8/2011 |
| JP | 2011187767 A | 9/2011 |
| JP | 2011204710 A | 10/2011 |
| JP | 2012195519 A | 10/2012 |
| JP | 2014038937 A | 2/2014 |
| JP | 2014107408 A | 6/2014 |
| WO | 2012049872 A1 | 4/2012 |
| WO | 2013136550 A1 | 9/2013 |
| WO | 2015033463 A1 | 3/2015 |

\* cited by examiner

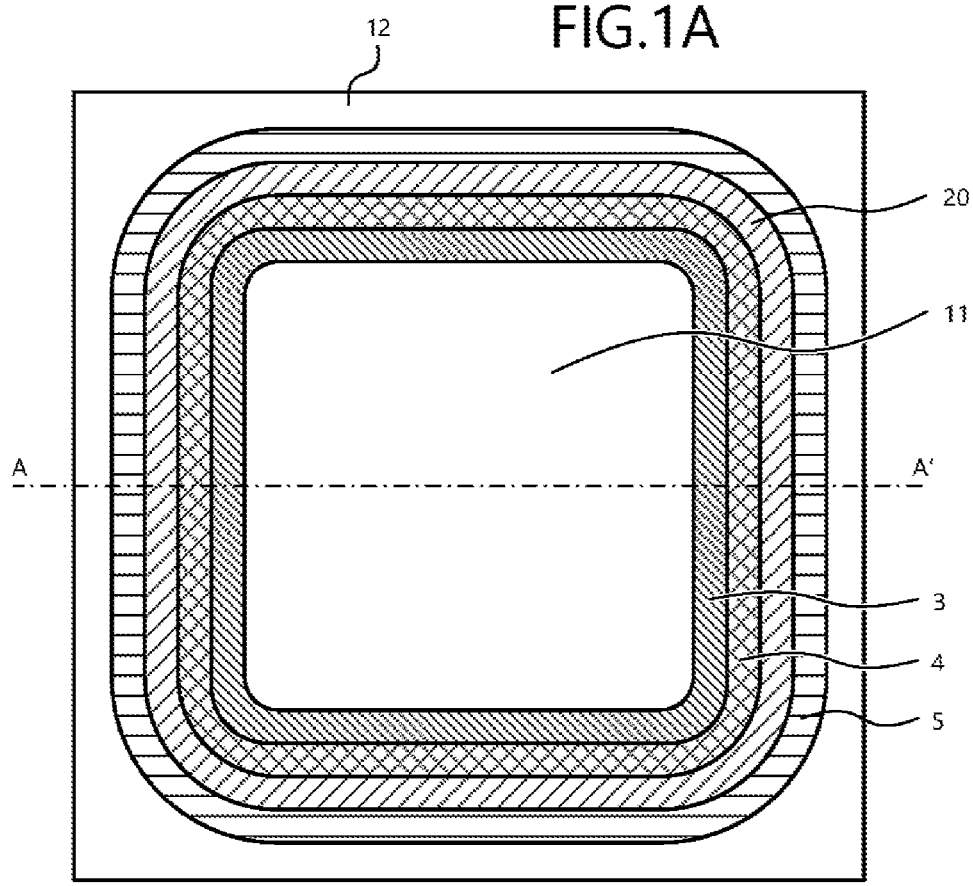
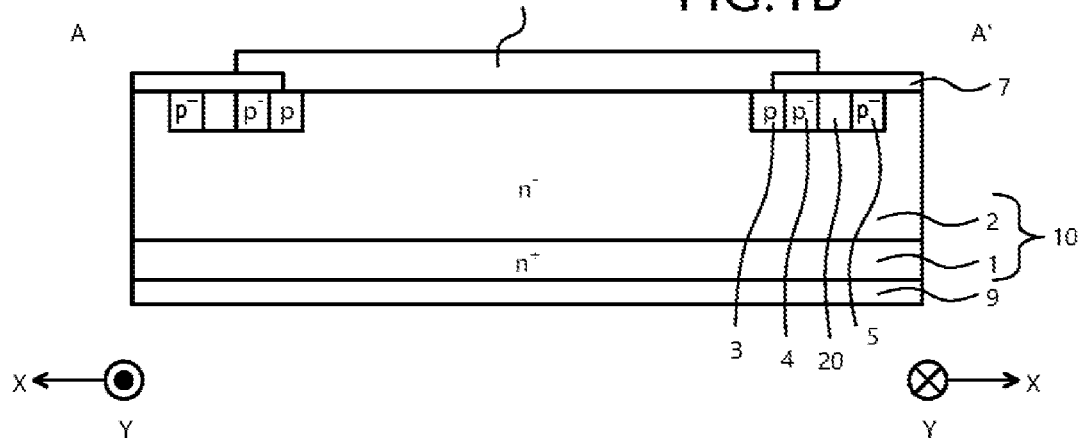

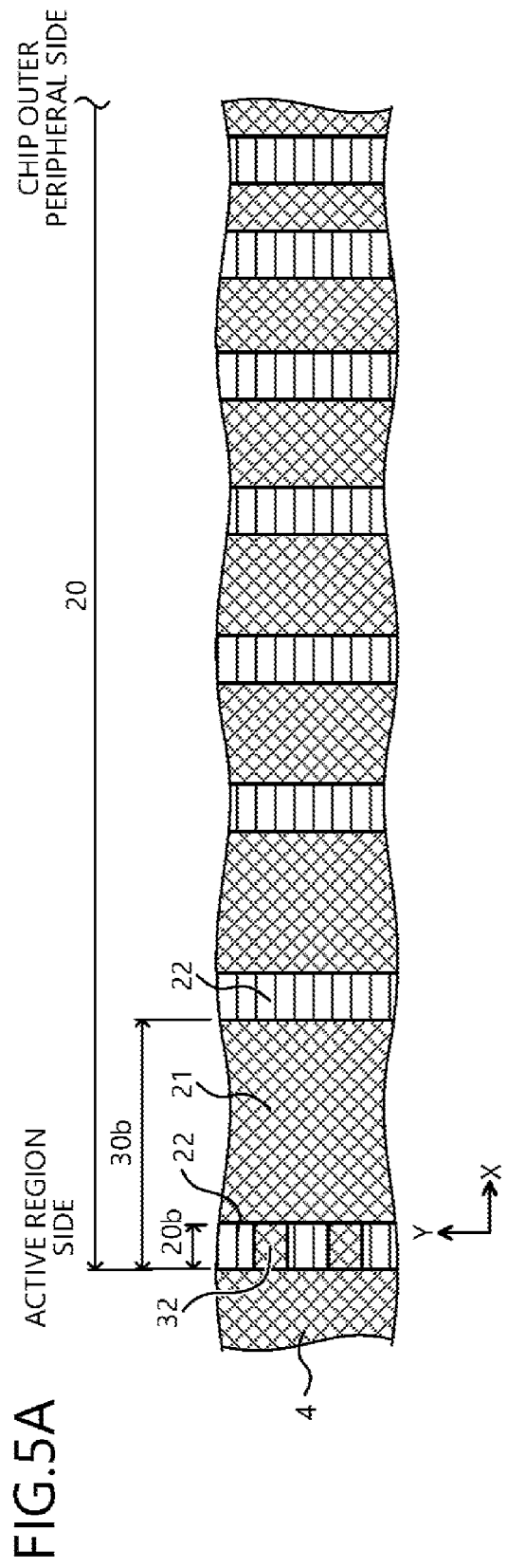
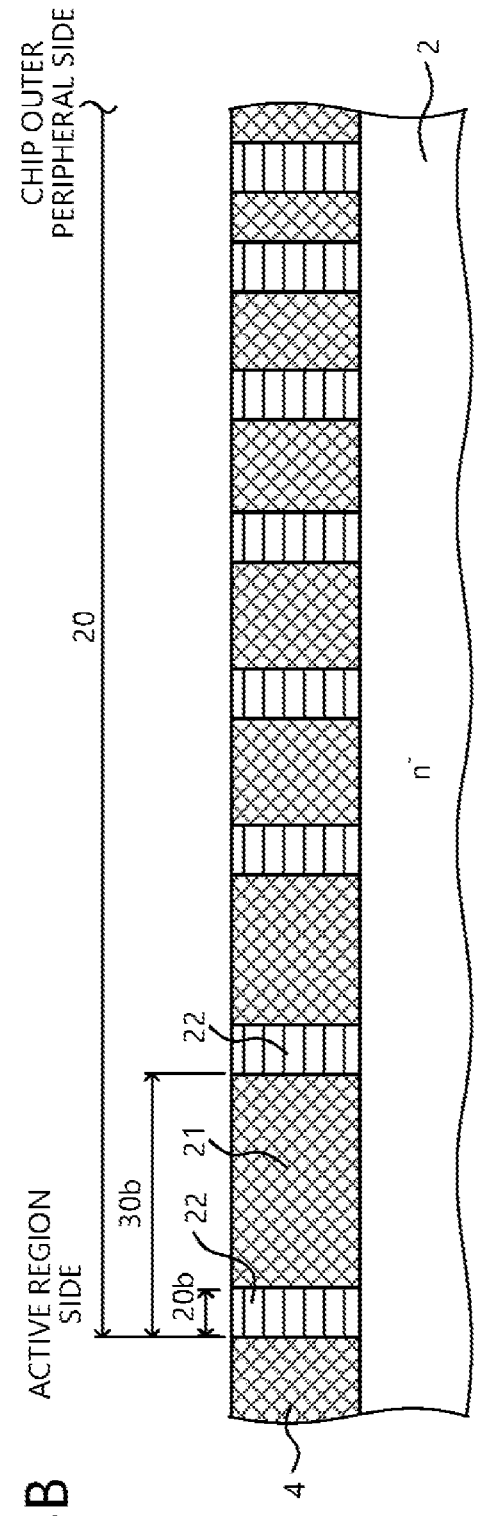

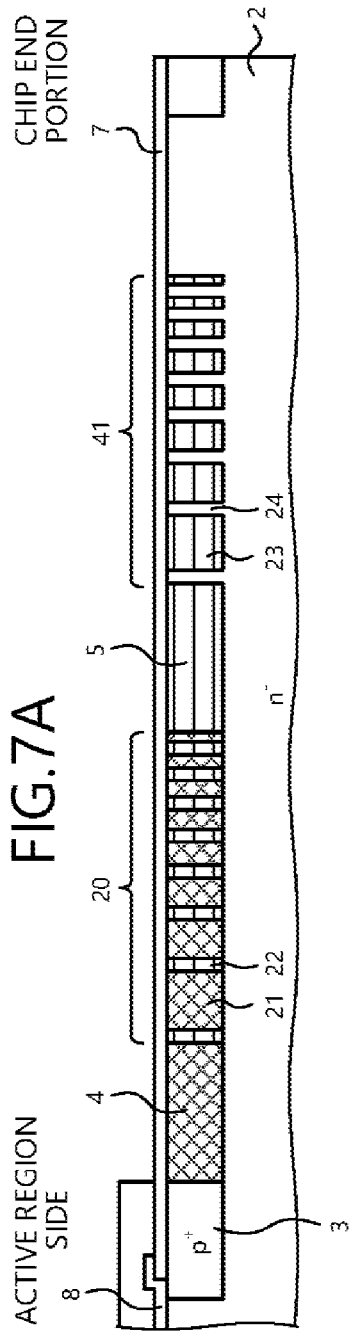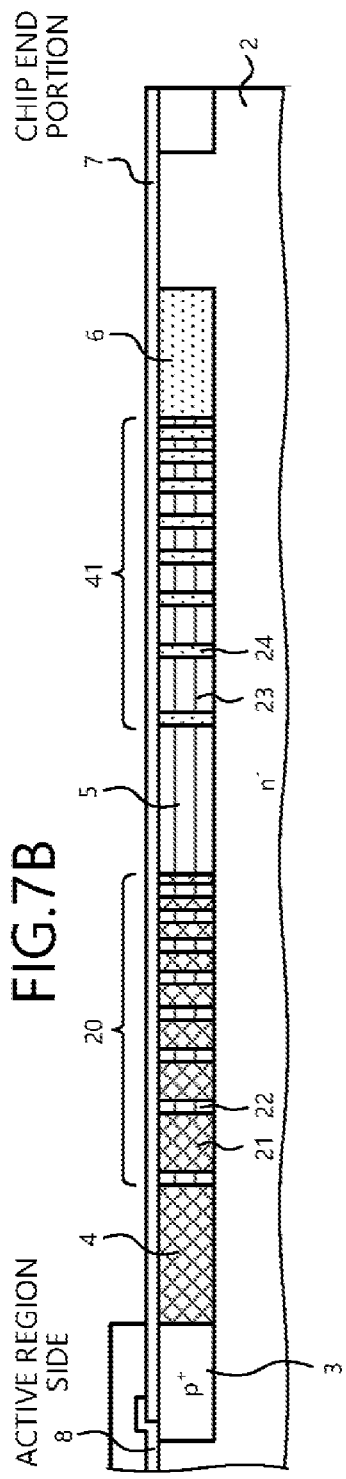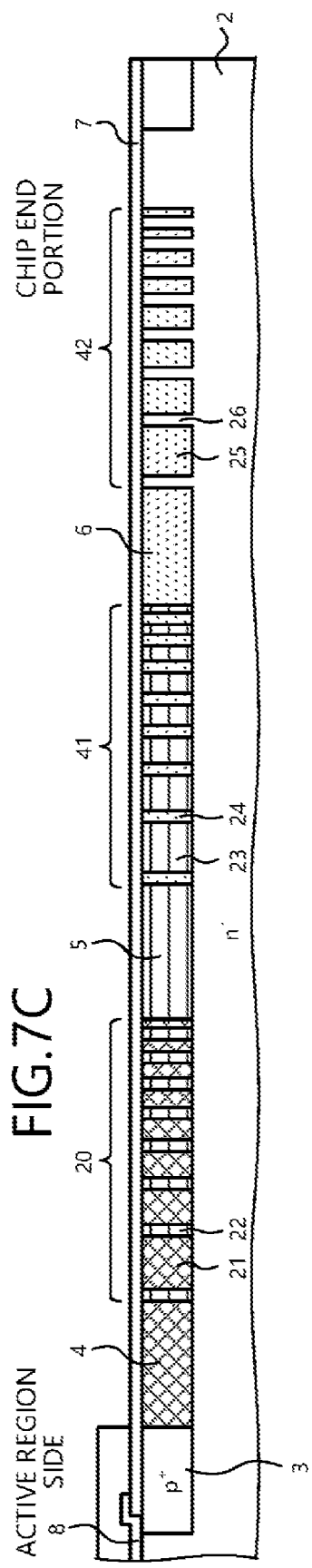

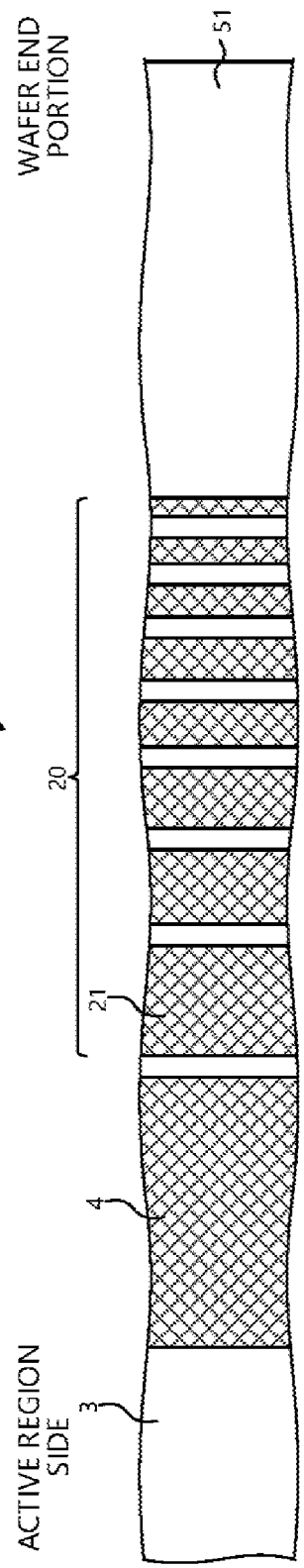
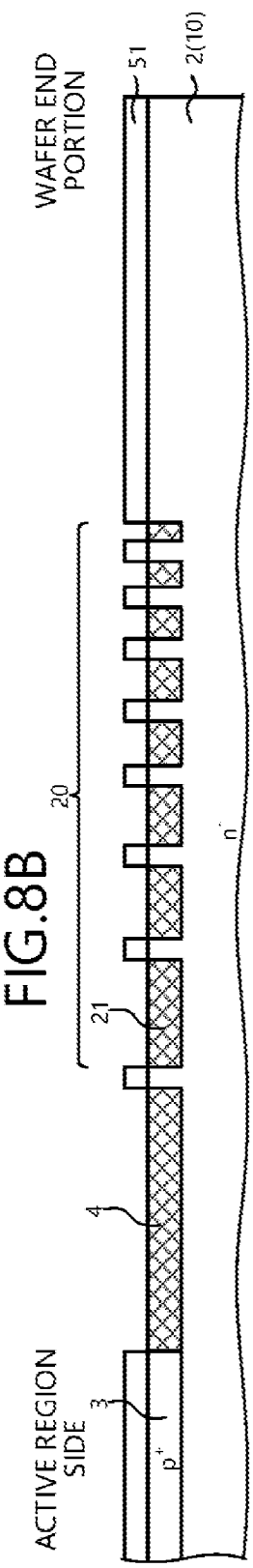

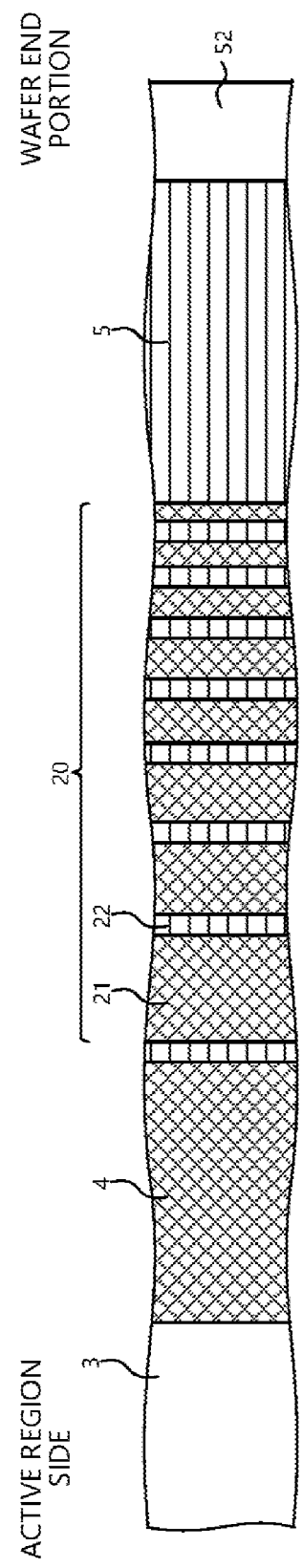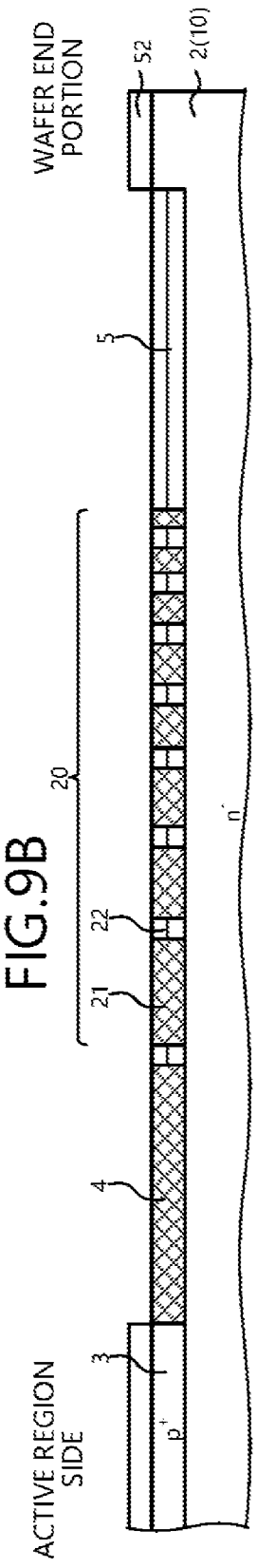

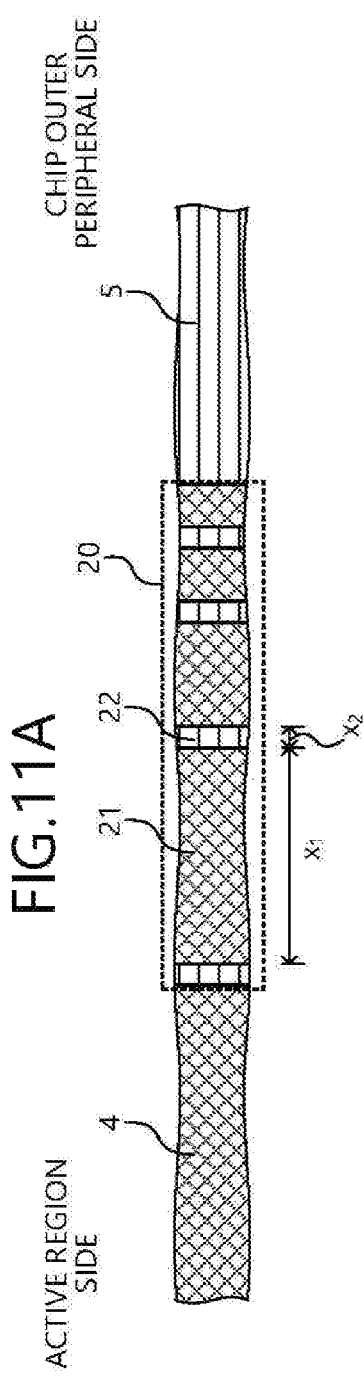
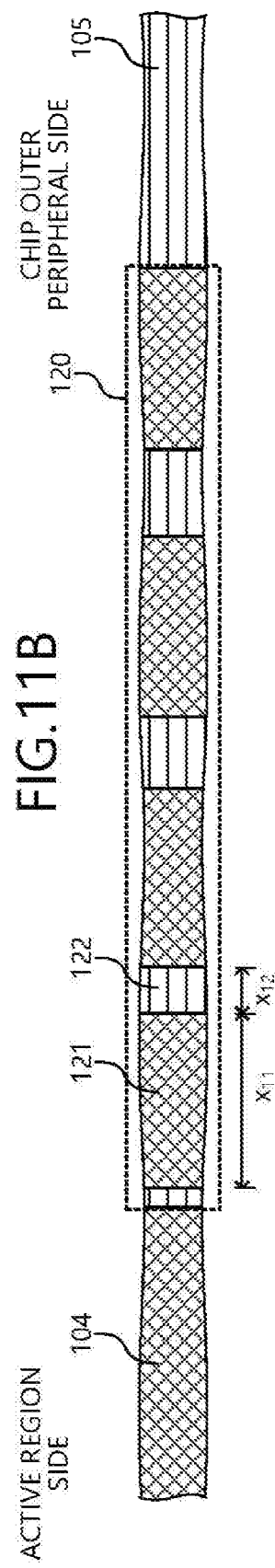
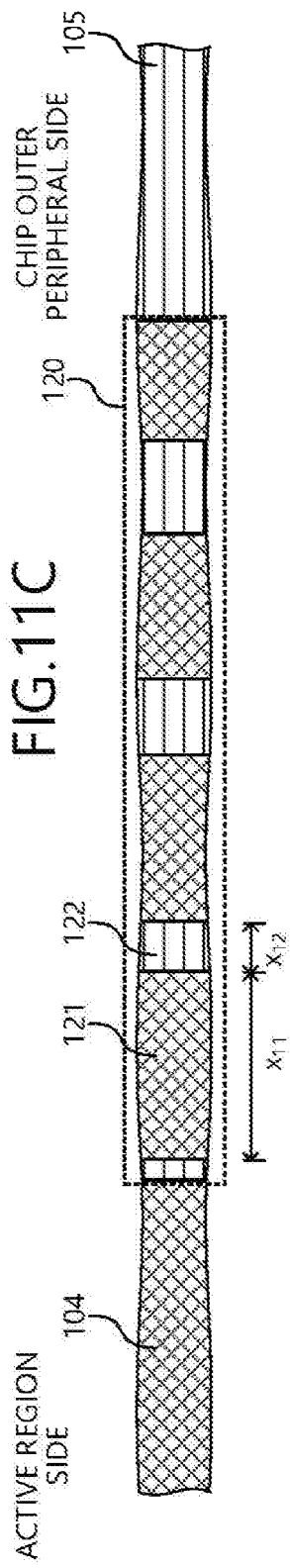

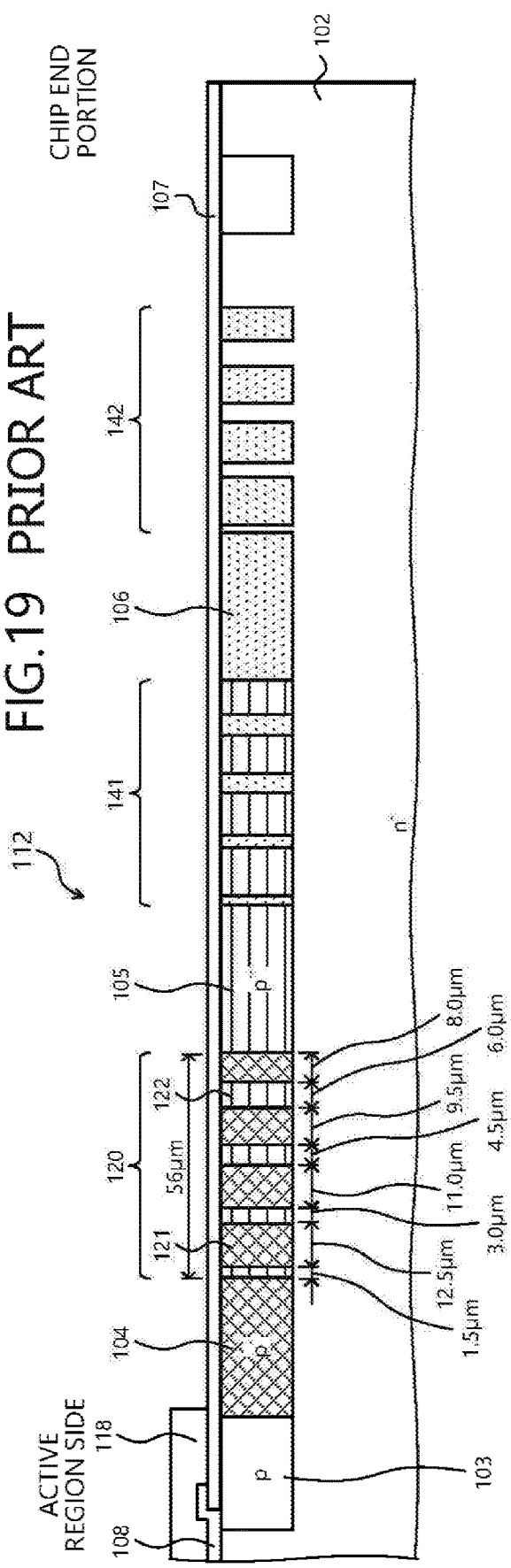
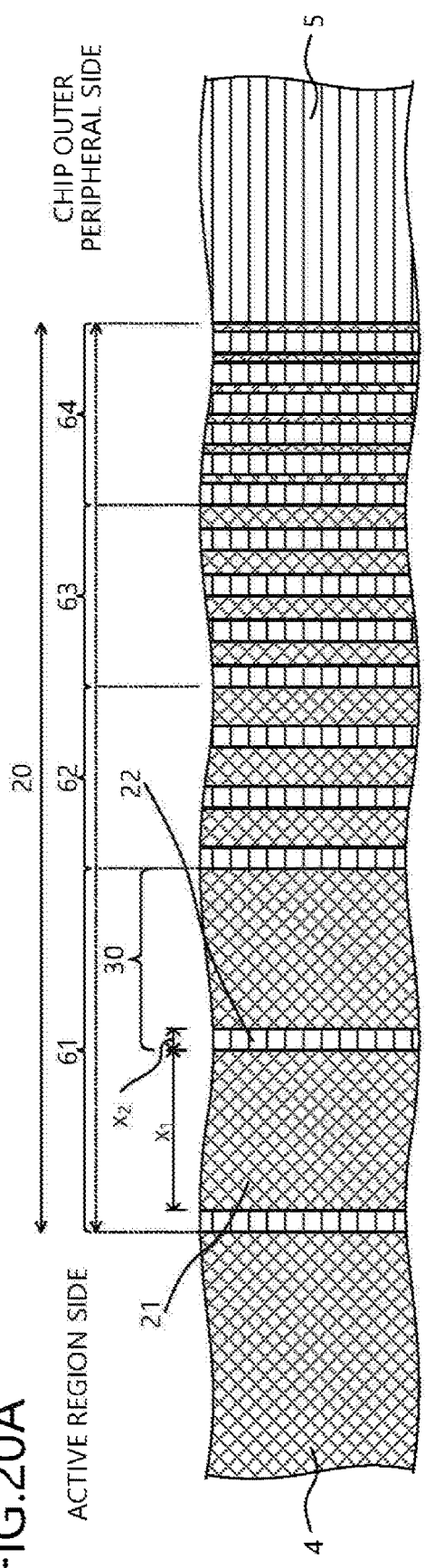
FIG.19 PRIOR ART
FIG.20A

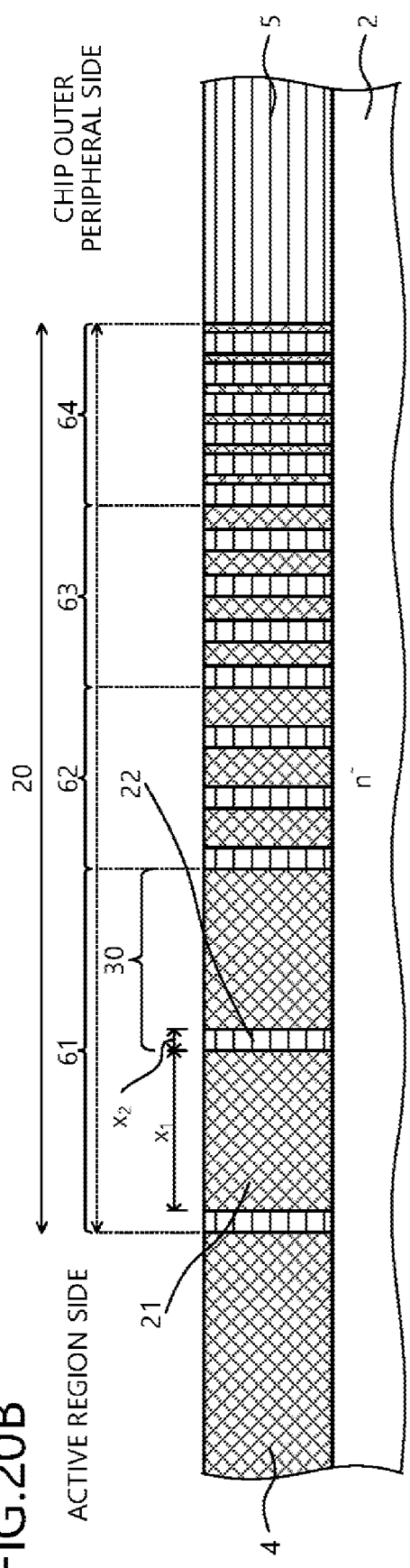
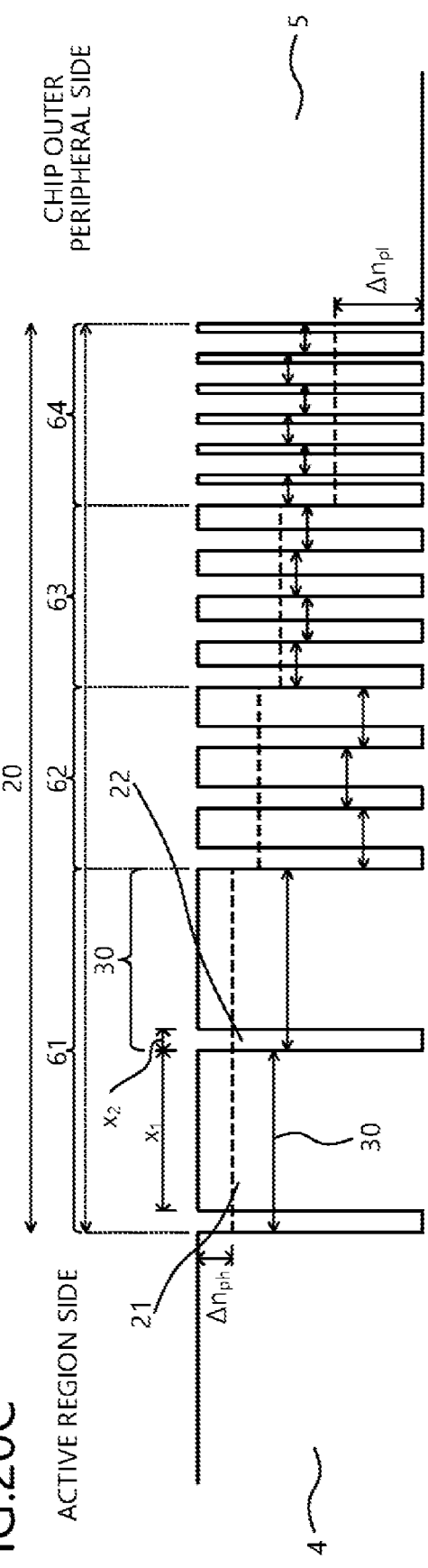

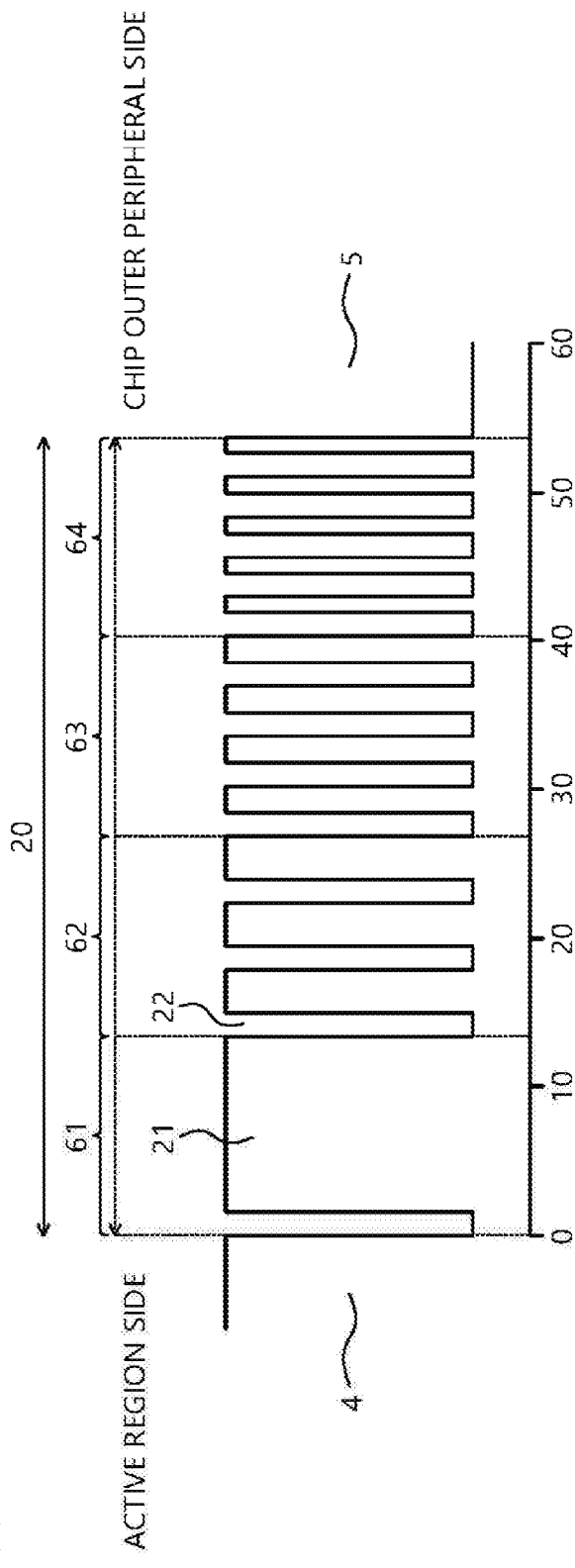
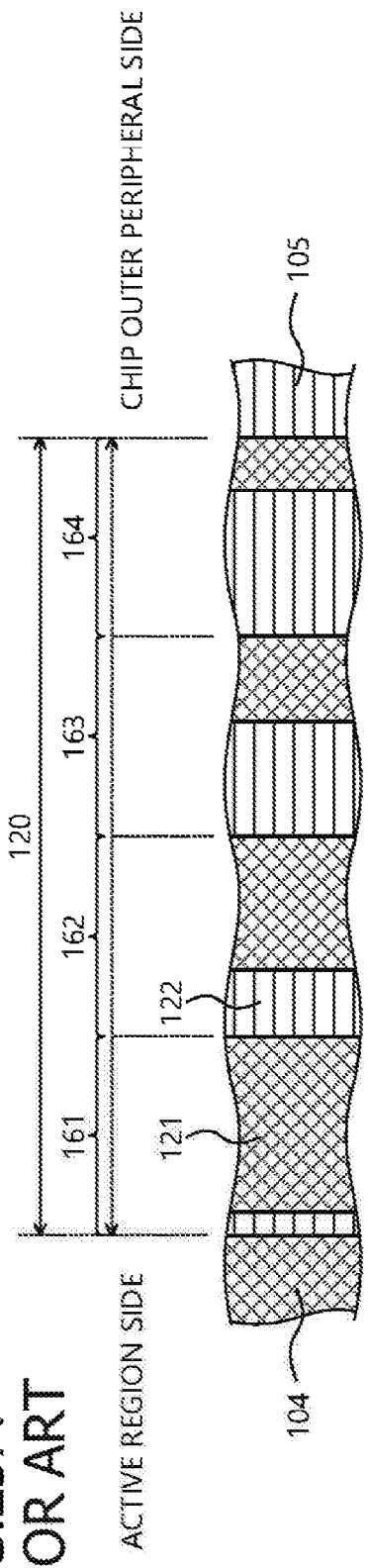
FIG.22B
FIG.23A
PRIOR ART

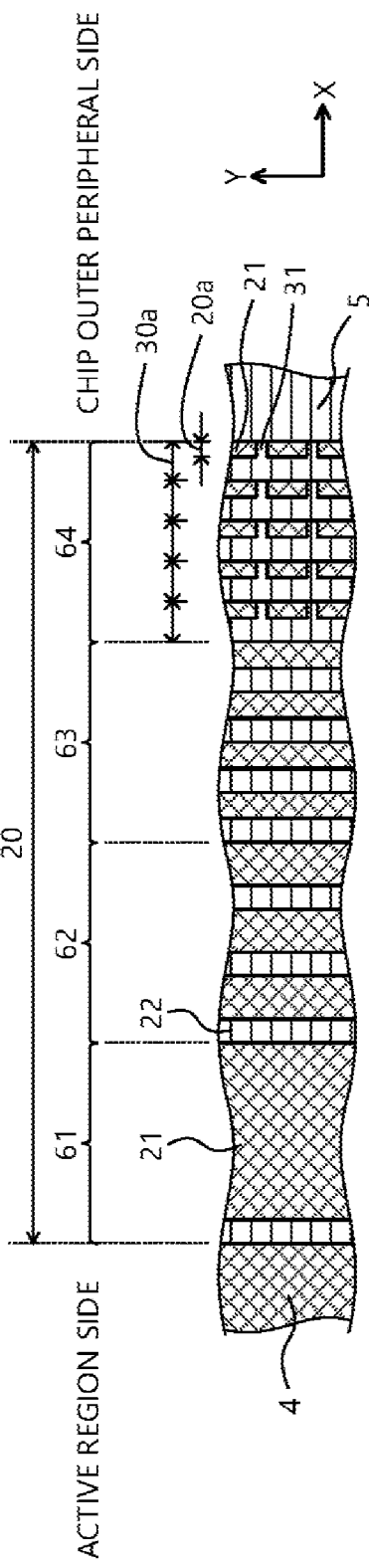
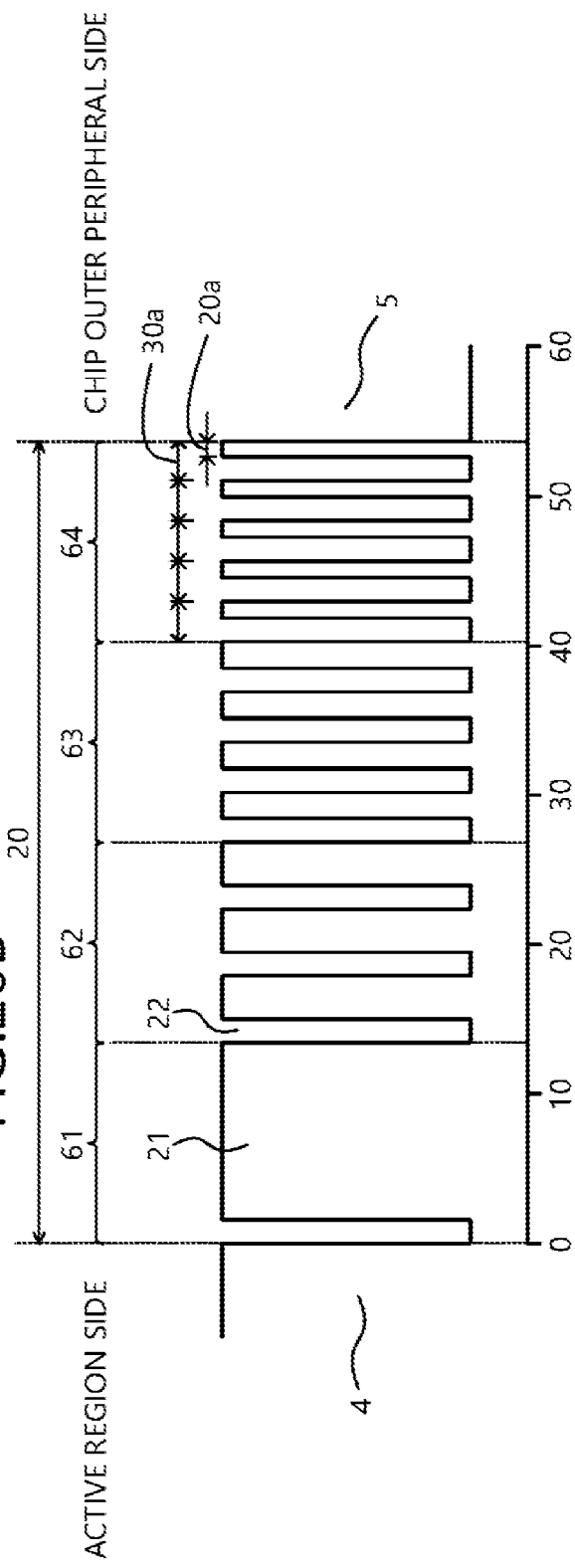

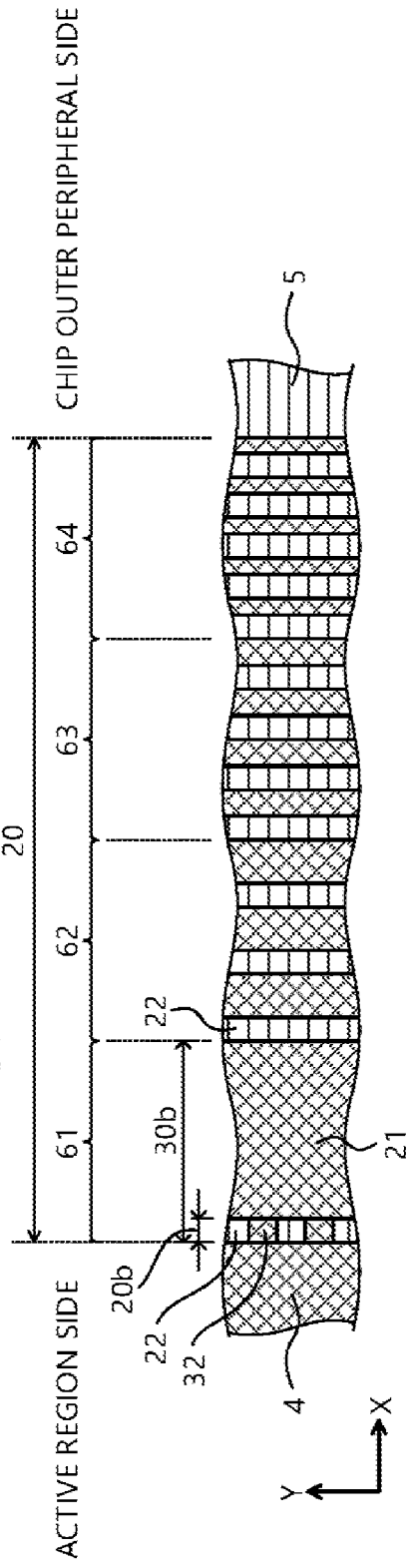
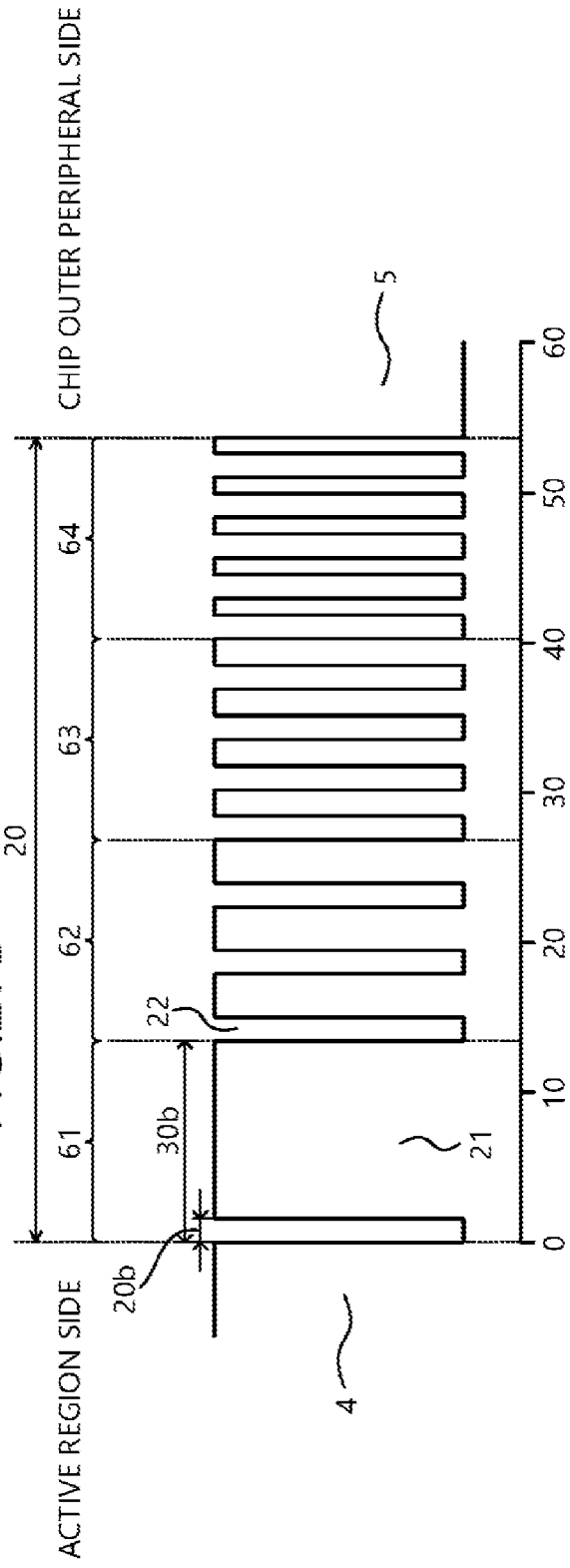
FIG.27A
FIG.27B

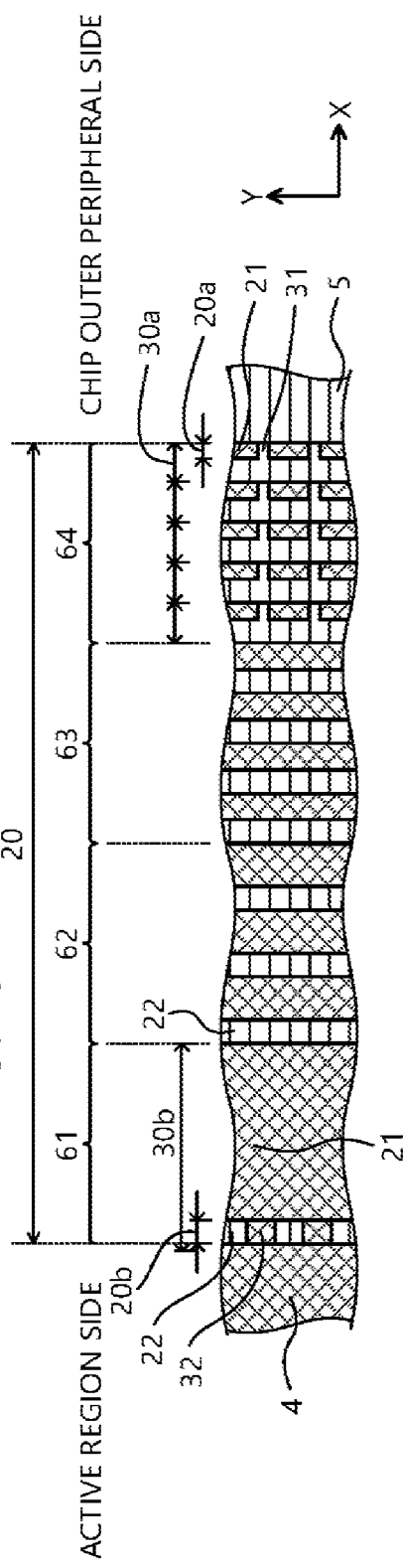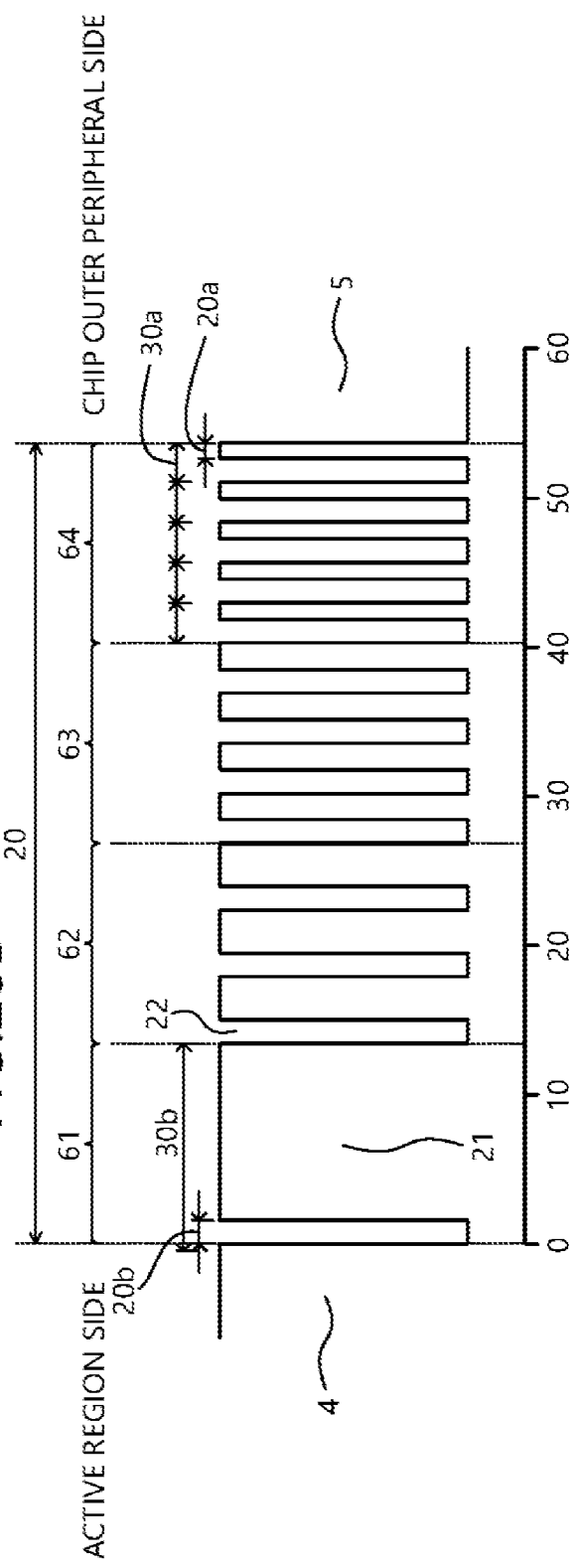

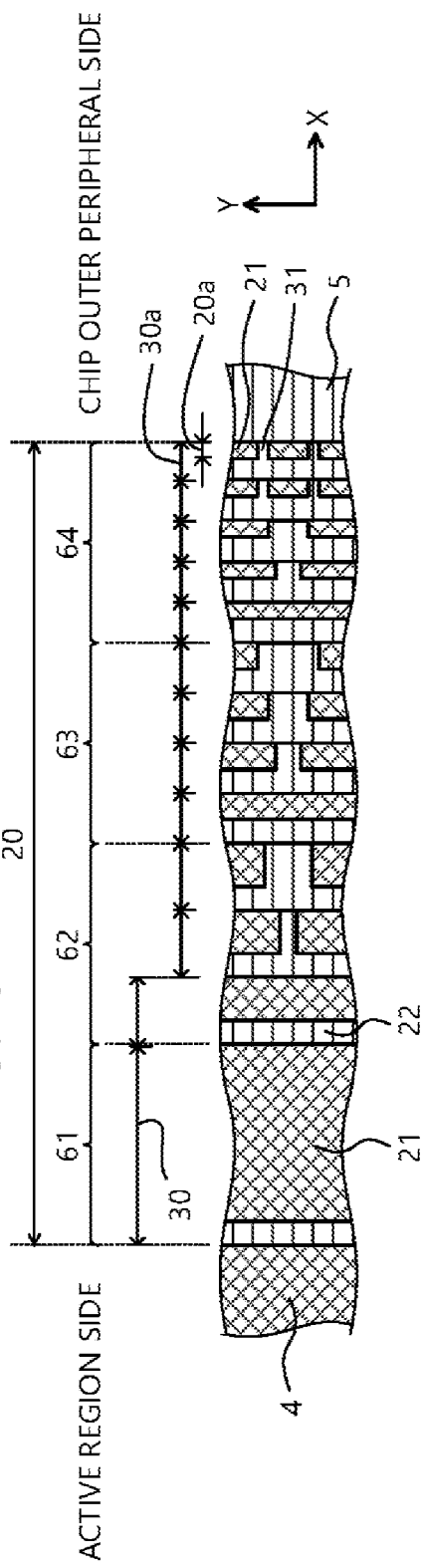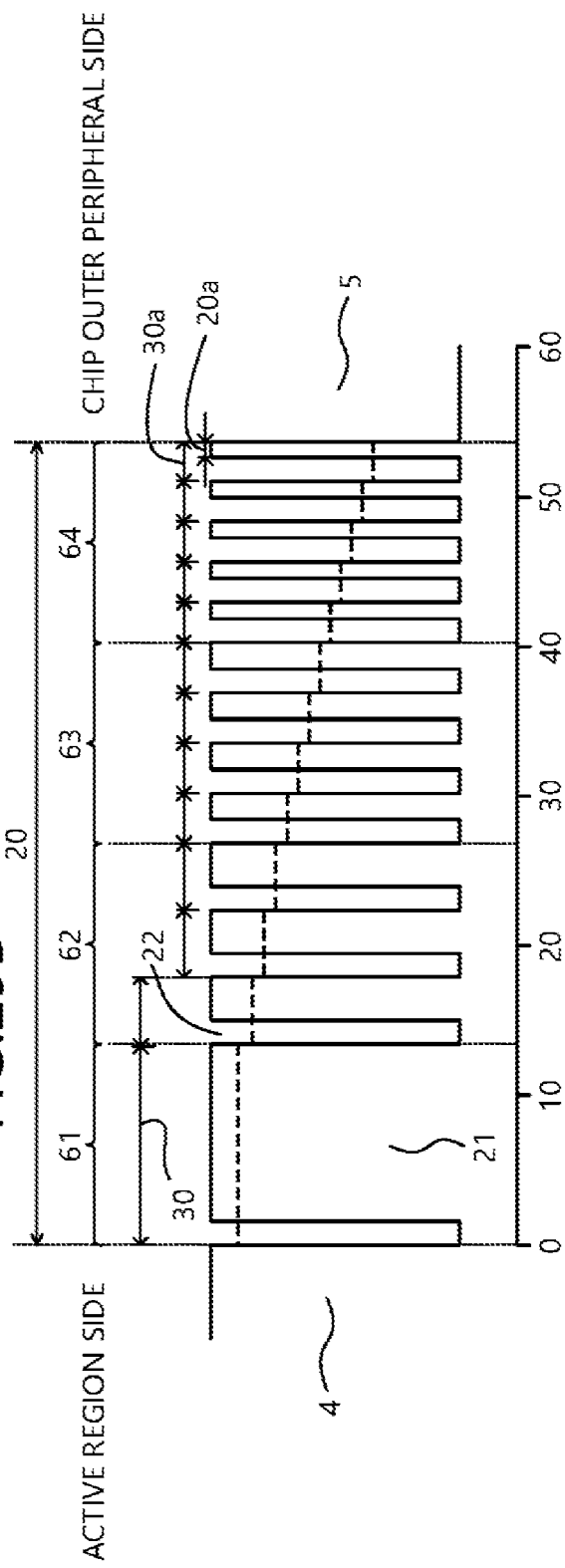

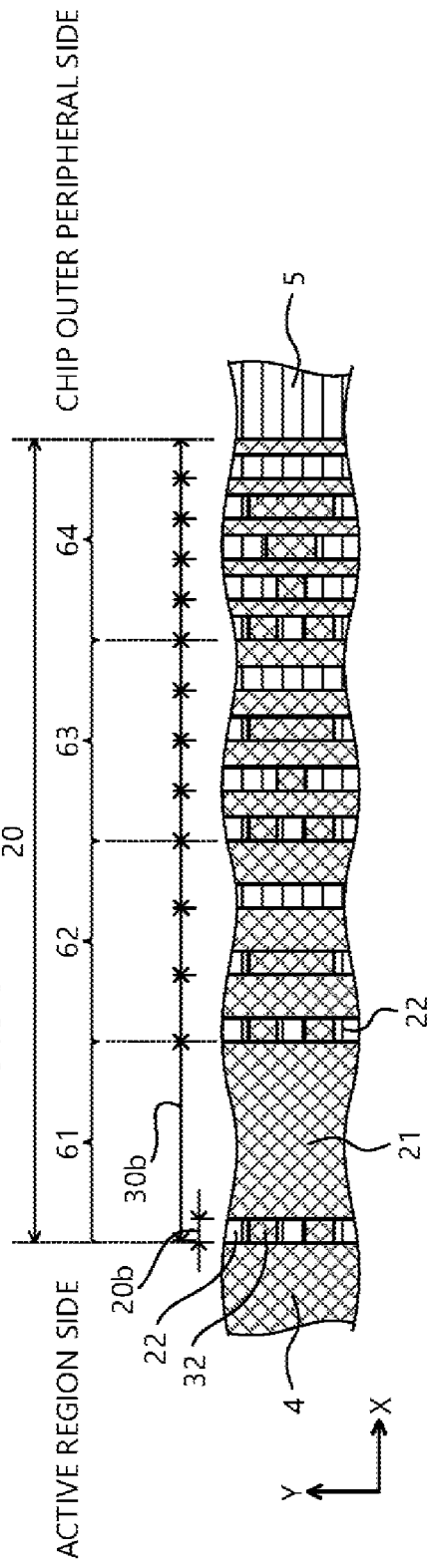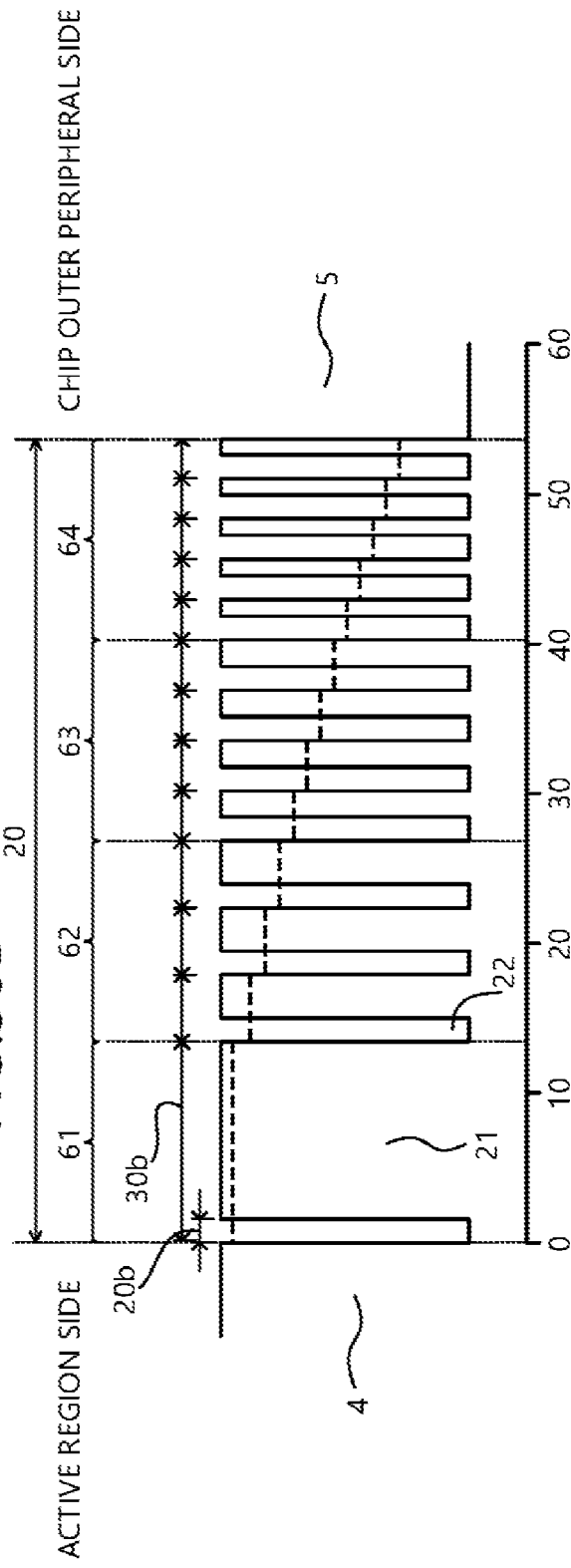

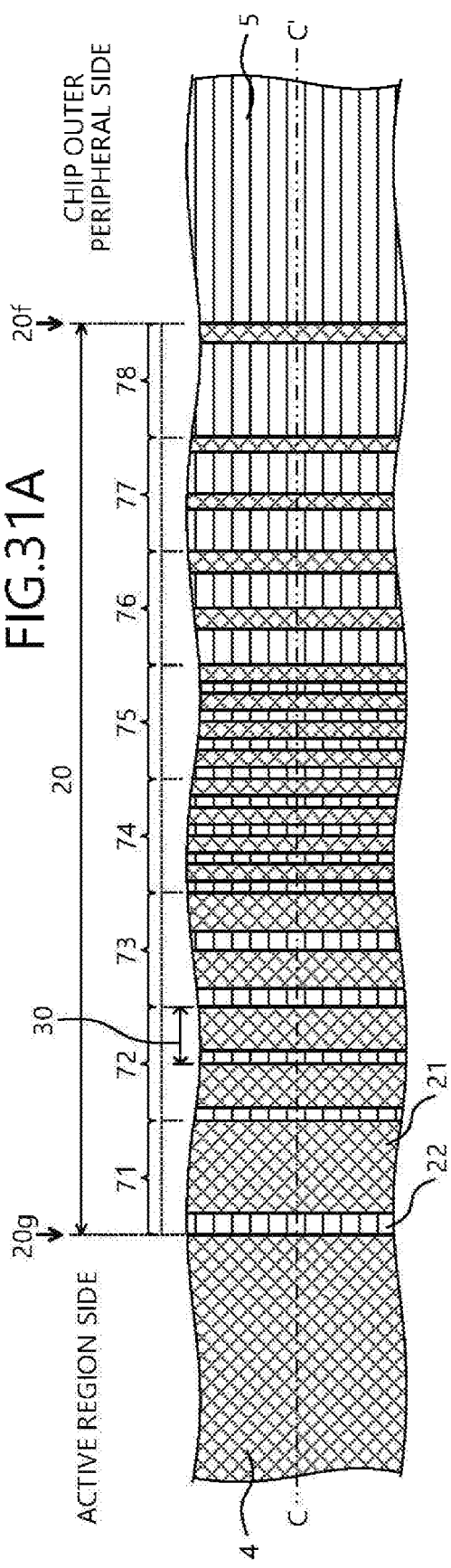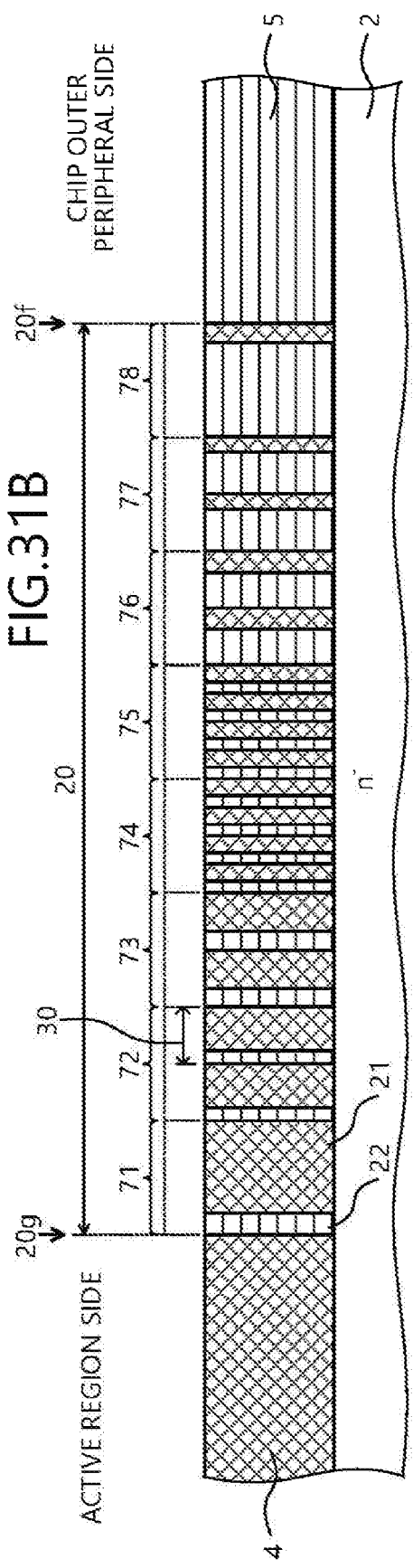

FIG.33

| | | EQUIVALENT CONCENTRATION REGION | | | WIDTH OF SECTION Δx (=WIDTH OF EQUIVALENT CONCENTRATION REGION×CYCLES) | AVERAGE IMPURITY CONCENTRATION OF SECTION |
|---|---|---|---|---|---|---|
| | CYCLES | WIDTH OF FIRST SUBREGION $x_1$ | WIDTH OF SECOND SUBREGION $x_2$ | WIDTH OF EQUIVALENT CONCENTRATION REGION (=$x_1+x_2$) | | |
| FIRST SECTION | 1 | 6.8 | 0.7 | 7.5 | 7.5 | 0.91 |
| SECOND SECTION | 2 | 3.01 | 0.74 | 3.75 | 7.5 | 0.80 |
| THIRD SECTION | 2 | 2.60 | 1.15 | 3.75 | 7.5 | 0.69 |
| FOURTH SECTION | 4 | 0.795 | 1.080 | 1.875 | 7.5 | 0.58 |

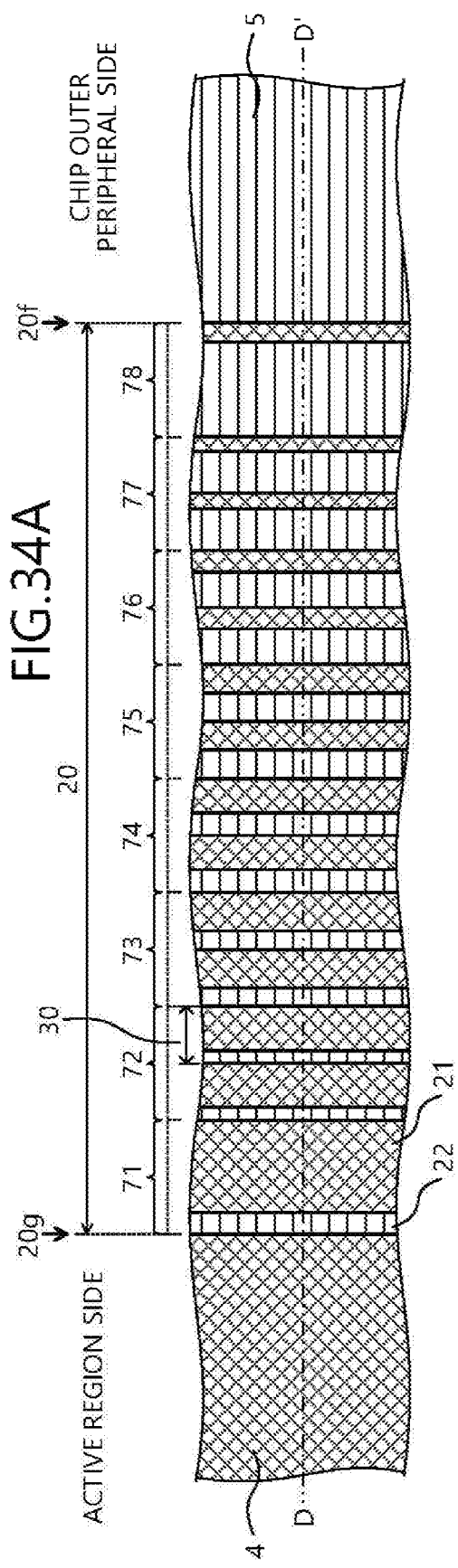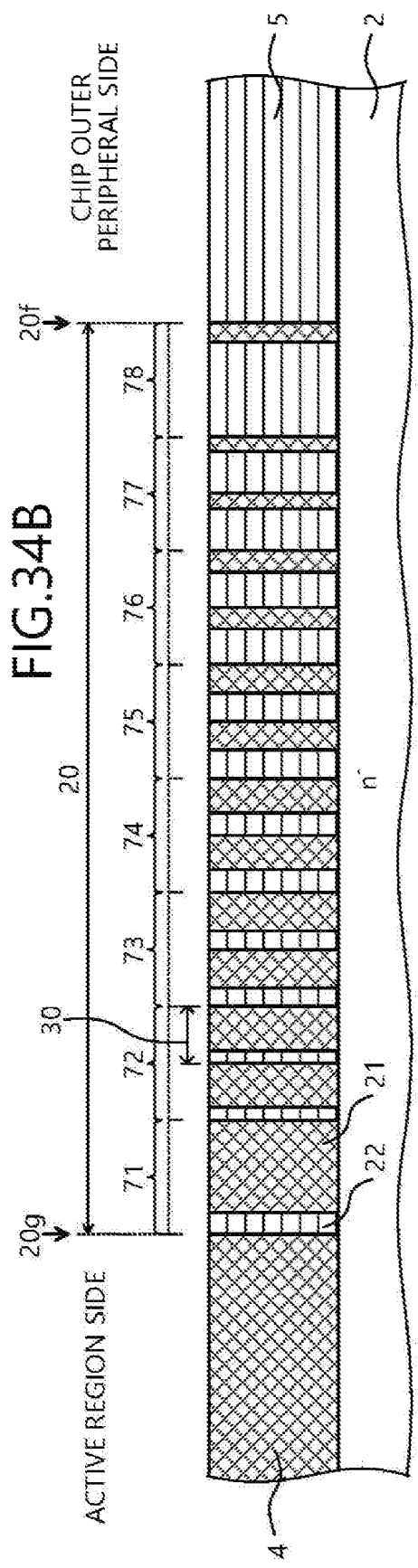

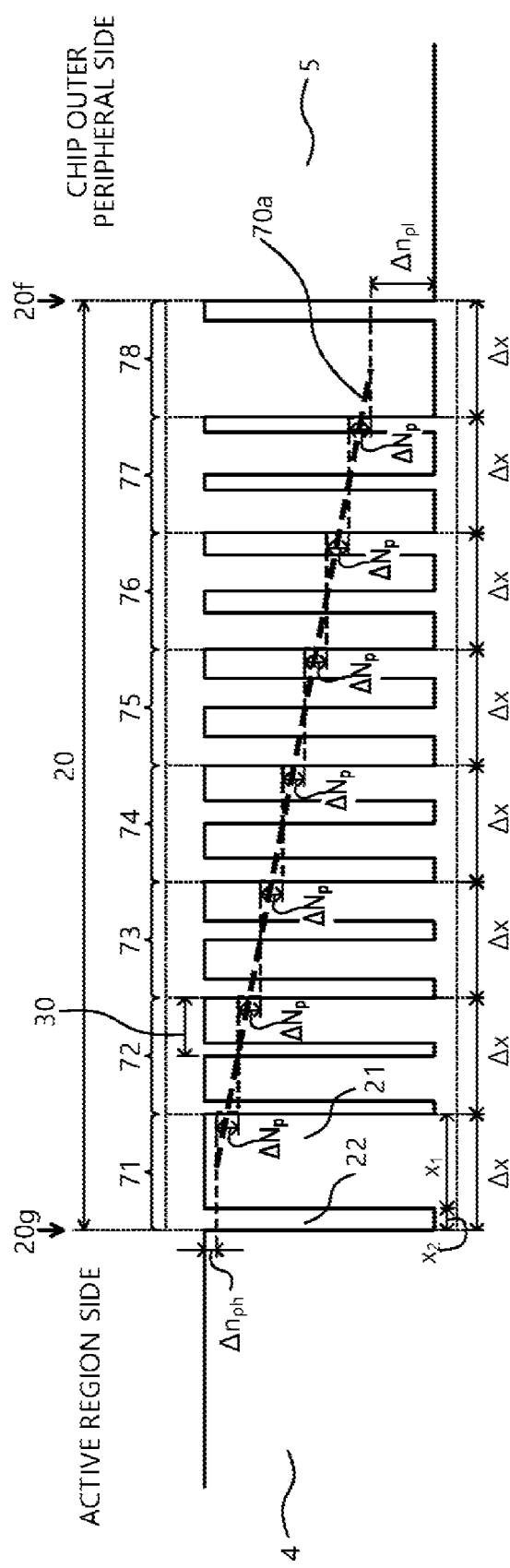

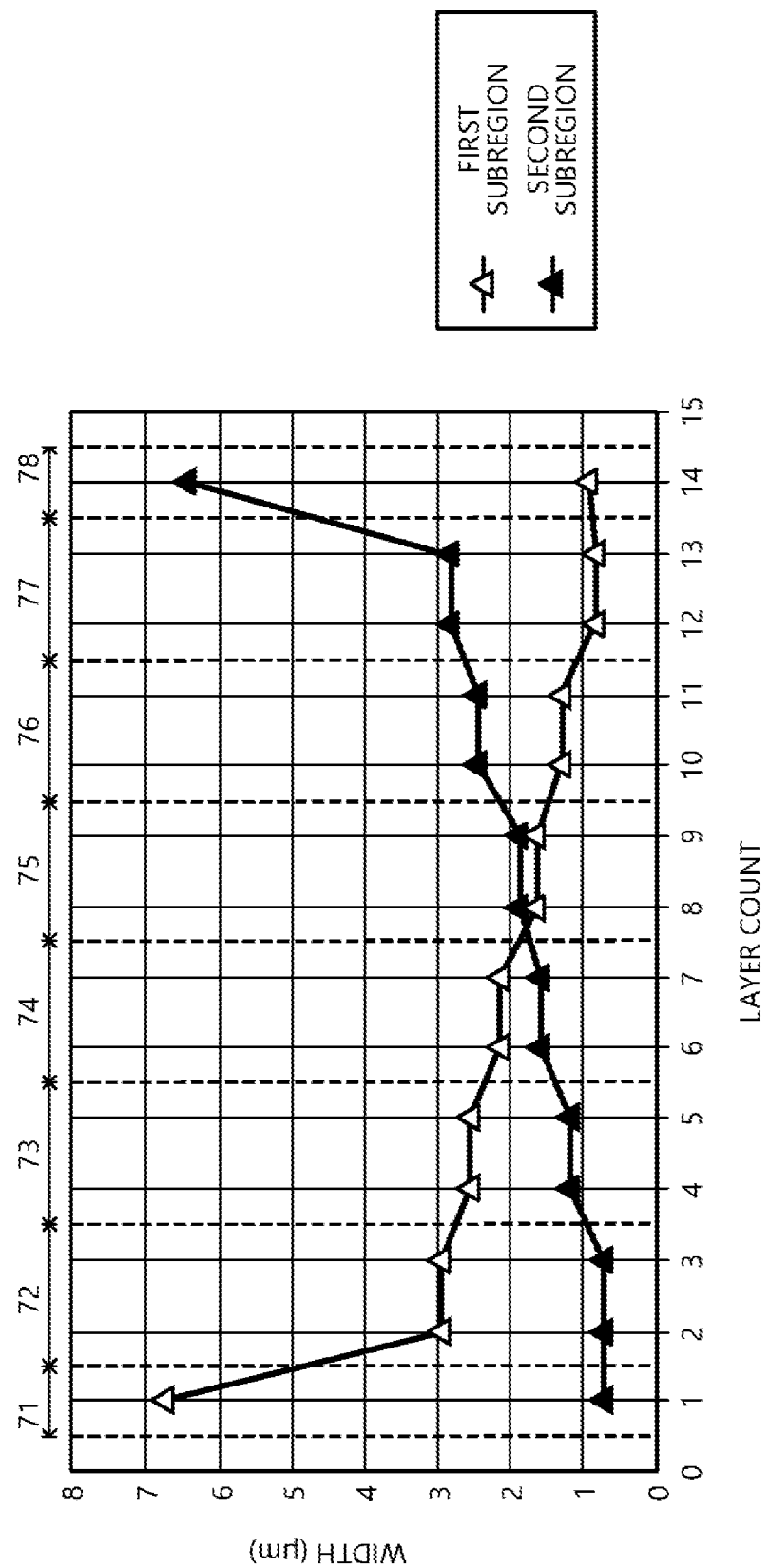

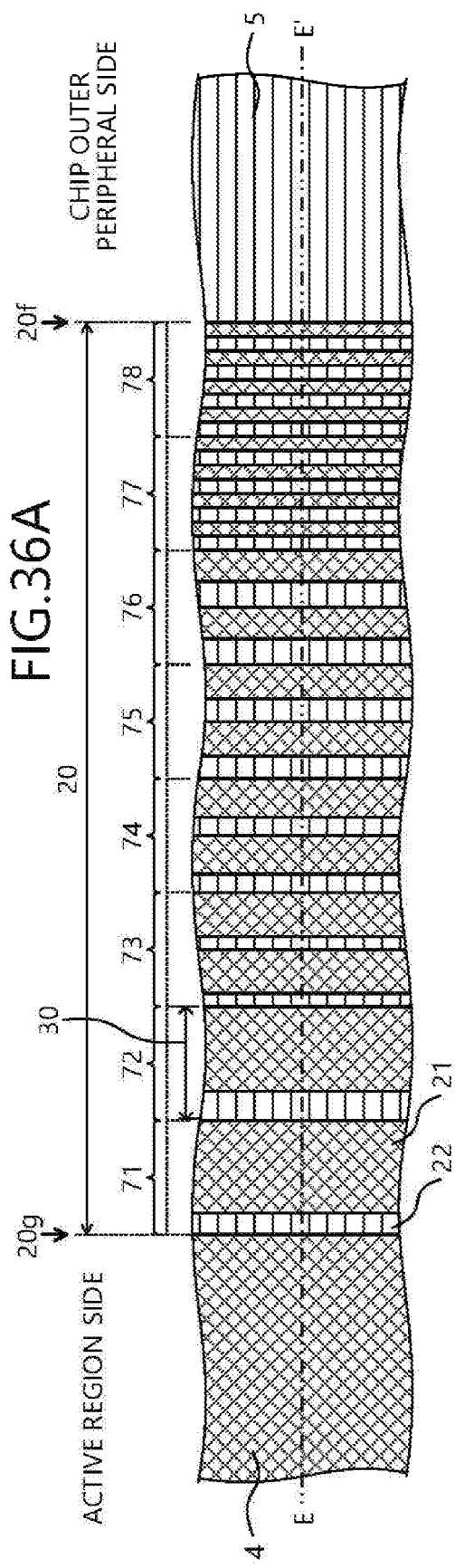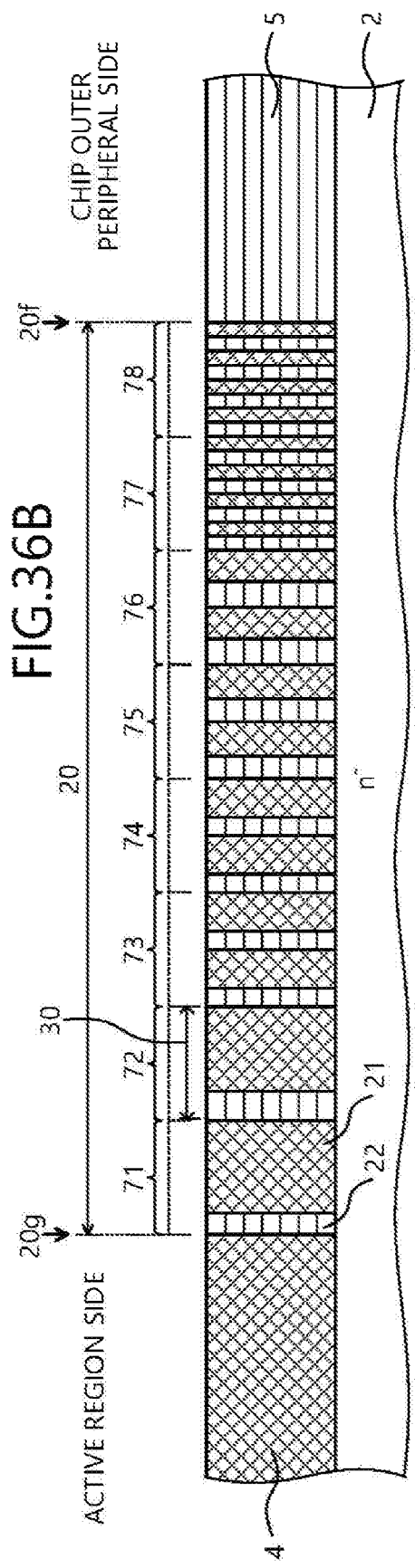

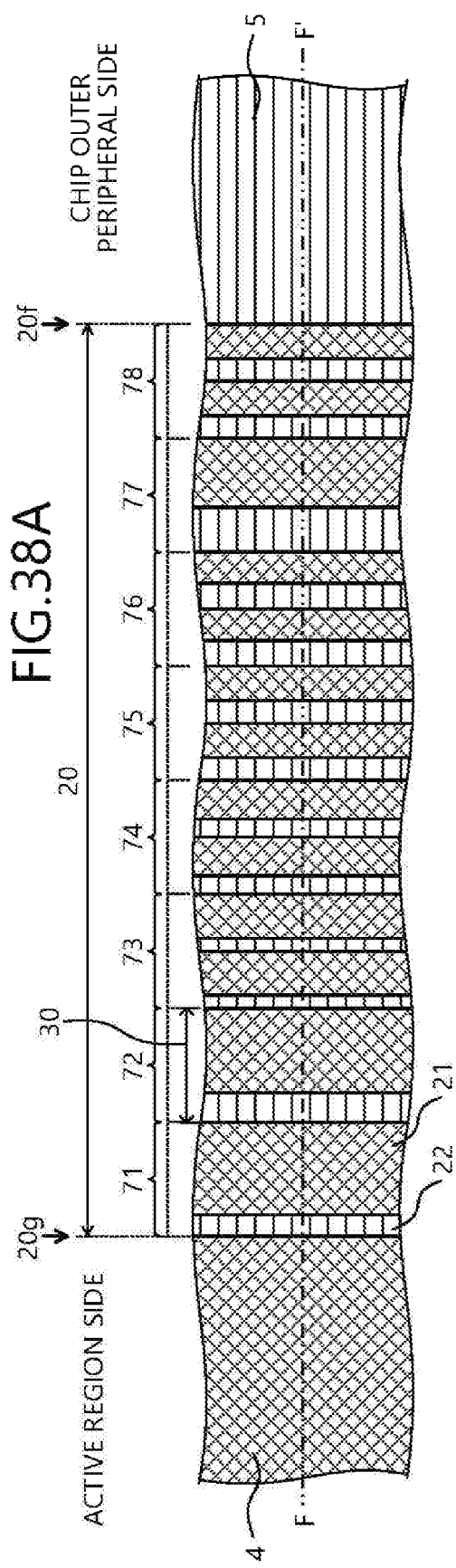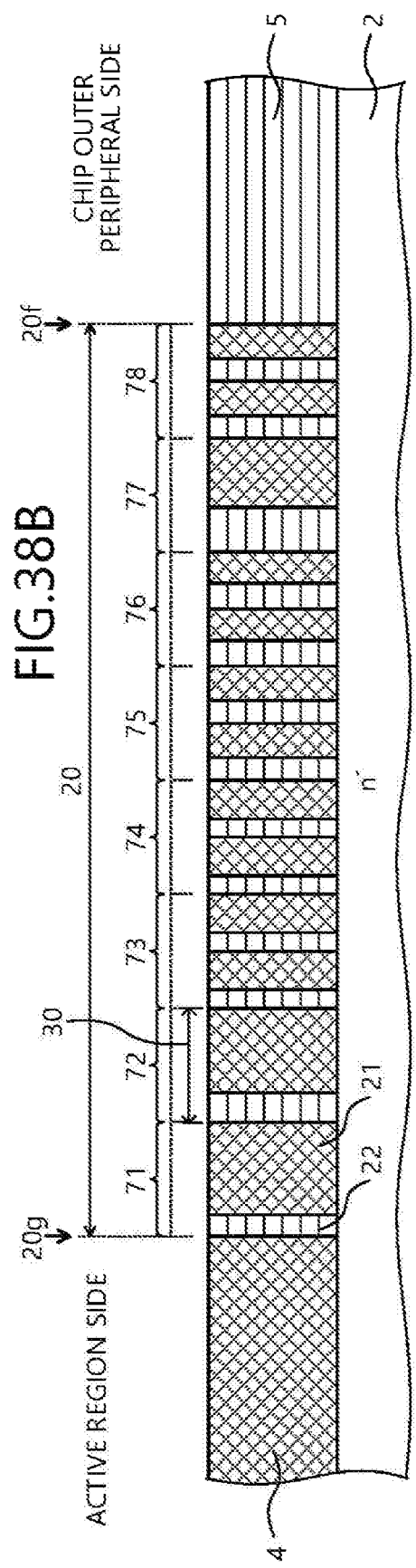

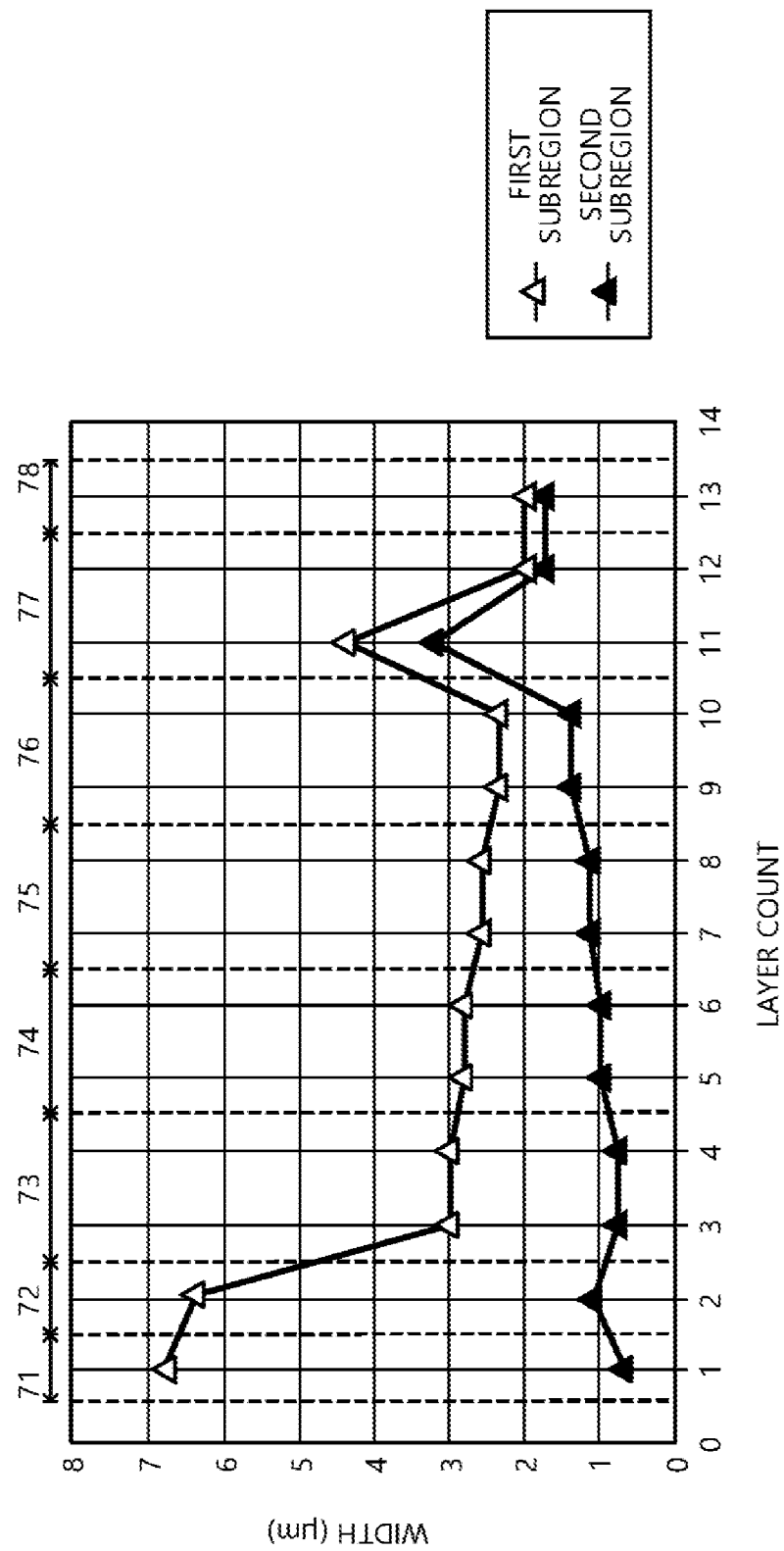

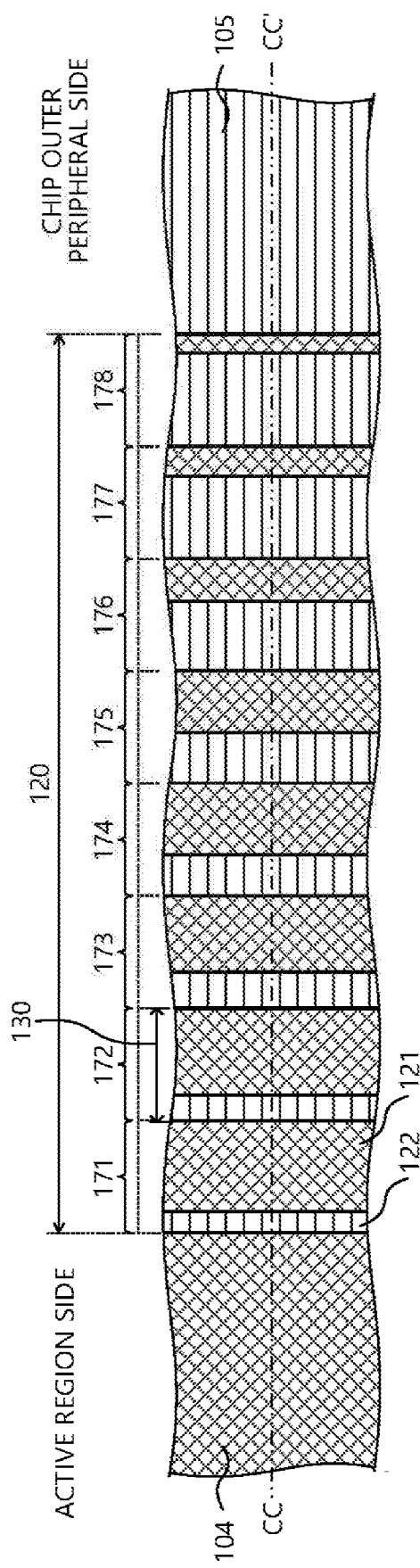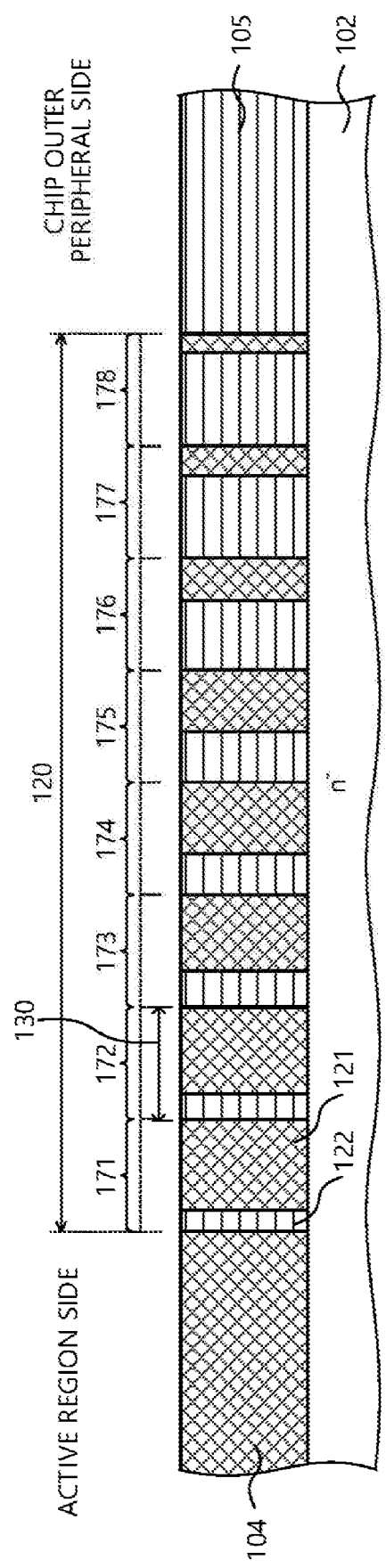

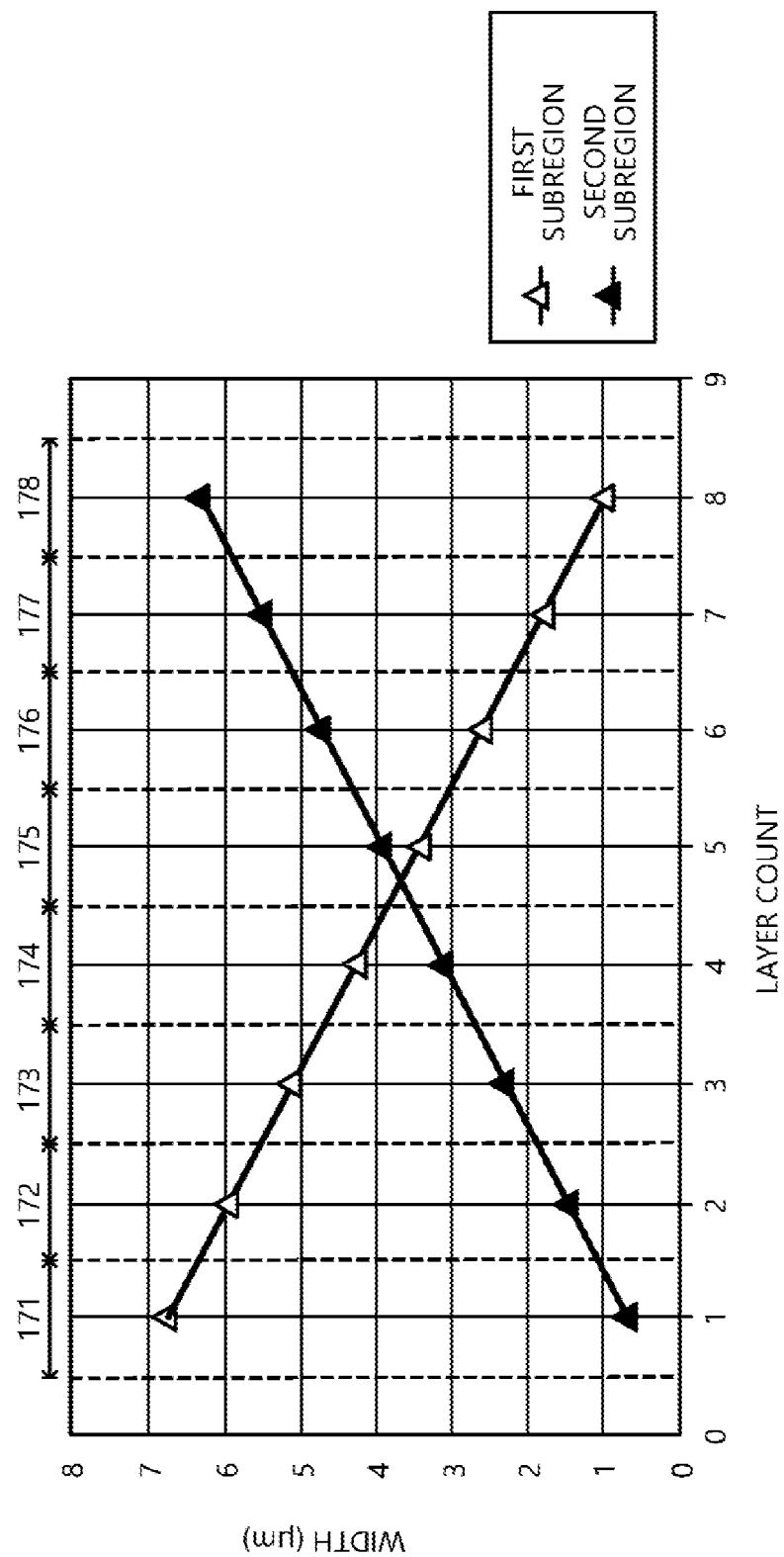

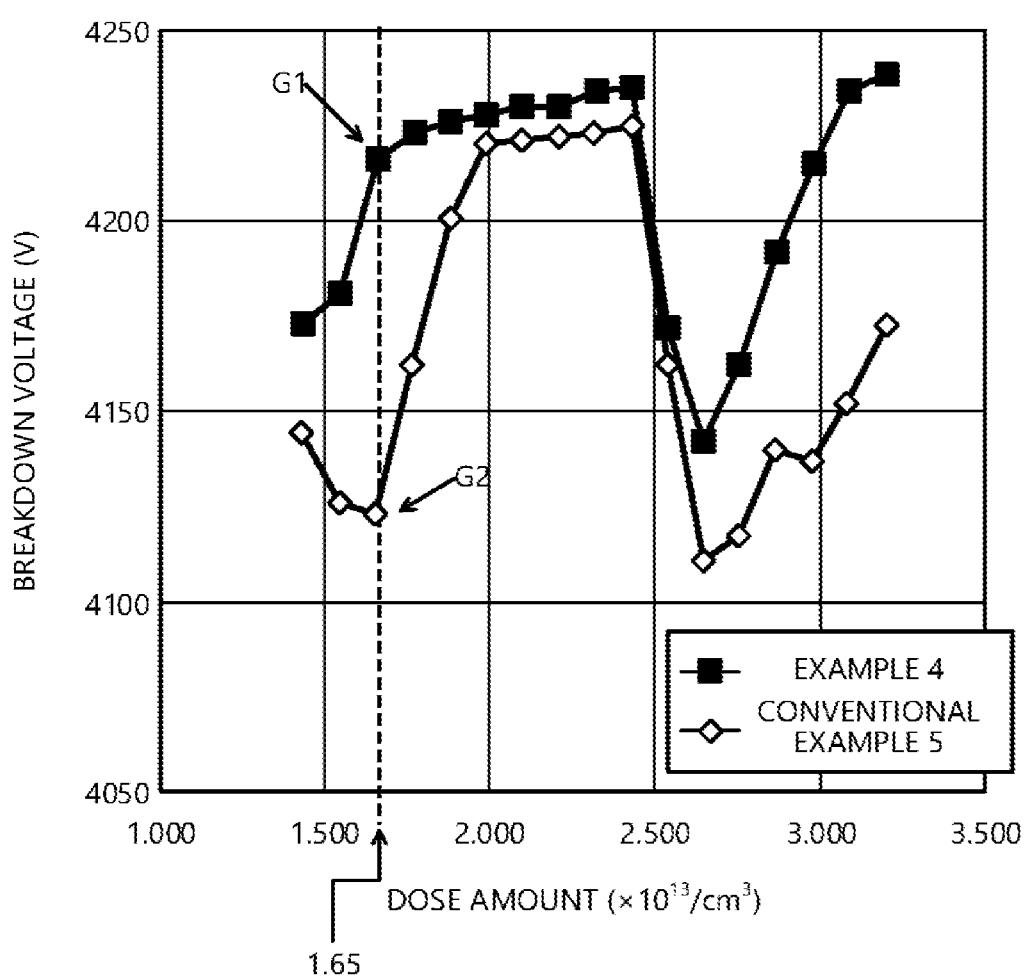

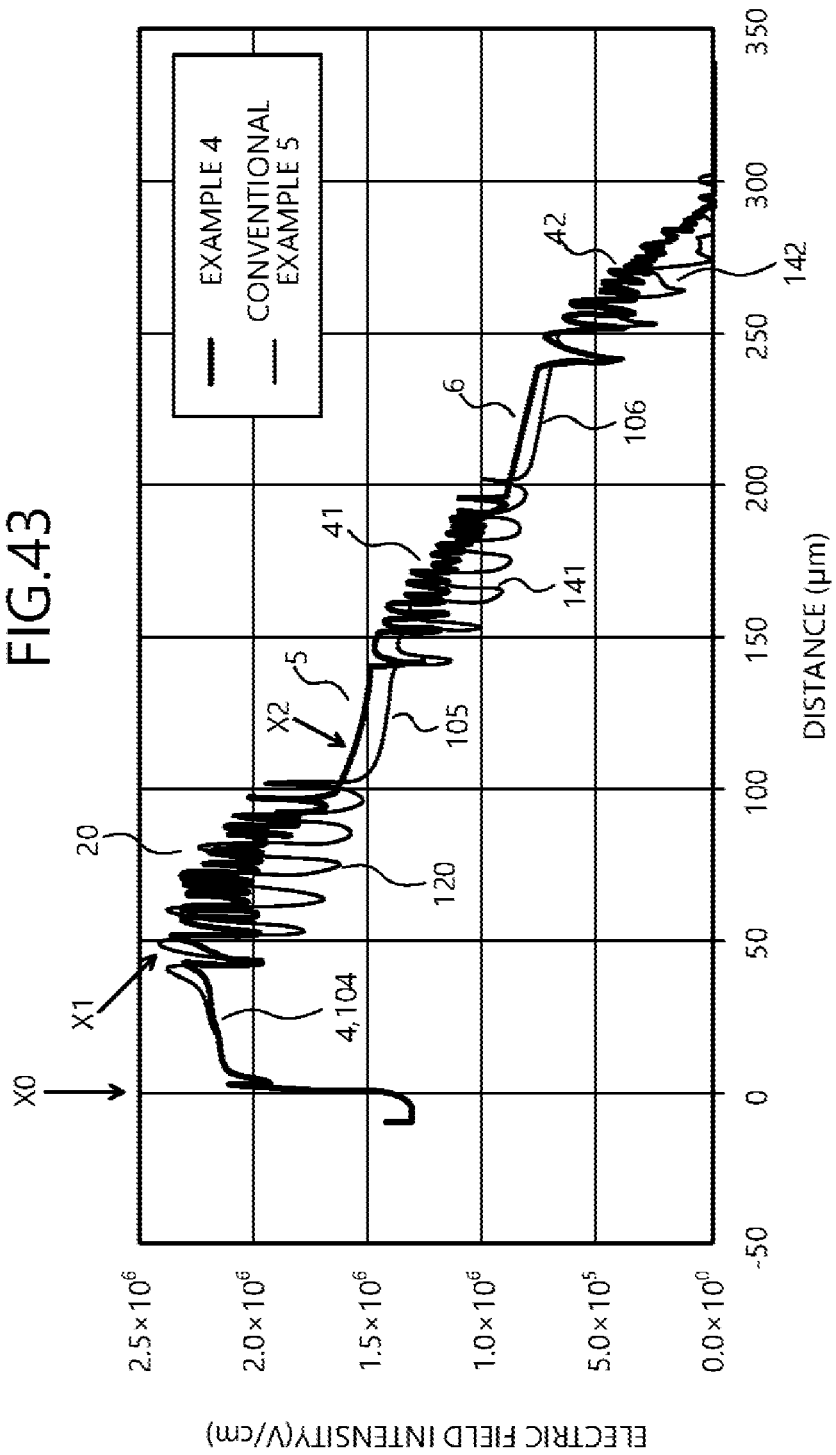

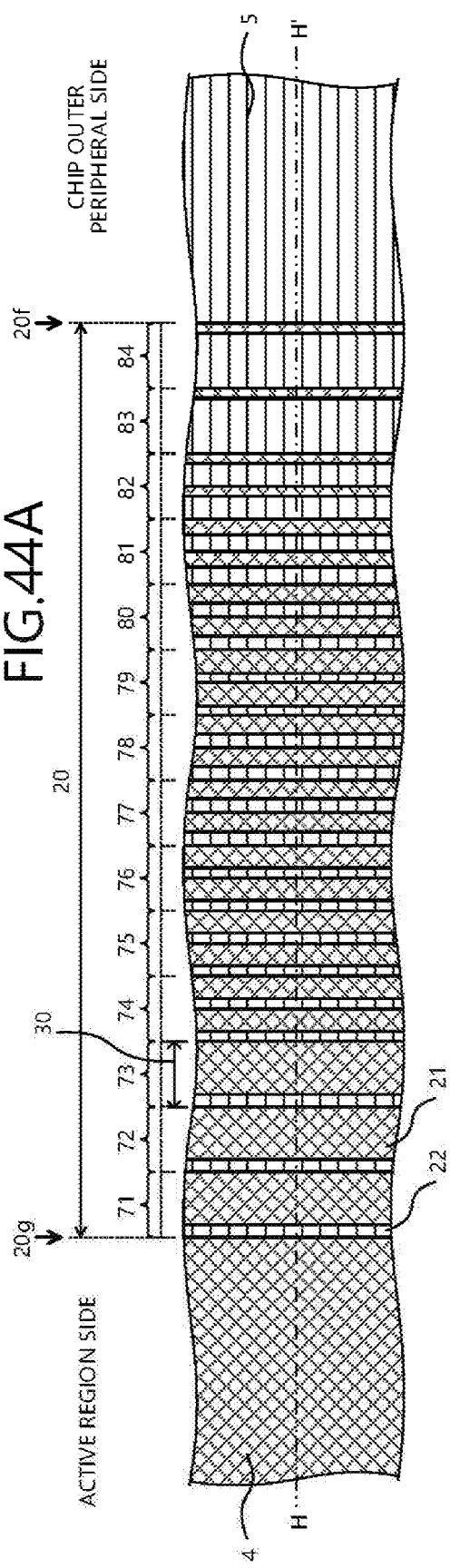
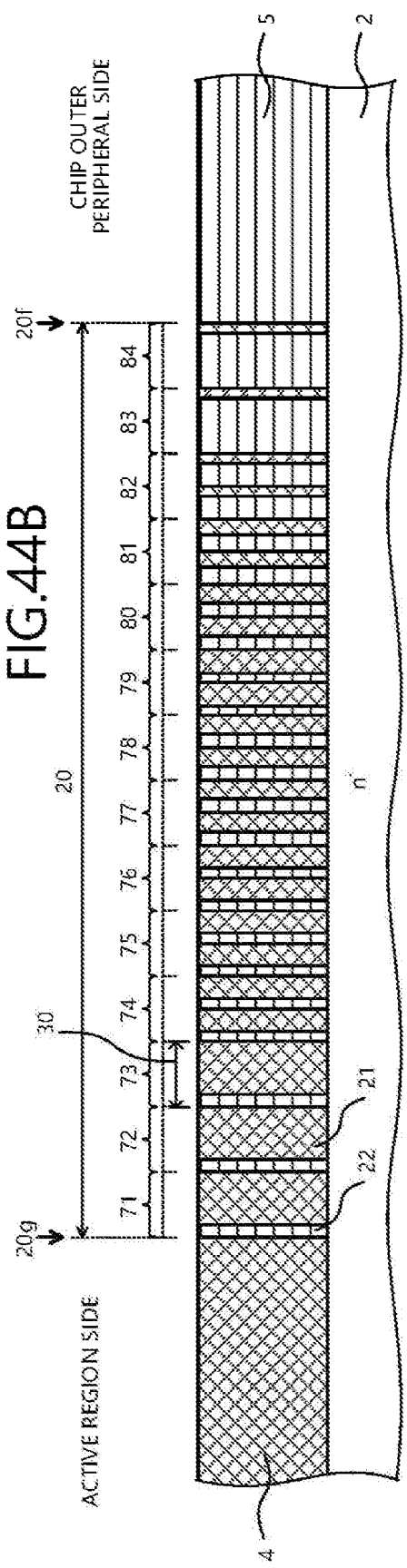

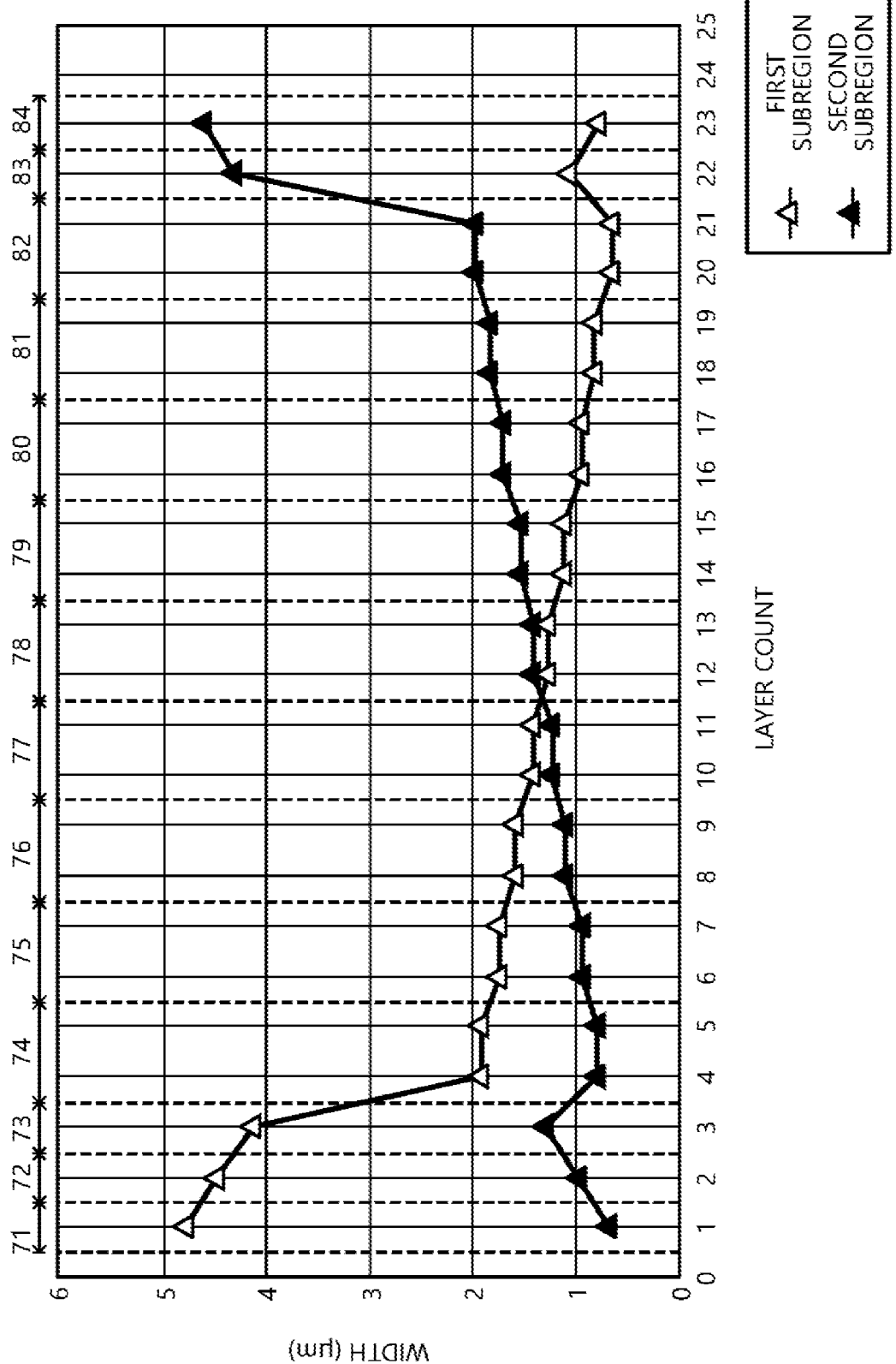

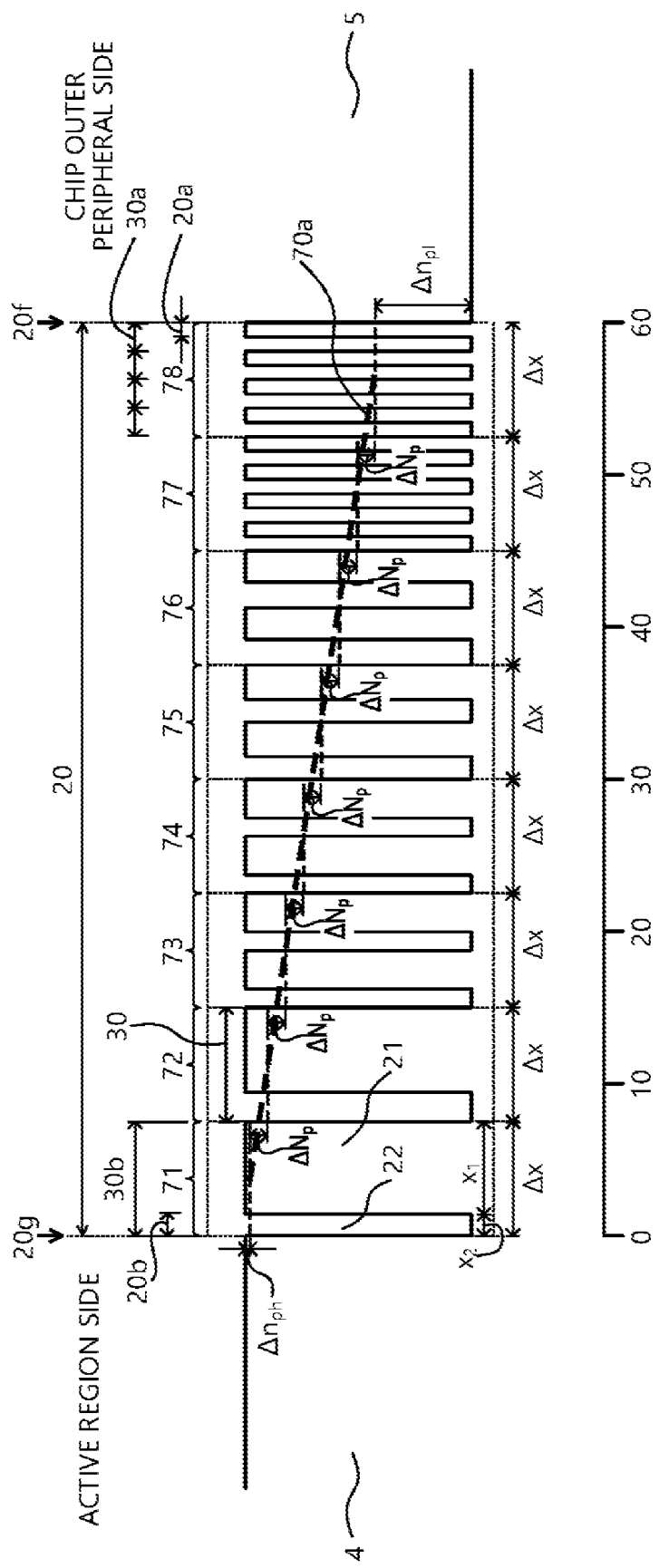

SEMICONDUCTOR DEVICE

CROSS REFERENCE TO RELATED APPLICATIONS

This application is a divisional of U.S. application Ser. No. 15/367,065, filed on Dec. 1, 2016, and allowed on Mar. 20, 2019, which is a continuation application of International Application PCT/JP2015/076369 filed on Sep. 16, 2015. These applications claim priority from Japanese Patent Application Nos. 2014-263509 filed on Dec. 25, 2014, and 2015-122451 filed on Jun. 17, 2015 the contents of which are incorporated herein by reference.

BACKGROUND OF THE INVENTION

1. Field of the Invention

The embodiments discussed herein relate to a semiconductor device.

2. Description of the Related Art

Semiconductor devices using a silicon carbide (SiC) semiconductor (hereinafter referred to as a silicon carbide semiconductor device) are recently attracting attention as devices that exceed the limitations of semiconductor devices using a silicon (Si) semiconductor material. In particular, silicon carbide semiconductor devices are expected to be applied to high voltage devices by taking advantage of characteristics of higher critical field strength and higher thermal conductivity as compared to silicon semiconductor materials. However, in producing (manufacturing) a practical silicon carbide semiconductor device, it is important to form an edge termination structure stably providing a high breakdown voltage. An edge termination structure portion is a region surrounding a periphery of an active region and relaxes electric field on the substrate front surface side of the active region to retain the breakdown voltage. The active region is a region through which current flows in an on-state.

The breakdown voltage of a device is usually limited by the electric field concentration on an outer peripheral portion of a p-type high-concentration region that is formed on a front surface side of an $n^-$-type semiconductor substrate (semiconductor chip) serving as an $n^-$-type drift layer and that extends from the active region to near an boundary between the active region and the edge termination structure portion. For example, in the case of a pn junction diode, this p-type high-concentration region is a p-type anode region forming a pn junction with the $n^-$-type drift layer. Therefore, a junction termination extension (JTE) structure is known in which a $p^-$-type low-concentration region having an impurity concentration that is lower than that of the p-type high-concentration region is formed adjacent to an outside (chip outer peripheral side) end portion of the p-type high-concentration region so as to relax the electric field on the edge termination structure portion.

In the JTE structure, a depletion layer extends from a pn junction between the p-type high-concentration region and the $n^-$-type drift layer toward the outside and spreads to both the p-type high-concentration region and the $p^-$-type low-concentration region. As a result, the electric field is relaxed on an outer peripheral portion of the p-type high-concentration region and therefore, the breakdown voltage may be improved. If this JTE structure is applied to an element having a higher breakdown voltage, the electric field concentrates also on an outer peripheral portion of the $p^-$-type low-concentration region and the breakdown voltage is therefore limited by avalanche breakdown in the outer peripheral portion of the $p^-$-type low-concentration region making up the JTE structure. Such problems may be prevented by gradually reducing the impurity concentration of the $p^-$-type low-concentration region in the outward direction from an inner side (the active region side).

The JTE structure made up of the $p^-$-type low-concentration region having an impurity concentration distribution gradually decreasing in the outward direction from the inner side in this way is referred to as a variation of lateral doping (VLD) structure. Since electric field concentration points are distributed to multiple locations in the VLD structure, the critical electric field intensity is significantly reduced. In the case of the silicon carbide semiconductor device having an extremely small thermal diffusion of impurities and subjected to ion implantation with high acceleration voltage for introducing impurities, it is difficult to apply the VLD structure to reduce the impurity concentration of the $p^-$-type low-concentration region in the outward direction from the inner side. Therefore, the JTE structure must be configured by adjacently forming multiple $p^-$-type low-concentration regions such that a region disposed on the outer side has a lower impurity concentration or a thinner thickness.

In the case of configuring the JTE structure made up of multiple $p^-$-type low-concentration regions different in impurity concentration or thickness, it is preferable to increase the number of the $p^-$-type low-concentration regions to make an impurity concentration difference of neighboring $p^-$-type low-concentration regions as small as possible from the viewpoint of breakdown voltage performance of a device. However, this leads to an increase in the number of processes and is, therefore, a factor preventing a reduction in manufacturing cost. Currently, the silicon carbide semiconductor devices are typically provided with a JTE structure made up of multiple $p^-$-type low-concentration regions having impurity concentration or thicknesses changed in two or three stages. A typical JTE structure of the silicon carbide semiconductor devices will be described by taking a Schottky barrier diode (SBD) as an example.

FIGS. 15A and 15B are explanatory views of a conventional SiC-SBD structure. FIG. 15A depicts a planar layout and FIG. 15B depicts a cross-sectional structure taken along a cutting line AA-AA' of FIG. 15A. As shown in FIGS. 15A and 15B, for example, at a breakdown voltage of 600 V or 1200 V, an edge termination structure portion 112 surrounding a periphery of an active region 111 is typically provided with a JTE structure made up of two p-type regions (a $p^-$-type region 104 and a $p^{--}$-type region 105) different in impurity concentration. For example, a silicon carbide epitaxial layer serving as an $n^-$-type drift layer 102 is deposited on a front surface of an $n^+$-type silicon carbide substrate 101. An epitaxial substrate made up of the $n^+$-type silicon carbide substrate 101 and the $n^-$-type drift layer 102 will hereinafter be referred to as a silicon carbide base (semiconductor chip).

A surface layer of the front surface (a surface on the $n^-$-type drift layer 102 side) of the silicon carbide base has a p-type guard ring 103 selectively disposed at a boundary between the active region 111 and the edge termination structure portion 112 from the active region 111 into the edge termination structure portion 112. The p-type guard ring 103 surrounds a periphery of a Schottky junction between the $n^-$-type drift layer 102 and an anode electrode 108 in the active region 111. In the edge termination structure portion 112, the surface layer of the front surface of the silicon carbide base has a JTE structure disposed outside the p-type guard ring 103 to surround a periphery of the p-type guard ring 103. The JTE structure is made up of the p⁻-type region 104 and the p⁻⁻⁻-type region 105 (hereinafter referred to as the first JTE region 104 and the second JTE region 105).

The first JTE region 104 surrounds the periphery of the p-type guard ring 103 and contacts an outside end portion of the p-type guard ring 103. The impurity concentration of the first JTE region 104 is lower than the impurity concentration of the p-type guard ring 103. The second JTE region 105 is disposed outside the first JTE region 104 to surround a periphery of the first JTE region 104 and contacts an outside end portion of the first JTE region 104. The impurity concentration of the second JTE region 105 is lower than the impurity concentration of the first JTE region 104. Both the first and second JTE regions 104, 105 have a uniform impurity concentration distribution. Reference numerals 107, 109 denote an interlayer insulating film and a cathode electrode.

As a result of intensive studies by the inventors, the breakdown voltage may be ensured up to the 1200 V by the JTE structure depicted in FIGS. 15A and 15B; however, it has been confirmed that the electric field concentration becomes significant at a higher breakdown voltage class on the boundary between the first JTE region 104 and the second JTE region 105. The occurrence of the electric field concentration on the boundary between the first JTE region 104 and the second JTE region 105 causes a problem of reduction in manufacturing process margins necessary for ensuring a predetermined breakdown voltage of the edge termination structure portion 112. The manufacturing process margins necessary for ensuring a predetermined breakdown voltage of the edge termination structure portion are margins of the breakdown voltage of the edge termination structure portion for ion implantation accuracy (a dose amount, a diffusion depth) and an electrical activation rate when a p-type region making up the JTE structure is formed.

The problem related to such manufacturing process margins may be improved by increasing the number of p-type regions making up the JTE structure and by arranging multiple p-type regions such that the p-type regions with a small impurity concentration difference are adjacent to each other, so as to reduce the impurity concentration in stages from the inner side toward the outside. However, the number of processes of photolithography and ion implantation is increased by the increased number of p-type regions making up the JTE structure, leading to a new problem of cost increase. Thus, concerning the JTE structure of silicon carbide semiconductor devices various proposals have been made for relaxing the electric field of the JTE structure.

In a proposed device in which the electric field of the JTE structure is relaxed, multiple p-type subregions having the same impurity concentration as a first JTE region are disposed in a ring shape surrounding the first JTE region in a portion of a second JTE region close to the first JTE region (see, e.g., Japanese Laid-Open Patent Publication No. 2008-034646 (paragraph 0033, FIG. 11)). In another proposed device with the electric field of the JTE structure relaxed, the JTE structure of Japanese Laid-Open Patent Publication No. 2008-034646 is further optimized (see, e.g., International Publication No. 2012/049872). In International Publication No. 2012/049872, a third JTE region surrounding a periphery of the second JTE region is further included, and multiple p-type subregions having the same impurity concentration as the second JTE region are disposed in a portion of the third JTE region close to the second JTE region.

FIGS. 16A and 16B depict a structure obtained by adding the JTE structures of Japanese Laid-Open Patent Publication No. 2008-034646 and International Publication No. 2012/049872 to the JTE structure having the two-layer structure of the first and second JTE regions 104, 105 in FIGS. 15A and 15B. FIGS. 16A and 16B are explanatory views of another example of the conventional SiC-SBD structure. In the JTE structure depicted in FIGS. 16A and 16B, an electric field relaxation region 120 made up of p⁻-type subregions 121 and p⁻⁻⁻-type subregions 122 is disposed between the first JTE region 104 and the second JTE region 105. The p⁻⁻⁻-type subregions 122 and p⁻-type subregions 121 are alternately repeatedly arranged in the outward direction from the inner side (the active region 111 side) to surround peripheries of p-type subregions adjacent on the inner side.

The impurity concentration of the p⁻-type subregions 121 is equal to the impurity concentration of the first JTE region 104. The width $x_{11}$ of each of the p⁻-type subregions 121 (the width in the outward direction from the inner side, hereinafter simply, width) is less than the width of the first JTE region 104, and the farther the p⁻-type subregions 121 are disposed toward the outside, the a smaller width thereof is. The impurity concentration of the p⁻⁻⁻-type subregions 122 is equal to the impurity concentration of the second JTE region 105. The width $x_{12}$ of each of the p⁻⁻⁻-type subregions 122 is less than the width of the second JTE region 105, and the farther the p⁻⁻⁻-type subregions 122 is disposed toward the outside, the greater the width thereof is. In this manner, progressive variation of the respective widths $x_{11}$, $x_{12}$ of the p⁻-type subregions 121 and the p⁻⁻⁻-type subregions 122 toward the outside gradually reduces the impurity concentration in the direction from the first JTE region 104 to the second JTE region 105 in this configuration.

In Japanese Laid-Open Patent Publication No. 2008-034646 and International Publication No. 2012/049872, the JTE regions are formed in a concentric shape surrounding the periphery of the active region, and the impurity concentration of the JTE regions is controlled by the dose amount of ion implantation. Further, in addition to a method of controlling the impurity concentration of the JTE region in this manner, a method of controlling the impurity concentration of respective JTE regions by changing the planar pattern of each JTE region has been reported. For example, a device including a second JTE region in which a p⁻-type region having the same impurity concentration and the same depth as a first JTE region is disposed in a mesh shape (a lattice shape) with the n⁻-type drift layer left in a matrix shape has been proposed (see, e.g., Japanese Laid-Open Patent Publication No. 2011-187767). A JTE structure in Japanese Laid-Open Patent Publication No. 2011-187767 is depicted in FIGS. 17A, 17B, and 18.

FIGS. 17A and 17B are diagrams of another example of a conventional SiC-SBD structure. FIG. 17A depicts a planar layout and FIG. 17B depicts a cross-sectional structure taken along a cutting line BB-BB' of FIG. 17A. FIG. 18 is an enlarged plan view of a principal part depicted in FIG. 17A. FIG. 18 depicts an enlarged view of a portion surrounded by a rectangular frame 130 of FIG. 17A. As depicted in FIGS. 17A, 17B, and 18, in Japanese Laid-Open Patent Publication No. 2011-187767, the n⁻-type drift layer 102 is selectively left within a second JTE region 132 having the same impurity concentration and the same depth as a first JTE region 131, which is equivalent to disposing a JTE region having an impurity concentration lower than the first JTE region 131 on the outside of the first JTE region 131.

Japanese Laid-Open Patent Publication No. 2011-187767 describes that the n⁻-type drift layer 102 left in a matrix shape may be changed in width and arrangement density to change the proportion of the n⁻-type drift layer 102 occupying the inside of the second JTE region 132 so as to produce a predetermined impurity concentration distribution. The JTE structures described in Japanese Laid-Open Patent Publication No. 2008-034646, International Publication No. 2012/049872, and Japanese Laid-Open Patent Publication No. 2011-187767 are known as improvement items not only for the JTE structure of the silicon carbide semiconductor device but also for the VLD structure described above. For example, a method of obtaining a predetermined impurity concentration distribution of the JTE region by forming a p⁻-type region in a predetermined planar pattern by ion implantation using, as a mask, an oxide film having openings in a mesh or matrix shape pattern has been proposed (see, e.g., Japanese Laid-Open Patent Publication No. 2014-038937 (paragraph 0050, FIG. 3)). Further, a method of forming an ion implantation mask by unit masks having a circular shape, a rectangular shape, or a plus "+" has been proposed (see, e.g., Japanese Laid-Open Patent Publication No. 2011-165856). In Japanese Laid-Open Patent Publication No. 2011-165856, in the respective formation regions of JTE regions, the ion implantation masks are formed so that the dimensions and arrangement intervals of the unit masks differ from each other.

As another method of forming a JTE structure, the following method has been proposed in terms of formation of a JTE structure made up of a first JTE region, a second JTE region disposed outside the first JTE region and having an impurity concentration lower than the first JTE region, and a third JTE region that is made up of first and second p-type subregions different in impurity concentration disposed between the first JTE region and the second JTE region and that has an average impurity concentration between the first JTE region and the second JTE region. Ion implantation is performed by using a first mask to form the same impurity layer as the second JTE region such that the impurity layer reaches a formation region of the first JTE region and to form the second subregions. Thereafter, ion implantation is performed by using a second mask at least covering the second JTE region to form the first JTE region and the first subregions (see, e.g., International Publication No. 2012/049872).

SUMMARY OF THE INVENTION

According to one aspect of the present invention, semiconductor device includes a semiconductor substrate of a first conductivity type, formed of a silicon carbide semiconductor; an active region disposed on a front surface of the semiconductor substrate and through which main current flows; and an edge termination structure portion surrounding a periphery of the active region. The edge termination structure portion has: plural semiconductor regions of a second conductivity type, disposed concentrically surrounding the periphery of the active region, the farther outward a semiconductor region thereamong is arranged, the lower an impurity concentration thereof is, and an intermediate region of the second conductivity type, disposed so as to mutually contact one combination of the semiconductor regions that are adjacent, the intermediate region having an impurity concentration that is lower than that of the semiconductor region adjacent on an inner side and an impurity concentration that is higher than that of the semiconductor region adjacent on an outer side, the intermediate region being disposed with respect to at least one combination of the semiconductor regions that are adjacent. The intermediate region includes a first subregion of the second conductivity type and a second subregion of the second conductivity type and having an impurity concentration that is lower than that of the first subregion, the first and second subregions being alternately and repeatedly arranged concentrically surrounding a periphery of the semiconductor region adjacent on the inner side. The second subregions are disposed having a same width, and the first subregions are disposed having respective widths that are narrower the farther outward the first subregions are arranged.

The semiconductor device further includes a third subregion disposed outermost in the intermediate region and having an impurity concentration that is lower than that of the first subregion and an impurity concentration that is higher than that of the semiconductor region.

In the semiconductor device, the third subregion includes a first subregion portion of the second conductivity type and having an impurity concentration that is lower than that of the first subregion, selectively disposed in the first region arranged outermost in the intermediate region.

In the semiconductor device, the third subregion includes along a direction of a border of the active region and the edge termination structure portion, the first subregion and the first subregion portion alternately and repeatedly arranged.

The semiconductor device further includes a fourth subregion disposed innermost in the intermediate region and having an impurity concentration that is lower than that of the semiconductor region adjacent on the inner side and an impurity concentration that is higher than that of the second subregion.

In the semiconductor device, the fourth subregion includes a second subregion portion of the second conductivity type and having an impurity concentration that is higher than that of the second subregion, selectively disposed in the second subregion arranged innermost in the intermediate region.

In the semiconductor device, the fourth subregion includes along a direction of a border of the active region and the edge termination structure portion, the second subregion and the second subregion portion alternately and repeatedly arranged.

In the semiconductor device, the second subregion is arranged innermost in intermediate region, and the first subregion is arranged outermost in the intermediate region.

The semiconductor device further includes a fifth subregion disposed between the first subregion and the second subregion that are adjacent, the fifth subregion having an impurity concentration that is lower than that of the first subregion and an impurity concentration that is higher than that of the second subregion.

In the semiconductor device, the fifth subregion includes a third subregion portion of the second conductivity type and having an impurity concentration that is lower than that of the first subregion, selectively disposed in the first subregion.

In the semiconductor device, the fifth subregion includes along a direction of a border of the active region and the edge termination structure portion, the first subregion and the third subregion portion alternately and repeatedly arranged.

In the semiconductor device, the third subregion portion is disposed near an interface of the first subregion and the second subregion adjacent on an outer side of the first subregion.

According to another aspect of the invention, a semiconductor device includes a semiconductor substrate of a first conductivity type, formed of a silicon carbide semiconductor; an active region disposed on a front surface of the semiconductor substrate and through which main current flows; and an edge termination structure portion surrounding a periphery of the active region. The edge termination structure portion has: plural semiconductor regions disposed concentrically surrounding a periphery of the active region, the farther outward a semiconductor region thereamong is arranged, the lower an impurity concentration thereof is, and an intermediate region of the second conductivity type, disposed so as to mutually contact one combination of the semiconductor regions that are adjacent, the intermediate region having an impurity concentration that is lower than that of the semiconductor region adjacent on an inner side and an impurity concentration that is higher than that of the semiconductor region adjacent on an outer side, the intermediate region being disposed with respect to at least one combination of the semiconductor regions that are adjacent. The intermediate region is divided into plural sections concentrically surrounding a periphery of the semiconductor region adjacent on an inner side. One or more combinations of a first subregion of the second conductivity type and a second subregion of the second conductivity type and having an impurity concentration that is lower than that of the first subregion, alternately and repeatedly arranged, is disposed concentrically in the sections from an inner side toward an outer side. A microregion including one combination of the first subregion and the second subregion that are adjacent is disposed having a same width in a same section of the sections and is disposed having a width that is narrower the farther outward a section is positioned in which the microregion is arranged.

In the semiconductor device, the microregion has an average impurity concentration $N_p$ of satisfying equation 1: $N_p = ((x_1 \times n_{p1}) + (x_2 \times n_{p2}))/(x_1 + x_2)$, where, a width and the impurity concentration of the first subregion are $x_1$ and $n_{p1}$, respectively, and a width and the impurity concentration of the second subregion are $x_2$ and $n_{p2}$, respectively.

In the semiconductor device, the second subregion is disposed in plural, having a same width.

In the semiconductor device, the first subregion is disposed in plural, having a width that is narrower the farther outward the first subregion is arranged.

In the semiconductor device, the first subregion arranged outermost has a width that is a smallest size formable by manufacture processing.

The semiconductor device further includes a first subregion portion of the second conductivity type, selectively disposed in the first subregion arranged in the section positioned outermost, the first subregion portion having an impurity concentration that is lower than that of the first subregion.

The semiconductor device further includes a first subregion portion of the second conductivity type, selectively disposed in the first subregion, and having an impurity concentration that is lower than that of the first subregion. A ratio of the first subregion portion in the first subregion is higher the farther outward the first subregion is arranged.

In the semiconductor device, the first subregion portion is arranged at a predetermined interval along a direction of a border of the active region and the edge termination structure portion.

The semiconductor device further includes a second subregion portion of the second conductivity type, selectively disposed in the second subregion arranged in the section positioned innermost, the second subregion portion having an impurity concentration that is higher than that of the second subregion.

The semiconductor device further includes a second subregion portion of the second conductivity type, selectively disposed in the second subregion, and having an impurity concentration that is higher than that of the second subregion. A ratio of the second subregion portion in the second subregion is lower the farther outward the second subregion is arranged.

In the semiconductor device, the second subregion portion is disposed at a predetermined interval along a direction of a border of the active region and the edge termination structure portion.

According to another aspect of the present invention, a semiconductor device includes a semiconductor substrate of a first conductivity type, formed of a silicon carbide semiconductor; an active region disposed on a front surface of the semiconductor substrate and through which main current flows; and an edge termination structure portion surrounding a periphery of the active region. The edge termination structure portion has: plural semiconductor regions disposed concentrically surrounding a periphery of the active region, the farther outward a semiconductor region thereamong is arranged, the lower an impurity concentration thereof is, and an intermediate region disposed so as to mutually contact one combination of the semiconductor regions that are adjacent, the intermediate region having an impurity concentration that is lower than that of the semiconductor region adjacent on an inner side and an impurity concentration that is higher than that of the semiconductor region adjacent on an outer side, the intermediate region being disposed with respect to at least one combination of the semiconductor regions that are adjacent. The intermediate region is divided into plural sections concentrically surrounding a periphery of the semiconductor region adjacent on an inner side. One or more combinations of a first subregion of the second conductivity type and a second subregion of the second conductivity type and having an impurity concentration that is lower than that of the first subregion, alternately and repeatedly arranged, are disposed concentrically in the sections from an inner side toward an outer side. Each of the sections has an average impurity concentration determined based on widths of the first subregion and the second subregion arranged in the section, and the average impurity concentration is lower the farther outward arrangement is. An average impurity concentration difference between all adjacent sections is equal.

In the semiconductor device, a microregion including one combination of the first subregion and the second subregion that are adjacent has an average impurity concentration equal to the average impurity concentration of the section in which the microregion is arranged.

In the semiconductor device, the average impurity concentration $N_p$ of the microregion satisfies equation 2: $N_p = ((x_1 \times n_{p1}) + (x_2 \times n_{p2}))/(x_1 + x_2)$, where, a width and the impurity concentration of the first subregion are $x_1$ and $n_{p1}$, respectively, and a width and the impurity concentration of the second subregion are $x_2$ and $n_{p2}$, respectively.

In the semiconductor device, the microregion is disposed at a same interval in a same section of the sections.

In the semiconductor device, the section innermost has an average impurity concentration that is 90 percent or more of the average impurity concentration of the semiconductor region adjacent on the inner side of the section.

In the semiconductor device, the intermediate region has an average impurity concentration slope that is constant across the intermediate region entirely.

The semiconductor device further includes a first subregion portion of the second conductivity type, selectively disposed in the first subregion arranged in the section positioned outermost, the first subregion portion having an impurity concentration that is lower than that of the first subregion.

In the semiconductor device, the first subregion portion is arranged at a predetermined interval along a direction of a border of the active region and edge termination structure portion.

The semiconductor device further includes a second subregion portion of the second conductivity type, selectively disposed in the second subregion arranged in the section positioned innermost, the second subregion portion having an impurity concentration that is higher than that of the second subregion.

In the semiconductor device, the second subregion portion is arranged at a predetermined interval along a direction of a border of the active region and the edge termination structure portion.

In the semiconductor device, the first subregion portion has an impurity concentration that is a same as that of the semiconductor region adjacent on an outer side of the first subregion portion.

In the semiconductor device, the second subregion portion has an impurity concentration that is a same as that of the semiconductor region adjacent on an inner side of the second subregion portion.

In the semiconductor device, the third subregion portion has an impurity concentration that is a same as that of the semiconductor region adjacent on an outer side of the third subregion portion.

In the semiconductor device, the first subregion has an impurity concentration that is a same as that of the semiconductor region adjacent on an inner side of the first subregion.

In the semiconductor device, the second subregion has an impurity concentration that is a same as that of the semiconductor region adjacent on an outer side of the second subregion.

In the semiconductor device, the intermediate region has an average impurity concentration that is an intermediate impurity concentration of the semiconductor region adjacent on the inner side and the semiconductor region adjacent on the outer side.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 1A and 1B are diagrams of a structure of a semiconductor device according to a first embodiment;

FIGS. 5A and 5B are diagrams depicting a portion of the JTE structure of the semiconductor device according to a third embodiment;

FIGS. 7A, 7B, and 7C are diagrams of a structure of the semiconductor device according to a fifth embodiment;

FIGS. 8A, 8B, 9A, and 9B are cross-sectional views of the semiconductor device during manufacture according to a sixth embodiment;

FIGS. 11A, 11B, and 11C are diagrams of a planar layout of a JTE structure of a semiconductor device according to example 2;

FIG. 19 is a cross-sectional view of an example of another conventional SiC-SBD structure;

FIGS. 20A, 20B, and 20C are diagrams of a structure of the semiconductor device according to a seventh embodiment;

FIGS. 22A and 22B are diagrams depicting a portion of a JTE structure of a semiconductor device according to example 3;

FIGS. 23A and 23B are diagrams depicting a portion of a JTE structure of a semiconductor device according to conventional example 4;

FIGS. 26A and 26B are diagrams of a structure of the semiconductor device according to an eighth embodiment;

FIGS. 27A and 27B are diagrams of a structure of the semiconductor device according to a ninth embodiment;

FIGS. 28A and 28B are diagrams of a structure of the semiconductor device according to a tenth embodiment;

FIGS. 29A and 29B are diagrams of a structure of the semiconductor device according to an eleventh embodiment;

FIGS. 30A and 30B are diagrams of a structure of the semiconductor device according to a twelfth embodiment;

FIGS. 31A, 31B, and 31C are diagrams of a structure of the semiconductor device according to a thirteenth embodiment;

FIGS. 32 and 33 are diagrams of one example of widths of first and second subregions of sections in FIGS. 31A to 31C;

FIGS. 34A, 34B, and 34C are diagrams of another example of a structure of the semiconductor device according to the thirteenth embodiment;

FIG. 35 is a diagram depicting one example of widths of the first and second subregions of the sections depicted in FIG. 34A to 34C;

FIGS. 36A, 36B, and 36C are diagrams of a structure of the semiconductor device according to a fourteenth embodiment;

FIGS. 38A, 38B, and 38C are diagrams depicting another example of the structure of the semiconductor device according to the fourteenth embodiment;

FIG. 39 is a diagram depicting an example of widths of the first and second subregions in the sections depicted in FIGS. 38A to 38C;

FIGS. 40a, 40B, and 40C are diagrams depicting a portion of a JTE structure of a semiconductor device according to conventional example 5;

FIG. 41 is a diagram depicting an example of widths of the first and second subregions of the sections depicted in FIGS. 40A to 40C;

FIG. 42 is a characteristics diagram of breakdown voltage characteristics of an edge termination structure portion of a semiconductor device according to example 4;

FIG. 43 is a characteristics diagram depicting electric field strength distribution of the semiconductor device of example 4;

FIGS. 44A, 44B, and 44C depict enlarged views of an electric field relaxation region in FIGS. 1A and 1B;

FIG. 45 is a diagram of one example of widths of the first and second subregions in the sections depicted in FIGS. 44A, 44B, and 44C;

FIGS. 47A and 47B are plan views depicting a planar layout of the semiconductor device according to an eighteenth embodiment.

DETAILED DESCRIPTION OF THE INVENTION

Figure 2A:
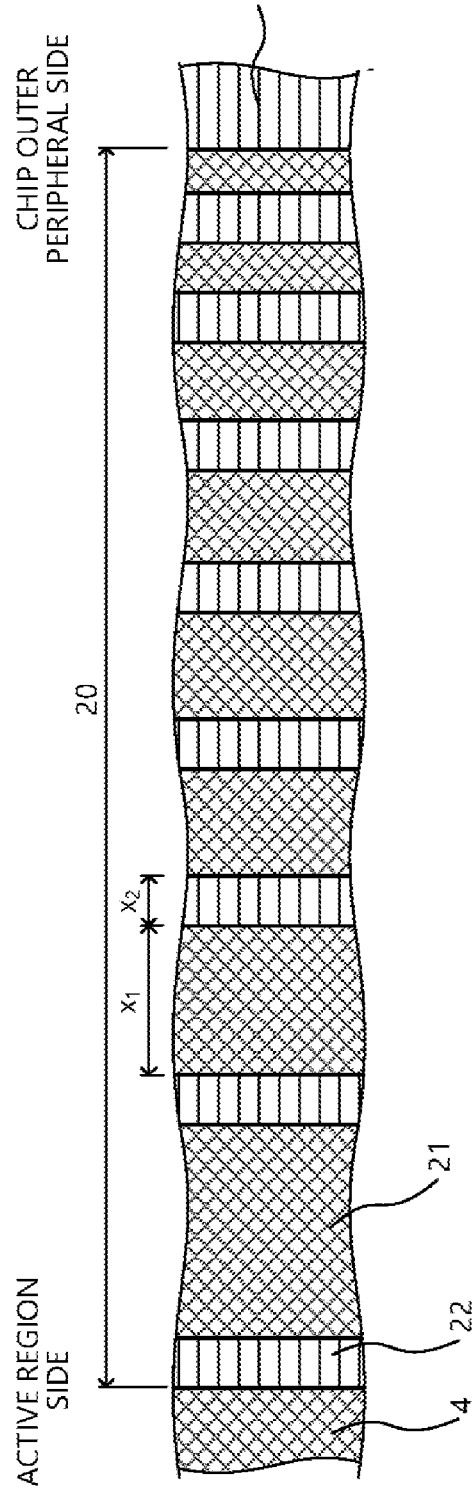
FIGS. 2A and 2B are enlarged views of a portion of a JTE structure in FIGS. 1A and 1B.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 2B:
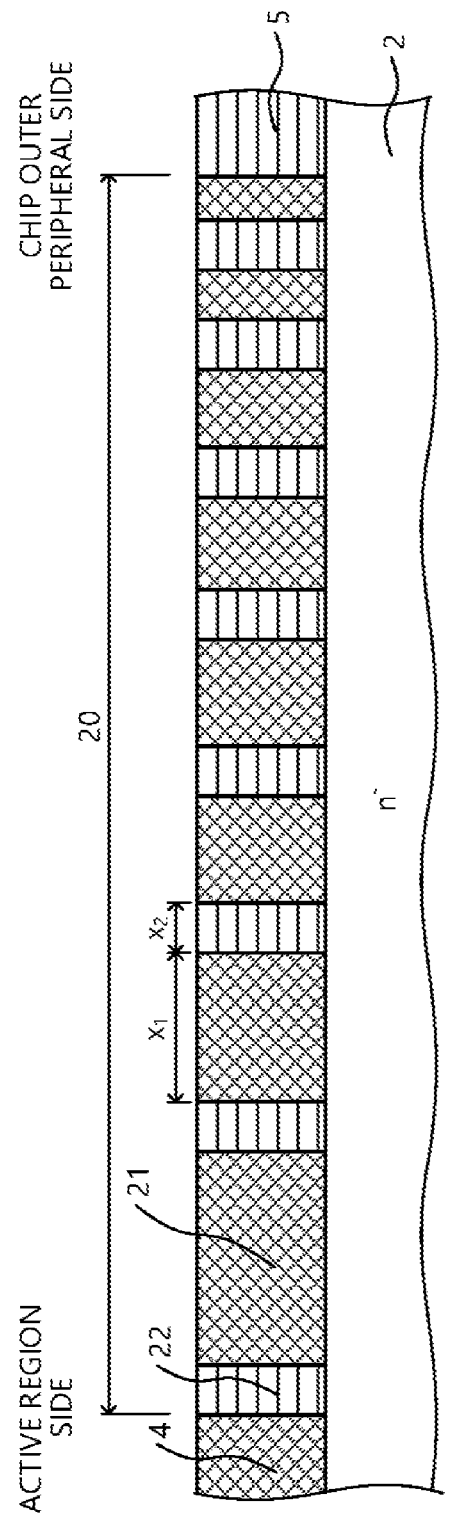
Figure 3A:
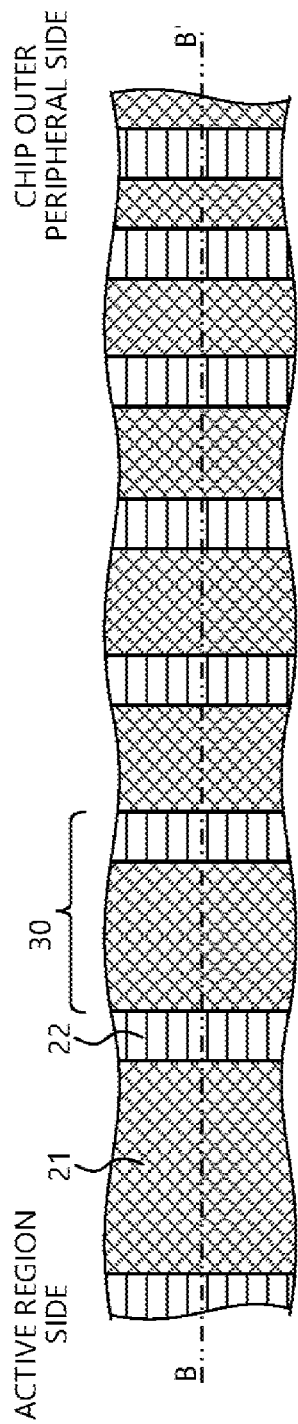
FIGS. 3A, 3B, 3C are characteristics diagrams depicting impurity concentration distribution of a portion of the JTE structure in FIGS. 1A and 1B.
Figure 3B:
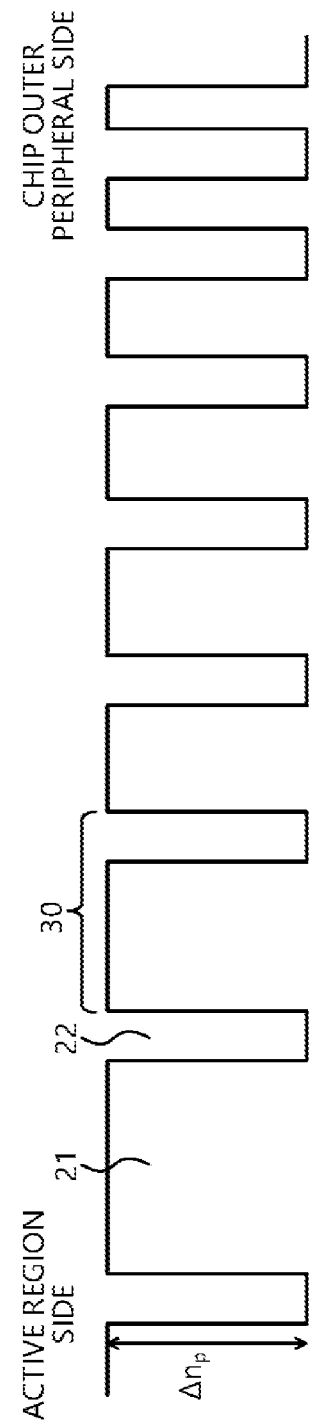
Figure 3C:
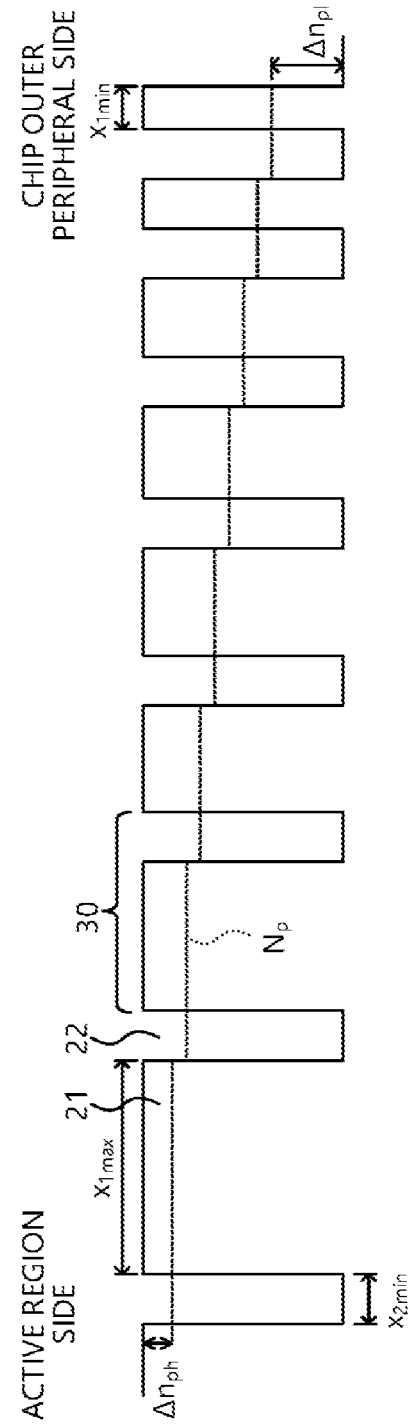

A structure of the semiconductor device according to a first embodiment will be described taking a Schottky barrier diode (SBD) as an example. FIGS. 1A and 1B are diagrams of a structure of the semiconductor device according to the first embodiment. FIG. 1A depicts a planar layout; FIG. 1B depicts a cross-sectional view of along cutting line A-A' in FIG. 1A. FIGS. 2A and 2B are enlarged views of a portion (an electric field relaxation region 20 described hereinafter) of the JTE structure in FIGS. 1A and 1B. FIGS. 2A and 2B depict enlarged views of a planar layout and a cross-sectional view of the electric field relaxation region 20, respectively. FIGS. 3A, 3B, 3C are characteristics diagrams depicting the impurity concentration distribution of a portion of the JTE structure in FIGS. 1A and 1B. FIG. 3A depicts a planar layout of the electric field relaxation region 20. FIG. 3B depicts a p-type impurity concentration distribution at cutting line B-B' in FIG. 3A. FIG. 3C depicts the impurity concentration distribution of the electric field relaxation region 20.

As shown in FIG. 1A, the semiconductor device according to the first embodiment includes an active region 11 through which current flows in an on-state, and an edge termination structure portion 12 relaxing an electric field on a base front surface side of the active region 11 to retain a breakdown voltage. The active region 11 is provided with a device structure (not depicted) of the SBD. On a boundary between the active region 11 and the edge termination structure portion 12, a p-type guard ring 3 is disposed to surround a periphery of the active region 11. The edge termination structure portion 12 surrounds the periphery of the active region 11. The edge termination structure portion 12 is provided with a JTE structure made up of two p-type regions (semiconductor regions of a second-conductivity type (a p$^-$-type region 4 and a p$^{--}$-type region 5)) having differing impurity concentrations and the p-type electric field relaxation region (an intermediate region of the second-conductivity type) 20 disposed between the p$^-$-type region 4 and the p$^{--}$-type region 5.

The p-type guard ring 3, the p$^-$-type region (hereinafter referred to as a first JTE region) 4, the electric field relaxation region 20, and the p$^{--}$-type region (hereinafter referred to as a second JTE region) 5 are arranged in this order from the inner side (active region side), in a concentric shape around the active region 11 (e.g., the center of a semiconductor chip). The impurity concentration of the first JTE region 4 is lower than the impurity concentration of the p-type guard ring 3. The impurity concentration of the second JTE region 5 is lower than the impurity concentration of the first JTE region 4. The average impurity concentration of the electric field relaxation region 20 is lower than the impurity concentration of the first JTE region 4 and higher than the impurity concentration of the second JTE region 5. The average impurity concentration per unit area of the electric field relaxation region 20 is an intermediate impurity concentration between the first JTE region 4 and the second JTE region 5. The electric field relaxation region 20 will be described in detail later.

As depicted in FIG. 1B, the p-type guard ring 3, the first JTE region 4, the electric field relaxation region 20, and the second JTE region 5 are each selectively disposed in a surface layer of a front surface (a surface on an n$^-$-type drift layer 2 side) of a silicon carbide base (semiconductor chip) 10. The silicon carbide base 10 is an epitaxial substrate formed by stacking a silicon carbide epitaxial layer serving as the n$^-$-type drift layer 2 on a front surface of an n$^+$-type silicon carbide substrate 1. The p-type guard ring 3 is selectively disposed at a boundary between the active region 11 and the edge termination structure portion 12 from the active region 11 into the edge termination structure portion 12. The p-type guard ring 3 surrounds a periphery of a Schottky junction between the n$^-$-type drift layer 2 and an anode electrode 8 in the active region 11.

The JTE structure is disposed outside the p-type guard ring 3. For example, among the regions making up the JTE structure, the first JTE region 4 is disposed innermost and contacts the outside end portion of the p-type guard ring 3. The electric field relaxation region 20 is disposed outside the first JTE region 4 and contacts the outside end portion of the first JTE region 4. The second JTE region 5 is disposed outside the electric field relaxation region 20 and contacts the outside end portion of the electric field relaxation region

20. The depths of the p-type guard ring 3, the first JTE region 4, the electric field relaxation region 20, and the second JTE region 5 may be equal to each other or may variously be adjusted to satisfy the impurity concentration difference with the adjacent regions.

An interlayer insulating film 7 covers the JTE structure of the edge termination structure portion 12 (i.e., the first JTE region 4, the electric field relaxation region 20, and the second JTE region 5). Therefore, the JTE structure of the edge termination structure portion 12 is electrically insulated from the anode electrode 8 by the interlayer insulating film 7. The inside end portion of the interlayer insulating film 7 extends onto the p-type guard ring 3. The anode electrode 8 is disposed on the front surface of the silicon carbide base 10 and forms a Schottky junction with the n$^-$-type drift layer 2 and contacts the p-type guard ring 3. The end portion of the anode electrode 8 extends onto the interlayer insulating film 7. A cathode electrode 9 is disposed on a rear surface of the silicon carbide base 10 (a rear surface of the n$^+$-type silicon carbide substrate 1 serving as an n$^+$-type cathode layer).

The electric field relaxation region 20 will be described in detail. As depicted in FIGS. 2A and 2B, the electric field relaxation region 20 is formed by a p$^-$-type region (hereinafter, first subregion) 21 and a p$^{--}$-type region (hereinafter, second subregion) 22 that are alternately and repeatedly arranged in a concentric shape surrounding the first JTE region 4. In FIGS. 2A and 2B, the left side is the active region 11 side (i.e., the first JTE region 4 side) and the right side is the chip outer peripheral side (i.e., the second JTE region side) (similarly for FIGS. 3A to 6C, 11A to 11C, 20A to 20C, 22A, 22B, 23A, 23B, 26A to 31C, 34A to 34C, 36A to 36C, 38A to 38C, 40A to 40C, 44A to 44C, 46A, 46B, 47A, 47B). At the innermost side of the electric field relaxation region 20, the second subregion 22 is arranged so as to contact the first JTE region 4 and at the outermost side of the electric field relaxation region 20, the first subregion 21 is arranged so as to contact the second JTE region 5. The first subregions 21 are disposed to have widths (widths in a direction from the inner side toward the outer side) $x_1$ that are smaller the farther the first subregion 21 is arranged toward the outer side. The second subregions 22 are disposed to have widths $x_2$ that are the same (fixed) irrespective of the arrangement position. The impurity concentrations of the first subregions 21, for example, are substantially equal to the impurity concentration of the first JTE region 4. The impurity concentrations of the second subregions 22, for example, are substantially equal to the impurity concentration of the second JTE region 5.

As depicted in FIG. 3B, a p-type impurity concentration difference $\Delta n_p$ exists between a first subregion 21 and an adjacent second subregion 22. For example, among a combination of a first subregion 21 and an adjacent second subregion 22, the width and the impurity concentration of the first subregion 21 are assumed to be $x_1$ and $n_{p1}$, respectively and the width and the impurity concentration of the second subregion 22 are assumed to be $x_2$ and $n_{p2}$, respectively. In this case, in the electric field relaxation region 20, the average impurity concentration $N_p$ of a region (hereinafter, equivalent concentration region) 30 that includes a combination of a first subregion 21 and an adjacent second subregion 22 is expressed by equation 3. Further, the electric field relaxation region 20 may be assumed to be made up of multiple equivalent concentration regions 30 arranged adjacently in a direction from the inner side toward the outside.

$$N_p = ((x_1 \times n_{p1}) + (x_2 \times n_{p2}))/(x_1 + x_2) \quad (3)$$

Therefore, as depicted in FIG. 3C, from a macro perspective, as described above, by setting the widths $x_1$, $x_2$ of the first and second regions 21, 22, the average impurity concentration $N_p$ of the equivalent concentration regions 30 decrease with arrangement toward the outside (indicated by dotted lines crossing between first and second subregions). In other words, the p-type impurity concentration difference $\Delta n_p$ of a first subregion 21 and an adjacent second subregion 22 may be reduced gradually from the inner side toward the outside and it may be inferred that accompanying the reduction of the p-type impurity concentration difference $\Delta n_p$, the electric field strength of the concerning portion may be reduced. Therefore, the impurity concentration distribution of the electric field relaxation region 20 may be made close to an impurity concentration distribution substantially equal to an impurity concentration distribution that gradually decreases from the inner side toward the outside. In FIGS. 2A, 2B, and 3A, regions having substantially equal impurity concentrations (the first JTE region 4 and the first subregions 21; the second JTE region 5 and the second subregions 22) are indicated by the same hatching (similarly, for FIGS. 4A to 9B, 11A to 11C, 20A, 20B, 21, 22A, 23A, 26A, 27A, 28A, 29A, 30A, 46A, 47A, 31A, 31B, 34A, 34B, 36A, 36B, 38A, 38B, 40A, 40B, 44A, and 44B).

As described above, according to the first embodiment, an electric field relaxation region is disposed between a first JTE region and a second JTE region, the electric field relaxation region being formed by alternating first and second subregions having impurity concentrations substantially the same as first and second JTE regions, respectively, and repeatedly arranged in a concentric shape surrounding the first JTE region. Thus, the impurity concentration slope between the first JTE region and the second JTE region may be reduced as compared to a case where the electric field relaxation region is not disposed. Consequently, the electric field between the first JTE region and the second JTE region may be relaxed, enabling dielectric breakdown resistance at an outer peripheral portion of the edge termination structure portion to be increased. Further, according to the first embodiment, the second subregions, which have relatively lower impurity concentrations, have the same width; and the first subregions, which have relatively higher impurity concentrations, have widths that are smaller the closer the first subregion is toward the outside, whereby the width of the electric field relaxation region may be reduced. Therefore, the breakdown voltage of the edge termination structure portion may be enhanced without increasing the width of the entire edge termination structure portion (edge length). As a result, increased cost may be avoided and the breakdown voltage of the edge termination structure portion may be enhanced. For example, in a SBD, Metal Oxide Semiconductor Field Effect Transistor (MOSFET) used as a silicon carbide semiconductor device, the breakdown voltage difference of the active region and the edge termination structure portion stabilizes operation the greater the breakdown voltage of the edge termination structure portion is and enhances reliability on practical use. Therefore, the breakdown voltage of the edge termination structure portion is made as high as possible.

Figure 4A:
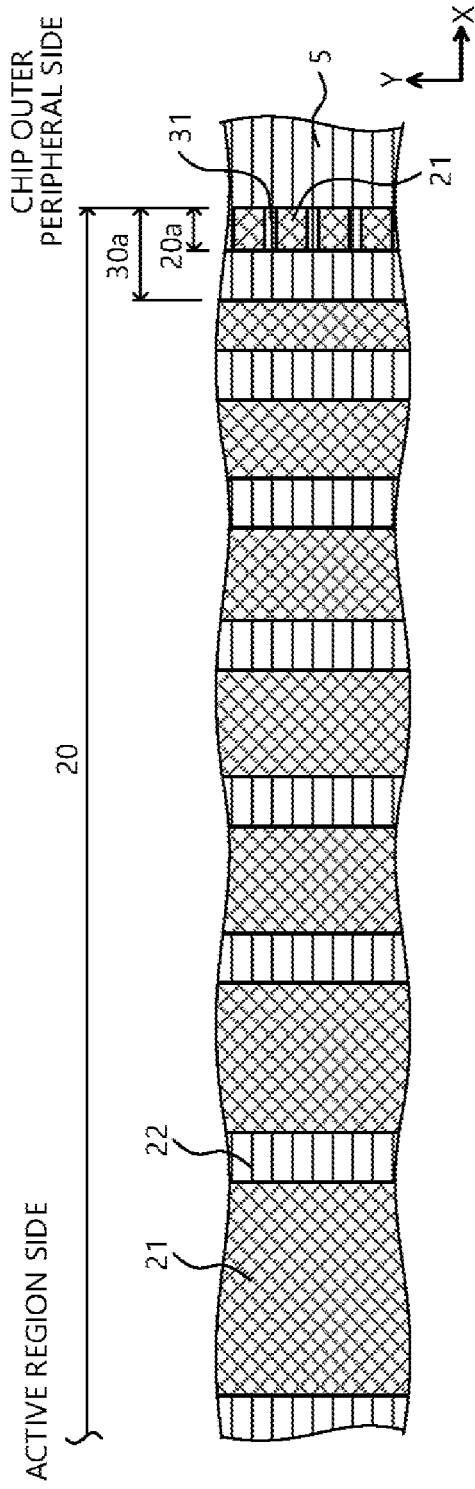
FIGS. 4A and 4B are diagrams depicting a portion of the JTE structure of the semiconductor device according to a second embodiment.
Figure 4B:
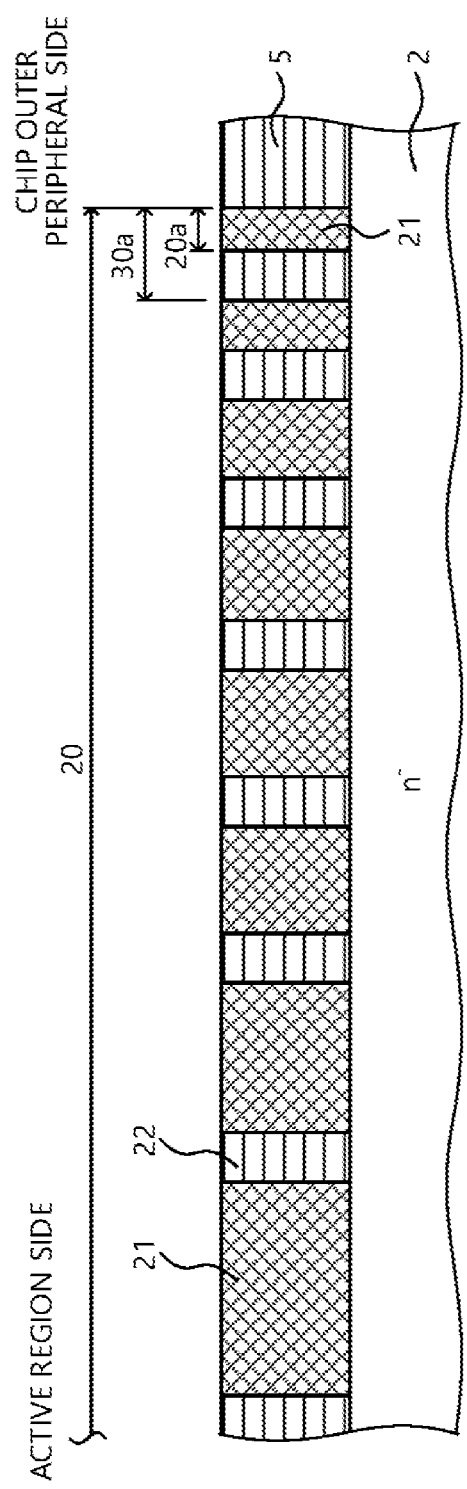

A structure of the semiconductor device according to a second embodiment will be described. FIGS. 4A and 4B are diagrams depicting a portion of the JTE structure of the semiconductor device according to the second embodiment. FIGS. 4A and 4B depict enlarged views of a planar layout and a cross-sectional view of the electric field relaxation region 20, respectively. The configuration of the semiconductor device according to the second embodiment excluding the electric field relaxation region 20 is the same as that of the semiconductor device according to the first embodiment (FIGS. 1A and 1B). The semiconductor device according to the second embodiment differs from the semiconductor device according to the first embodiment in that in the outermost first subregion 21 (i.e., the first subregion 21 contacting the inner side of the second JTE region 5) of the electric field relaxation region 20, first subregion portions 31 having an impurity concentration that is lower than that of the first subregion 21 are selectively disposed. In other words, the outermost subregion (hereinafter, third subregion) 20a of the electric field relaxation region is made up of the first subregion 21 and the first subregion portions 31. Therefore, the average impurity concentration of the third subregion 20a is lower than the impurity concentration of the first subregion 21 and higher than the impurity concentration of the second JTE region 5.

In particular, the first subregion portions 31 are arranged at a predetermined interval along a tangential direction Y along an interface of the active region 11 and the edge termination structure portion 12. In FIGS. 4A and 4B, X is a normal direction X from the interface of the active region 11 and the edge termination structure portion 12 toward the outside and is a direction orthogonal to the tangential direction Y. The first subregion portions 31 contact the second subregion 22 adjacent on the inner side and the second JTE region 5 adjacent on the outer side. In other words, the third subregion 20a is configured by alternately and repeatedly arranging the first subregion 21 and the first subregion portions 31 along the tangential direction Y. The impurity concentration of the first subregion portions 31, for example, is substantially equal to the impurity concentration of the second JTE region 5. The area ratio of the first subregion 21 and the first subregion portions 31 is suitably varied, whereby the average impurity concentration of the third subregion 20a may be controlled. As a result, the average impurity concentration of the equivalent concentration region 30a formed by the third subregion 20a and the second subregion 22 adjacent on the inner side of the third subregion 20a may be made close to the impurity concentration of the second JTE region 5.

For example, between the second JTE region 5 and the outermost equivalent concentration region 30a of the electric field relaxation region 20, the p-type impurity concentration difference $\Delta n_{p1}$ exists, which causes a process limit of the formation process of the first and second subregions 21, 22 (refer to FIG. 3C). In particular, the limit value of a width $x_1$ of the outermost first subregion 21 of the electric field relaxation region 20 is a minimum width $x_{1min}$ determined by the process limits of the photolithography process of the ion implantation mask for forming the first subregions 21. Further, the limit value of the width (constant width) $x_2$ of the second subregions 22 is the minimum width $x_{2min}$ determined by the process limit of the photolithography process of the ion implantation mask for forming the second subregions 22. As a result, a limit value also exists for the average impurity concentration of the equivalent concentration region 30a formed by the first subregion 21 having the minimum width $x_{1min}$ and the second subregion 22 having the minimum width $x_{2min}$ and adjacent on the inner side of the first subregion 21. Therefore, as described above, the first subregion portions 31 are disposed in the outermost first subregion 21 of the electric field relaxation region 20 and the average impurity concentration of the outermost equivalent concentration region 30a of the electric field relaxation region 20 becomes close to the impurity concentration of the second JTE region 5. Thus, the p-type impurity concentration difference $\Delta n_{p1}$ of the second JTE region 5 and the outermost equivalent concentration region 30a of the electric field relaxation region 20 may be reduced, whereby a decrease of the breakdown voltage consequent to electric field concentration caused by the p-type impurity concentration difference $\Delta n_{p1}$ may be prevented.

As described above, according to the second embodiment, effects identical to those of the first embodiment may be obtained. Further, according to the second embodiment, the first subregion portions having an impurity concentration that is lower than that of the first subregion is disposed in the outermost first region of the electric field relaxation region, whereby the average impurity concentration of the outermost equivalent concentration region of the electric field relaxation region may be made close to the impurity concentration of the second JTE region. Therefore, the impurity concentration distribution of the electric field relaxation region may be made even closer to an impurity concentration distribution substantially equal to the impurity concentration distribution that gradually decreases from the inner side toward the outside. As a result, electric field concentration occurring consequent to the impurity concentration difference near the interface of the electric field relaxation region and the second JTE region may be relaxed.

A structure of the semiconductor device according to a third embodiment will be described. FIGS. 5A and 5B are diagrams depicting a portion of the JTE structure of the semiconductor device according to the third embodiment. FIGS. 5A and 5B depict enlarged views of a planar layout and a cross-sectional view of the electric field relaxation region 20, respectively. The configuration of the semiconductor device according to the third embodiment excluding the electric field relaxation region 20 is the same as that of the semiconductor device according to the first embodiment (FIGS. 1A and 1B). The semiconductor device according to the third embodiment differs from the semiconductor device according to the first embodiment in that in the innermost second subregion 22 (i.e., the second subregion 22 contacting the outer side of the first JTE region 4) of the electric field relaxation region 20, second subregion portions 32 having an impurity concentration that is higher than that of the second subregion 22 are selectively disposed. In other words, the innermost subregion (hereinafter, fourth subregion) 20b of the electric field relaxation region 20 is made up of the second subregion 22 and the second subregion portions 32. Therefore, the average impurity concentration of the fourth subregion 20b is lower than the impurity concentration of the first JTE region 4 and higher than the impurity concentration of the second subregions 22.

In particular, the second subregion portions 32 are arranged at a predetermined interval along the tangential direction Y. The second subregion portions 32 contact the first JTE region 4 adjacent on the inner side and the first subregion 21 adjacent on the outer side. In other words, the fourth subregion 20b is configured by alternately and repeatedly arranging the second subregion 22 and the second subregion portions 32 along the tangential direction Y. The impurity concentration of the second subregion portions 32, for example, is substantially equal to the impurity concentration of the first JTE region 4. The area ratio of the second subregions 22 and the second subregion portions 32 is suitably varied, whereby the average impurity concentration of the fourth subregion 20b may be controlled. As a result, the average impurity concentration of the equivalent concentration region 30b formed by the fourth subregion 20b and the first subregion 21 adjacent on the outer side of the fourth subregion 20b may be made close to the impurity concentration of the first JTE region 4.

For example, between the first JTE region 4 and the innermost equivalent concentration region 30b of the electric field relaxation region 20, the p-type impurity concentration difference $\Delta n_{ph}$ exists, which causes a process limit of the formation process of the second subregions 22 (refer to FIG. 3C). In particular, as described above, the limit value of the width $x_2$ of the second subregions 22 is the minimum width $x_{2min}$ determined by the process limits of the photolithography process of the ion implantation mask for forming the second subregions 22. As a result, a limit value also exists for the average impurity concentration of the equivalent concentration region 30b formed by the second subregion 22 having the minimum width $x_{2min}$ and the first subregion 21 having the maximum width $x_{1max}$ and adjacent on the outer side of the second subregion 22. Therefore, as described above, the second subregion portions 32 are disposed in the innermost second subregion 22 of the electric field relaxation region 20 and the average impurity concentration of the innermost equivalent concentration region 30b of the electric field relaxation region 20 becomes close to the impurity concentration of the first JTE region 4. Thus, the p-type impurity concentration difference $\Delta n_{ph}$ of the first JTE region 4 and the innermost equivalent concentration region 30b of the electric field relaxation region 20 may be reduced, whereby a decrease of the breakdown voltage consequent to electric field concentration caused by the p-type impurity concentration difference $\Delta n_{ph}$ may be prevented.

The second embodiment may be applied to the third embodiment, and the average impurity concentration of the fourth subregion 20b may be controlled together with the average impurity concentration of the outermost subregion (third subregion) of the electric field relaxation region 20.

As described above, according to the third embodiment, effects identical to those of the first embodiment may be obtained. Further, according to the third embodiment, a second subregion portion having an impurity concentration that is higher than that of the second subregion is disposed in the innermost second subregion of the electric field relaxation region, whereby the average impurity concentration of the innermost equivalent concentration region of the electric field relaxation region may be made close to the impurity concentration of the first JTE region. Therefore, the impurity concentration distribution of the electric field relaxation region may be made even closer to an impurity concentration distribution substantially equal to the impurity concentration distribution that gradually decreases from the inner side toward the outside. As a result, electric field concentration occurring consequent to the impurity concentration difference near the interface of the electric field relaxation region and the first JTE region may be relaxed.

Figure 6A:
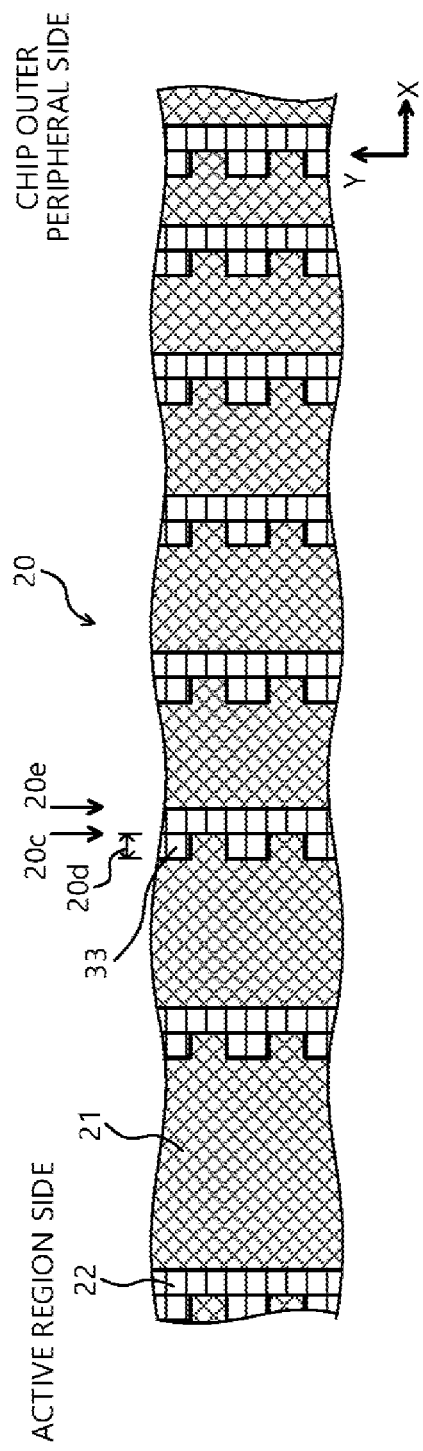
FIGS. 6A, 6B, and 6C are diagrams of a structure of the semiconductor device according to a fourth embodiment.
Figure 6B:
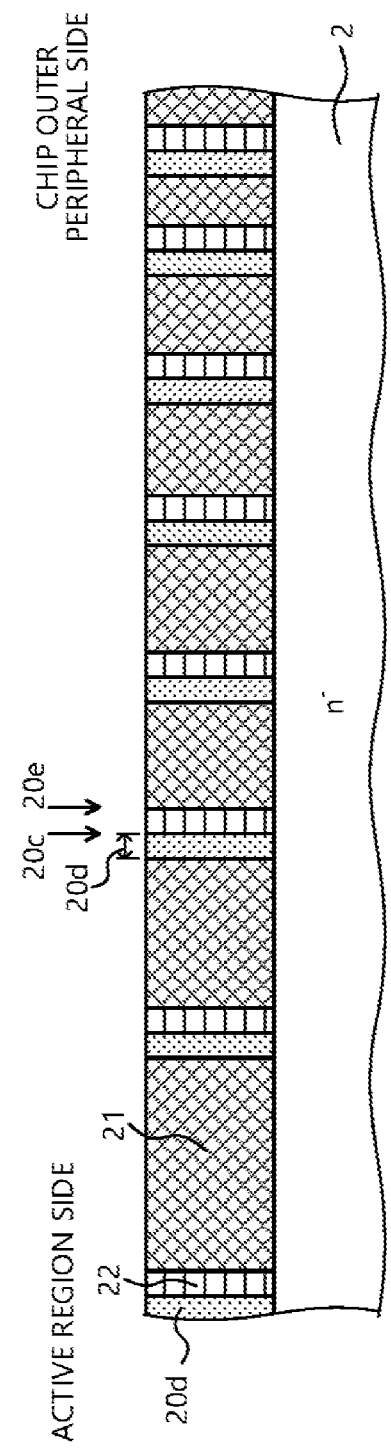
Figure 6C:
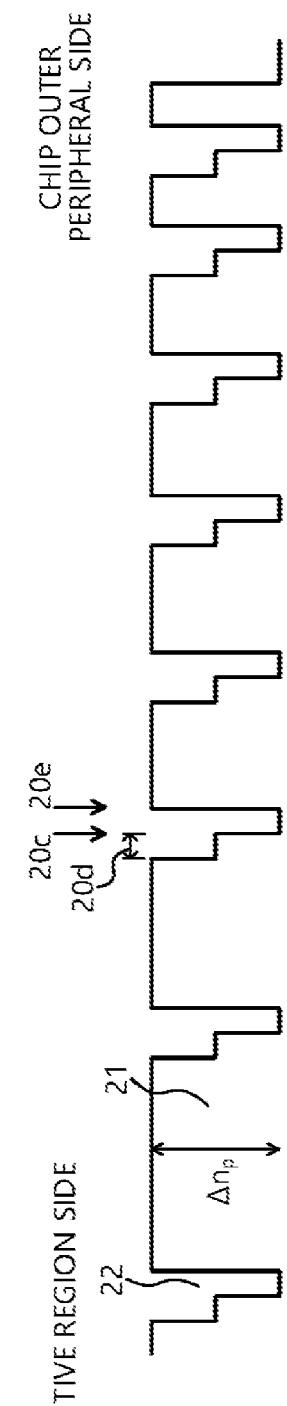

A structure of the semiconductor device according to a fourth embodiment will be described. FIGS. 6A, 6B, and 6C are diagrams of a structure of the semiconductor device according to the fourth embodiment. FIGS. 6A and 6B depict enlarged views of a planar layout and a cross-sectional view of the electric field relaxation region 20, respectively; and FIG. 6C depicts the impurity concentration distribution of the electric field relaxation region 20. The configuration of the semiconductor device according to the fourth embodiment excluding the electric field relaxation region 20 is the same as that of the semiconductor device according to the first embodiment (FIGS. 1A and 1B). The semiconductor device according to the fourth embodiment differs from the semiconductor device according to the first embodiment in that third subregion portions 33 having an impurity concentration that is lower than that of the first subregions 21 are selectively disposed in the first subregions 21, near an interface 20c of the first subregion 21 and the second subregion 22 adjacent on the outer side of the first subregion 21.

In other words, subregions (hereinafter, fifth subregions) 20d formed by the first subregions 21 and the third subregion portions 33 are disposed near the interfaces 20c of the first subregions 21 and the respective second subregions 22 adjacent on the outer side of the first subregions 21. The average impurity concentration of the fifth subregions 20d is lower than the impurity concentration of the first subregions 21 and higher than the impurity concentration of the second subregions 22. In particular, the third subregion portions 33 are arranged at predetermined intervals along the tangential direction Y. The third subregion portions 33 contact the second subregion 22 on the outer side thereof. In other words, the third subregion portions 33 and the first subregion 21, for example, are alternately and repeatedly arranged along the tangential direction Y. The impurity concentration of the third subregion portions 33, for example, is substantially equal to the impurity concentration of the second JTE region 5.

The area ratio of the second subregion 22 and the third subregion portions 331 is suitably varied, whereby the average impurity concentration near the interface 20c of the first subregion 21 and the second subregion 22 adjacent on the outer side of the first subregion 21 is controlled, enabling, for example, an intermediate impurity concentration between the first subregion 21 and the second subregion 22. Therefore, at a portion from the first subregion 21 to the second subregion 22 adjacent on the outer side of the first subregion 21, the p-type impurity concentration difference $\Delta n_p$ (refer to FIG. 6C) occurring between the first subregion 21 and the second subregion 22 may be made to progressively approach the impurity concentration of the second subregion 22 from the impurity concentration of the first subregion 21, from the inner side toward the outside. As a result, at all of the interfaces 20c between the first subregions 21 and the second subregions 22 adjacent on the outer side of the respective first subregions 21, the p-type impurity concentration difference $\Delta n_p$ of the first subregions 21 and the second subregions 22 may be reduced.

In the first subregions 21, near an interface 20e of the first subregions 21 and the second subregions 22 adjacent on the inner side of the respective first subregions 21, fourth subregion portions (not depicted) having an impurity concentration that is lower than that of the first subregions 21 may be selectively disposed. In this case, at portions from the second subregions 22 to the first subregions 21 adjacent on the outer side of the respective second subregions 22, the p-type impurity concentration difference $\Delta n_p$ of the first subregions 21 and the second subregions 22 may be made to progressively approach the impurity concentration of the first subregions 21 from the impurity concentration of the second subregions 22, from the inner side toward the outside. As a result, at the interfaces 20e of the first subregions 21 and the second subregions 22 adjacent on the inner side of the respective first subregions 21, the p-type impurity concentration difference $\Delta n_p$ of the first subregions 21 and the second subregions 22 may be reduced.

The second and/or third embodiments may be applied to the fourth embodiment, and the average impurity concentration of the innermost subregion (fourth subregion) of the electric field relaxation region 20 and/or the average impurity concentration of the outermost subregion (third subregion) of the electric field relaxation region 20 may be controlled.

As described above, according to the fourth embodiment, effects identical to those of the first to third embodiments may be obtained. Further, according to the fourth embodiment, in the first subregions, near the interface with the second subregions, third subregion portions and/or fourth subregion portions having impurity concentrations lower than that of the first subregions are disposed, whereby the impurity concentration distribution of the electric field relaxation region may be made even closer to an impurity concentration distribution substantially equal to the impurity concentration distribution that gradually decreases from the inner side toward the outside.

A structure of the semiconductor device according to a fifth embodiment will be described. FIGS. 7A, 7B, and 7C are diagrams of a structure of the semiconductor device according to the fifth embodiment. FIGS. 7A, 7B, and 7C depict different examples of cross-sectional views of the electric field relaxation region 20. In FIGS. 7A, 7B, and 7C, the left side is the active region 11 side and the right side is the chip end portion (similarly for FIG. 21). The semiconductor device according to the fifth embodiment differs from the semiconductor device according to the first embodiment in that one or more electric field relaxation regions are further disposed outside the second JTE region 5. The impurity concentration distribution of the electric field relaxation regions is an impurity concentration distribution substantially equal to the impurity concentration distribution that gradually decreases from the inner side toward the outside, similar to the first embodiment.

In particular, for example, as depicted in FIG. 7A, one electric field relaxation region (hereinafter, second electric field relaxation region) 41 is further disposed outside the second JTE region 5. The second electric field relaxation region 41 contacts an outer end portion of the second JTE region 5 and surrounds a periphery of the second JTE region 5. The second electric field relaxation region 41 is formed by first subregions 23 and second subregions 24 alternately and repeatedly arranged in a concentric shape surrounding the second JTE region 5. The impurity concentration of the first subregions 23 of the second electric field relaxation region 41, for example, is substantially equal to the impurity concentration of the second JTE region 5. The second subregions 24 of the second electric field relaxation region 41 are n⁻-type regions and the impurity concentration thereof is substantially equal to the impurity concentration of n⁻-type drift layer 2. The average impurity concentration of the second electric field relaxation region 41 is lower than the impurity concentration of the second JTE region 5. The widths and planar layouts of the first and second subregions 23, 24 of the second electric field relaxation region 41 are the same as those of the electric field relaxation region (hereinafter, first electric field relaxation region) 20 arranged between the first JTE region 4 and the second JTE region 5. The configuration of the first electric field relaxation region 20 is the same as that of the electric field relaxation region of the first embodiment.

As depicted in FIG. 7B, a third JTE region (p⁻⁻⁻-type region) 6 may be further disposed outside the second electric field relaxation region 41, i.e., may form a 3-zone JTE structure made up of the first to third JTE regions 4 to 6. The third JTE region 6 contacts an outer end of the second electric field relaxation region 41 and surrounds a periphery of the second electric field relaxation region 41. In this case, the second subregions 24 of the second electric field relaxation region 41 are p-type regions and the impurity concentration thereof, for example, is substantially equal to the impurity concentration of the third JTE region 6. The impurity concentration of the third JTE region 6 is lower than the average impurity concentration of the second electric field relaxation region 41.

As depicted in FIG. 7C, an electric field relaxation region (hereinafter, third electric field relaxation region) 42 may be further disposed outside the third JTE region 6. The third electric field relaxation region 42 contacts an outer end portion of the third JTE region 6 and surrounds a periphery of the third JTE region 6. The third electric field relaxation region 42 is made up of first subregions 25 and second subregions 26 alternately and repeatedly arranged in a concentric shape surrounding the periphery of the third JTE region 6. The impurity concentration of the first subregions 25 of the third electric field relaxation region 42, for example, is substantially equal to the impurity concentration of the third JTE region 6. The second subregions 26 of the third electric field relaxation region 42 are n⁻-type regions and the impurity concentration thereof is substantially equal to the impurity concentration of the n⁻-type drift layer 2. The average impurity concentration of the third electric field relaxation region 42 is lower than the impurity concentration of the third JTE region 6. Widths and the planar layout of the first and second subregions 25, 26 of the third electric field relaxation region 42 are the same as those of the first electric field relaxation region 20.

Although additional alternating and repeated arrangement of the JTE region and the electric field relaxation region outside the third electric field relaxation region 42 further enables the electric field concentration of the JTE structure to be relaxed, corresponding photolithography and ion implantation processes have to be added, whereby cost increases. Therefore, the JTE structure depicted in FIGS. 7A to 7C described above is presumed to be a practical configuration. Further, the second to fourth embodiments may be applied to the fifth embodiment, and the average impurity concentration of the innermost subregion (fourth subregion) of the electric field relaxation regions 20, 41, 42; the average impurity concentration of the outermost subregion (third subregion) of the electric field relaxation regions 20, 41, 42; the average impurity concentration of the subregions (fifth subregion) between the first and second subregions of the electric field relaxation regions 20, 41, 42, etc. may be controlled.

As described above, according to the fifth embodiment, effects identical to those of the first to fourth embodiment may be obtained. Further, according to the fifth embodiment, an electric field relaxation region and JTE region may be further alternately and repeatedly arranged outside the second JTE region, whereby the electric field concentration on the outer side of the second JTE region may be relaxed, enabling the electric field concentration at edge termination structure portion to be further relaxed.

As a method of manufacturing a semiconductor device according to a sixth embodiment, a method of manufacturing the semiconductor device according to the first embodiment will be described with reference to FIGS. 1A and 1B, 8A to 9B. FIGS. 8A, 8B, 9A, and 9B are cross-sectional views of the semiconductor device during manufacture according to the sixth embodiment. FIGS. 8A and 9A are views of the planar layout during manufacture; FIGS. 8B and 9B are cross-sectional views during manufacture. In FIGS. 8A to 9B, the left side is the active region 11 side and the right side is the wafer end portion.

An n$^+$-type silicon carbide substrate (semiconductor wafer) 1 is prepared to have a predetermined thickness and a predetermined impurity concentration. A silicon carbide epitaxial layer forming the n$^-$-type drift layer 2 is epitaxially grown on the front surface of the n$^+$-type silicon carbide substrate 1, whereby an epitaxial wafer (the silicon carbide base 10) is produced. In the edge termination structure portion 12 surrounding the active region 11, the p-type guard ring 3 is selectively formed by photolithography and p-type impurity implantation in the surface layer of the front surface (surface on the n$^-$-type drift layer 2 side) of the silicon carbide base 10, for example, to have a ringed planar shape surrounding a periphery of the active region 11.

As depicted in FIGS. 8A and 8B, a first ion implantation mask 51 having openings for formation regions of the first JTE region 4 and the first subregions 21 is formed in the front surface of the silicon carbide base 10, for example, by a resist material or an oxide film (SiO$_2$). A first ion implantation of implanting a p-type impurity such as aluminum (Al) is performed using the first ion implantation mask 51 as a mask to selectively form in the surface layer of the n$^-$-type drift layer 2, the first JTE region 4 and the first subregions 21, respectively. At this time, the formation regions of the second JTE region 5 and the second subregions 22 are covered by the first ion implantation mask 51 and therefore, the p-type impurity is not implanted. The first ion implantation mask 51 is removed.

As depicted in FIGS. 9A and 9B, a second ion implantation mask 52 having openings for formation regions of the first and second JTE regions 4, 5 and the first and second subregions 21, 22 is formed in the surface of the n$^-$-type drift layer 2, for example, by a resist material or an oxide film. A second ion implantation of implanting a p-type impurity such as aluminum is performed using the second ion implantation mask 52 as a mask to selectively form the second JTE region 5 and the second subregions 22 in the surface layer of the n$^-$-type drift layer 2. Further, the impurity concentration of the first JTE region 4 and the first subregions 21 already formed is increased by this second ion implantation.

In this manner, the formation regions of the second subregions 22 are covered by the first ion implantation mask 51, enabling the first and second subregions 21, 22 to be formed easily. Further, two ion implantation sessions (first and second ion implantations) enable formation of the JTE structure having a 2-layer structure (first and second JTE regions 4, 5) by which the impurity concentration decreases in two steps and formation of the electric field relaxation region 20 including the first and second subregions 21, 22 having differing impurity concentrations and arranged in a predetermined planar layout. In other words, the electric field relaxation region 20 is formed having an average impurity concentration distribution that decreases by a constant rate from the active region 11 side toward the outside.

The second ion implantation mask 52 is removed and thereafter, ordinary manufacturing processes (e.g., formation of the interlayer insulating film 7, the anode electrode 8, and the cathode electrode 9) are performed. Thereafter, semiconductor wafer is cut into chips (diced), whereby the SBD depicted in FIGS. 1A and 1B is completed.

In the method of manufacturing a semiconductor device according to the sixth embodiment, the planar layout of the first and second subregions configuring the electric field relaxation region 20 may be changed variously by the pattern of the first ion implantation mask 51. In other words, the second and fourth embodiments may be applied to the sixth embodiment to form the first subregion portions 31 (refer to FIGS. 4A and 4B) having substantially the same impurity concentration as the second JTE region 5, the third subregion portions 33 (refer to FIGS. 6A to 6C), the fourth subregion portions (not depicted) and thereby enable the semiconductor device according to the second and fourth embodiments to be produced. Further, the third embodiment may be applied to the sixth embodiment to form the second subregion portions 32 (refer to FIGS. 5A and 5B) having substantially the same impurity concentration as the first JTE region 4 and thereby enable the semiconductor device according to the third embodiment to be produced.

As described above, according to the sixth embodiment, effects identical to those of the first to fifth embodiments may be obtained.

Figure 10:
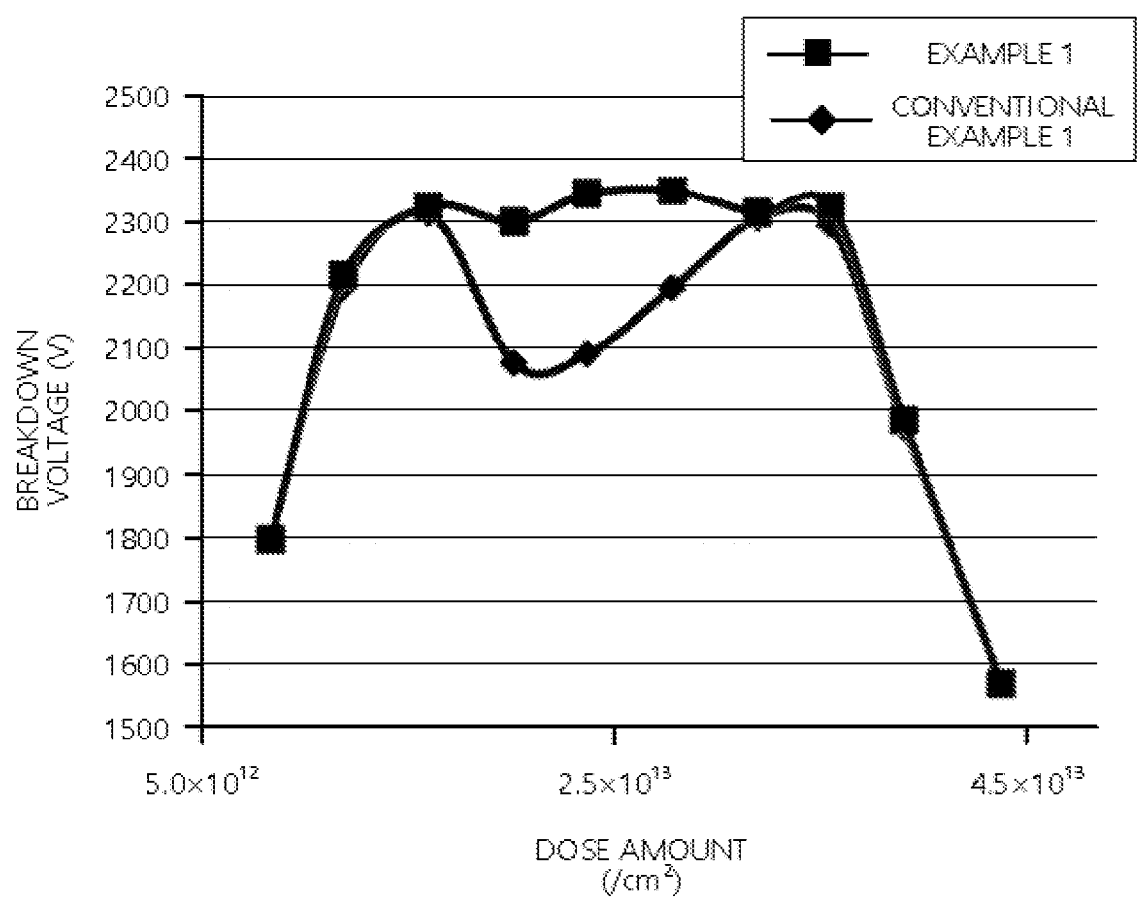
FIG. 10 is a characteristics diagram depicting breakdown voltage characteristics of an edge termination structure portion of a semiconductor device according to example 1.
Figure 15A:
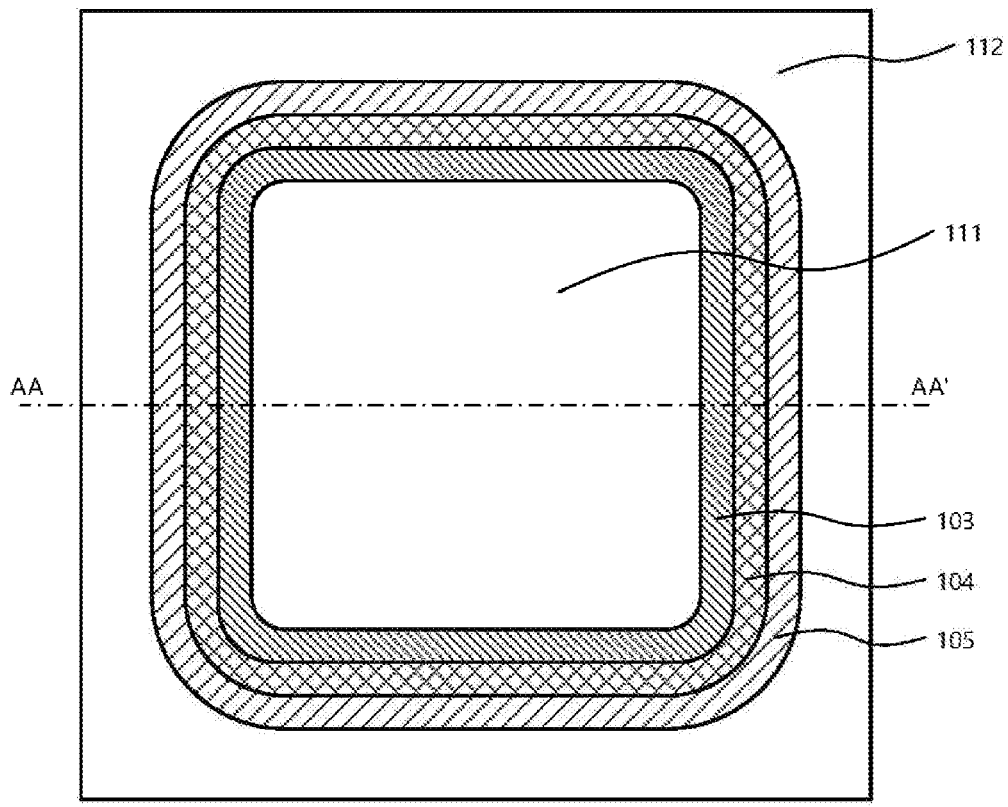
FIGS. 15A and 15B are explanatory views of a conventional SiC-SBD structure.
Figure 15B:
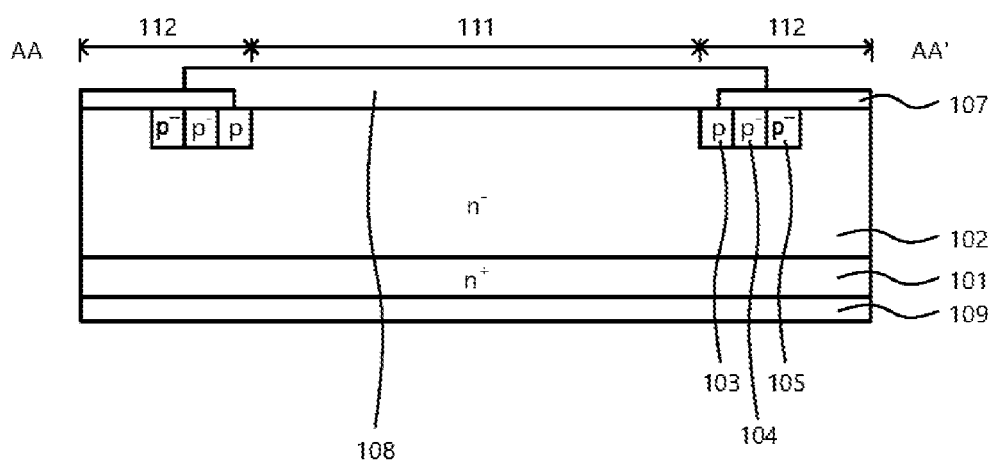

Example 1 will be described. Verification concerning the breakdown voltage of the edge termination structure portion 12 was performed. FIG. 10 is a characteristics diagram depicting breakdown voltage characteristics of the edge termination structure portion of a semiconductor device according to example 1. The horizontal axis in FIG. 10 represents dose volume of the first ion implantation for forming the first JTE region 4 and the vertical axis represents breakdown voltage of the edge termination structure portion 12. A SiC-SBD (refer to FIGS. 1A, 1B, 2A, and 2B) including the electric field relaxation region 20 between the first and second JTE regions 4, 5 configuring the 2-layer JTE structure was produced according to the method of manufacturing a semiconductor device according to the sixth embodiment (hereinafter, example 1). In example 1, the impurity concentration ratio of the first JTE region 4 and the second JTE region 5 was fixed to be 1:0.5 while the dose amount of aluminum in the first ion implantation for forming the first JTE region 4 was varied to produce multiple samples, the breakdown voltages of which were measured. The results are depicted in FIG. 10. FIG. 10 further depicts, for comparison, the breakdown voltage of a SiC-SBD (refer to FIGS. 15A and 15B, hereinafter, conventional example 1) made up of a conventional JTE structure in which the electric field relaxation region 20 is not disposed. The configuration of the conventional example 1, in which the electric field relaxation region 20 is not included, is the same as example 1.

From the results depicted in FIG. 10, it was confirmed that in conventional example 1, the breakdown voltage decreases consequent to the impurity concentration (dose amount of first ion implantation) of the first JTE region 4 in some cases. On the other hand, in example 1, it was confirmed that the breakdown voltage was substantially constant irrespective of the impurity concentration of the first JTE region 4 and the breakdown voltage decline occurring in conventional example 1 was improved. The greatest breakdown voltage of the semiconductor device was determined by the breakdown voltage outside the JTE structure in the edge termination structure portion 12. In example 1, the electric field relaxation region 20 is disposed, whereby it is presumed that the electric field between the first JTE region 4 and the second JTE region 5 is relaxed and the point of electric field concentration is distributed and consequently, the breakdown voltage decline does not occur.

Figure 16A:
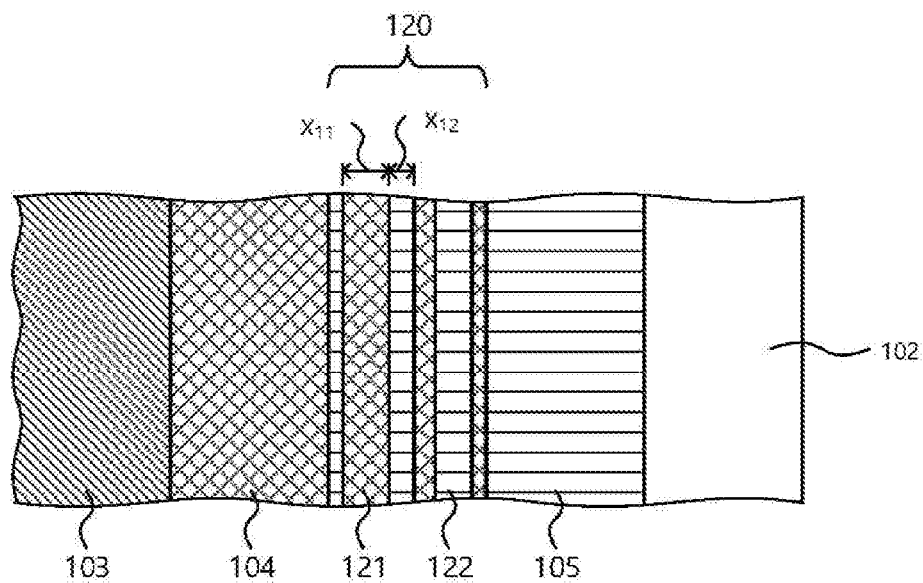
FIGS. 16A and 16B are explanatory views of another example of a conventional SiC-SBD structure.
Figure 16B:
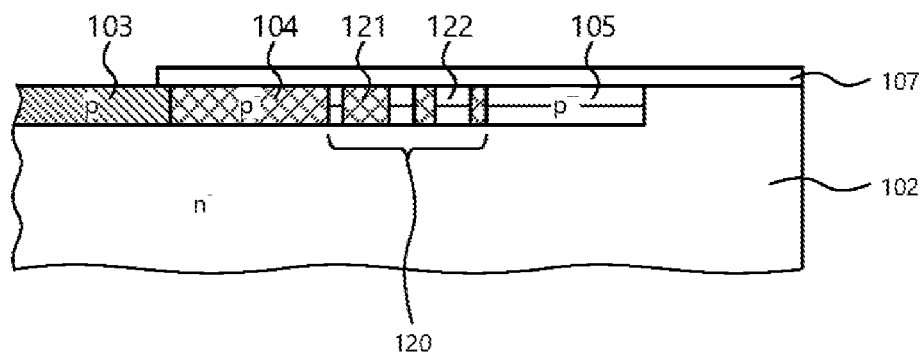
Figure 17A:
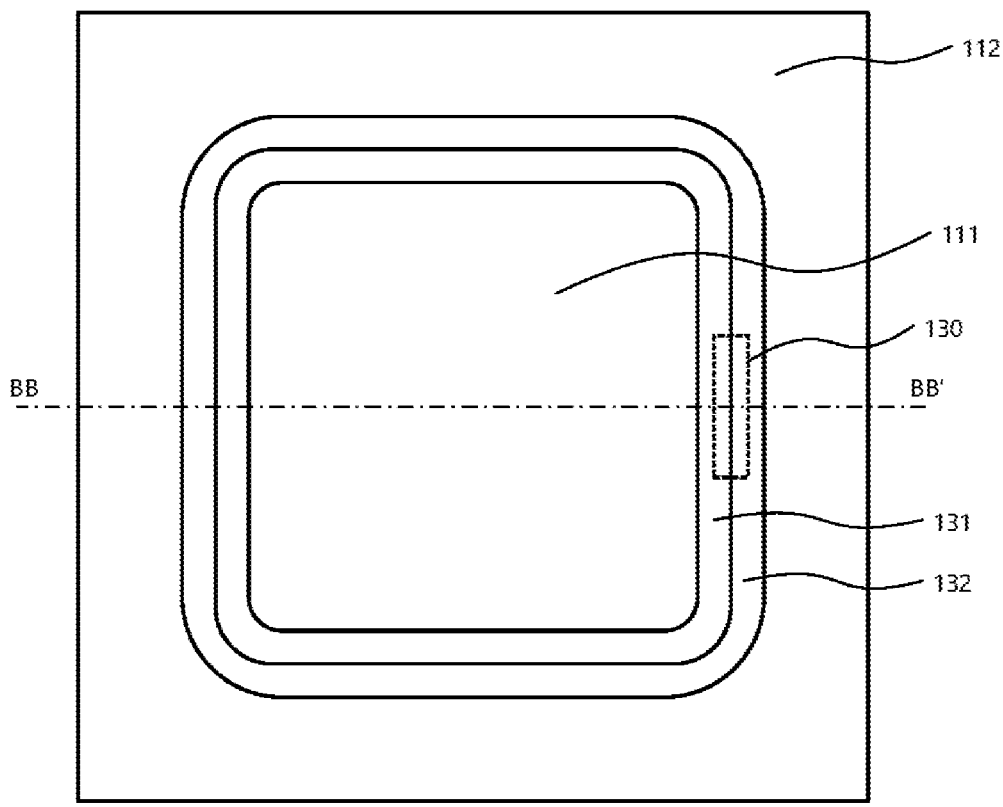
FIGS. 17A and 17B are diagrams of another example of a conventional SiC-SBD structure.
Figure 17B:
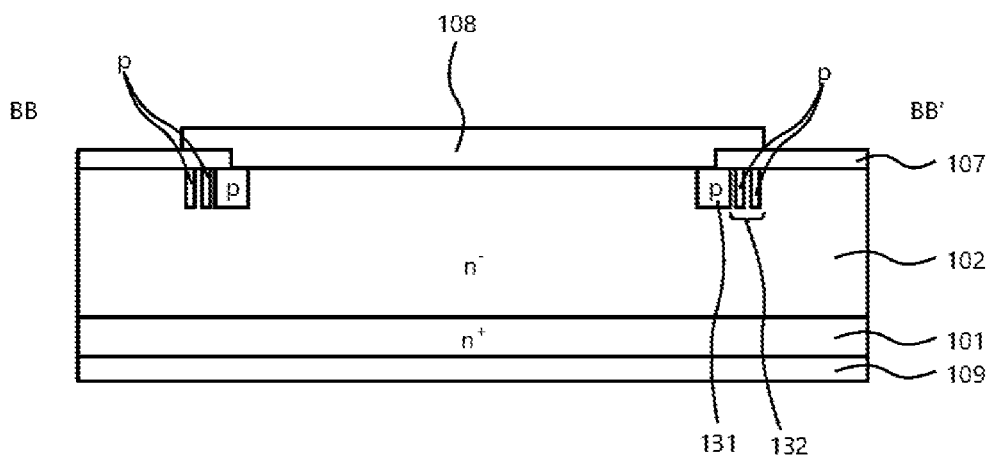
Figure 18:
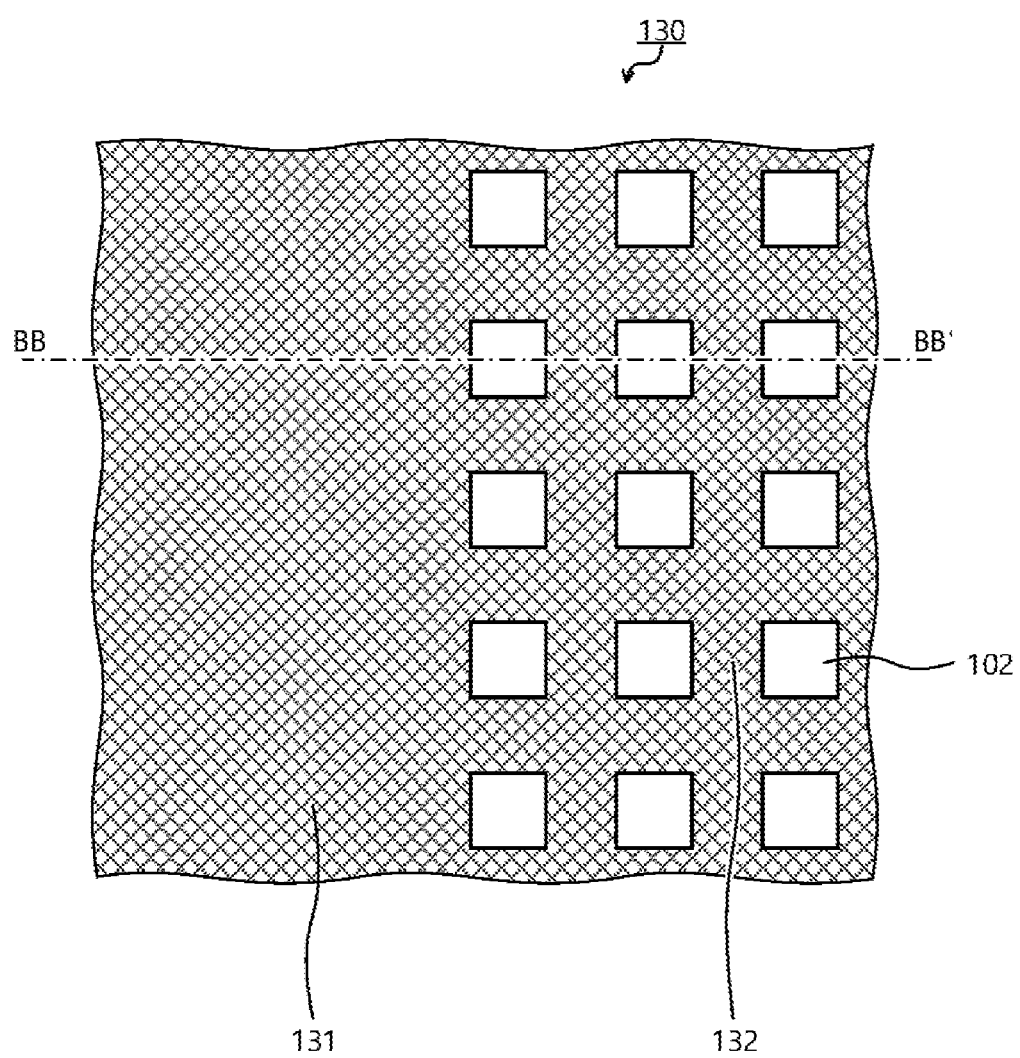
FIG. 18 is an enlarged plan view of a principal part depicted in FIG. 17A.

Example 2 will be described. Verification concerning edge length (width of the edge termination structure portion 12) was performed. FIGS. 11A, 11B, and 11C are plan views of a planar layout of the JTE structure of a semiconductor device according to example 2. FIG. 11A depicts the JTE structure of a SiC-SBD having the configuration of the first embodiment (refer to FIGS. 1A and 1B) (hereinafter, example 2); FIGS. 11B and 11C depict a JTE structure (hereinafter, conventional examples 2, 3) of a conventional SiC-SBD (refer to FIGS. 16A and 16B). Example 2 includes the electric field relaxation region 20 between the first JTE region 4 and the second JTE region 5. The electric field relaxation region 20 of example 2 is made up of the first subregions 21 (the width $x_1$ of which is smaller the farther outward the first subregion 21 is arranged) and the second subregions 22 (the width $x_2$ of which is constant, irrespective of arrangement position), the first subregions 21 and the second subregions 22 being alternately and repeatedly arranged.

Conventional examples 2, 3 include the electric field relaxation region 120 between the first JTE region 104 and the second JTE region 105. The electric field relaxation region 120 of conventional example 2 is made up of first subregions 121 (the width $x_{11}$ of which is constant, irrespective of arrangement position) and second subregions 122 (the width $x_{12}$ of which is greater the farther outward the second subregion 122 is arranged), the first subregions 121 and the second subregions 122 being alternately and repeatedly arranged (corresponds to FIG. 10 of International Publication No. 2012/049872). The electric field relaxation region 120 of conventional example 3 is made up of the first subregions 121 (the width $x_{11}$ of which is smaller the farther outward the first subregion 121 is arranged) and the second subregions 122 (the width $x_{12}$ of which is greater the farther outward the second subregion 122 is arranged), the first subregions 121 and the second subregions 122 being alternately and repeatedly arranged (corresponds to FIG. 11 of International Publication No. 2012/049872). Example 2 and conventional examples 2, 3 each arrange four first subregions and four second subregions.

As depicted in FIGS. 11A to 11C, regions having widths that are greater the farther outward the region is arranged do not exist in the electric field relaxation region 20 of example 2 as in conventional examples 2, 3. As a result, compared to conventional examples 2, 3, the width of the electric field relaxation region 20 in example 2 is smaller, enabling the edge length to be decreased. Therefore, in the present invention, it was confirmed that disposal of the electric field relaxation region 20 in the edge termination structure portion 12 enables expansion of the edge length to be suppressed to the minimum and increases in cost to be suppressed.

Figure 12:
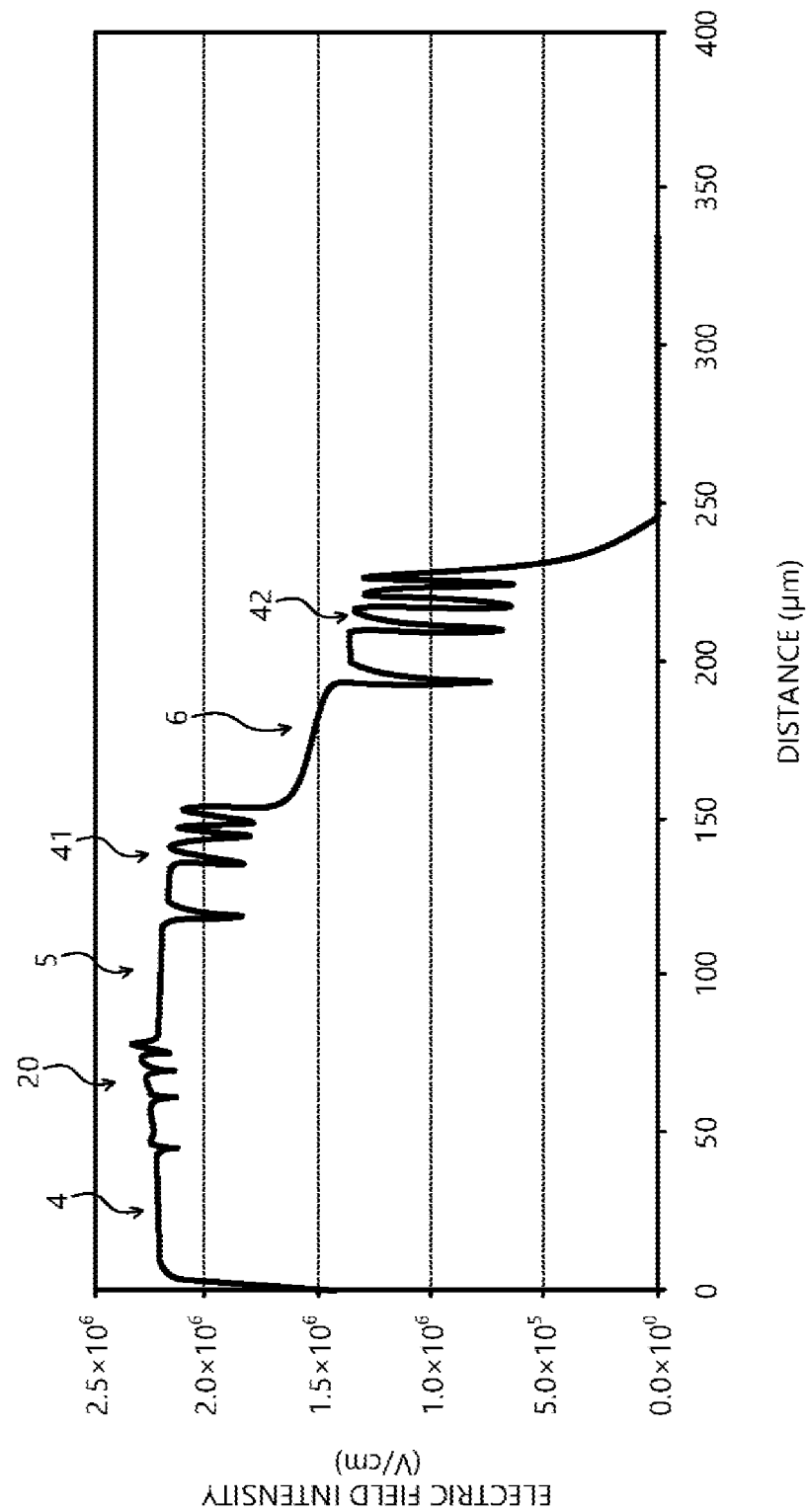
FIG. 12 is a characteristics diagram depicting electric field strength distribution of the semiconductor device according to example 2.
Figure 13:
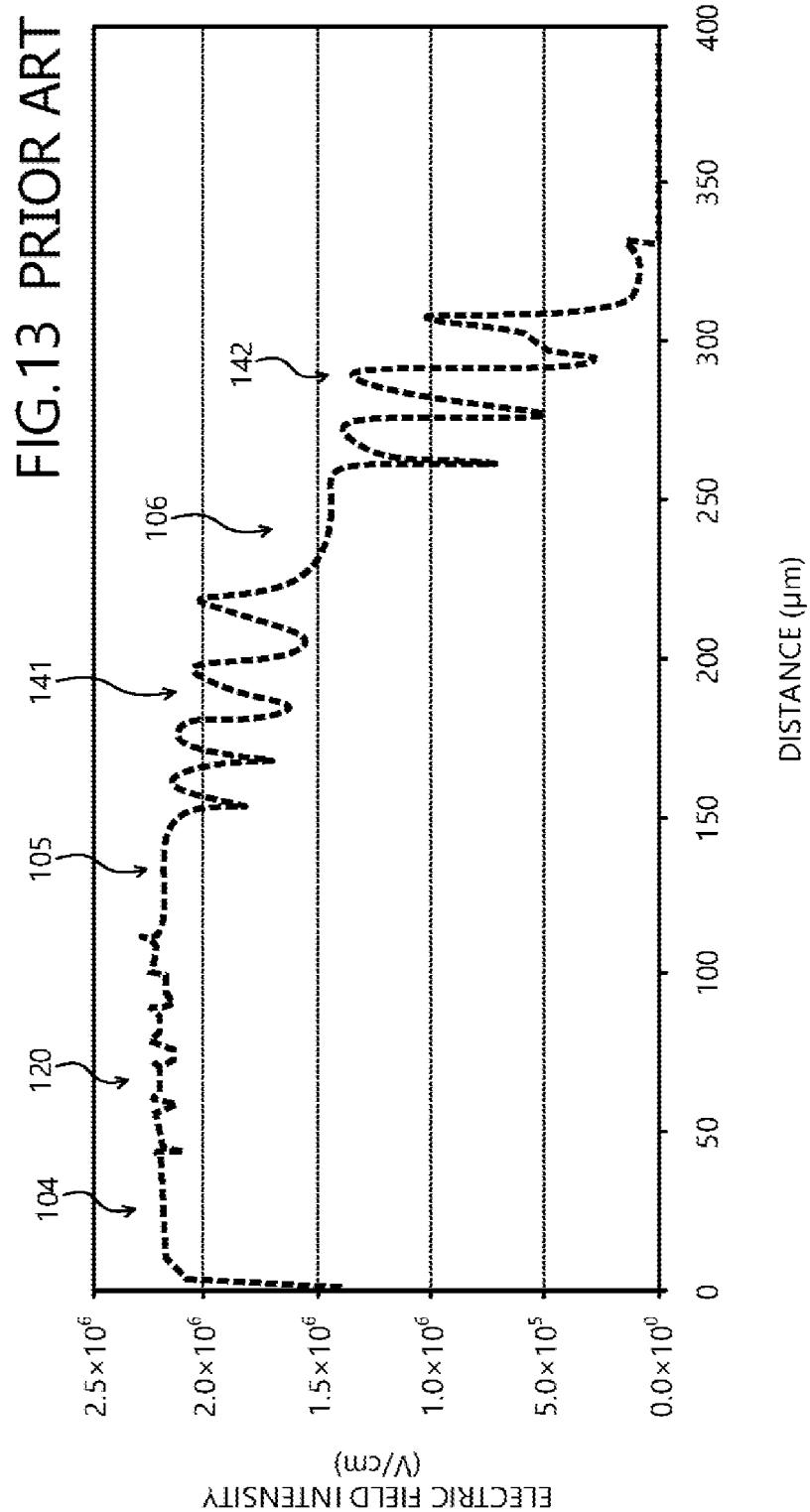
FIG. 13 is a characteristics diagram depicting electric field strength distribution of a semiconductor device according to conventional example 2.
Figure 14:
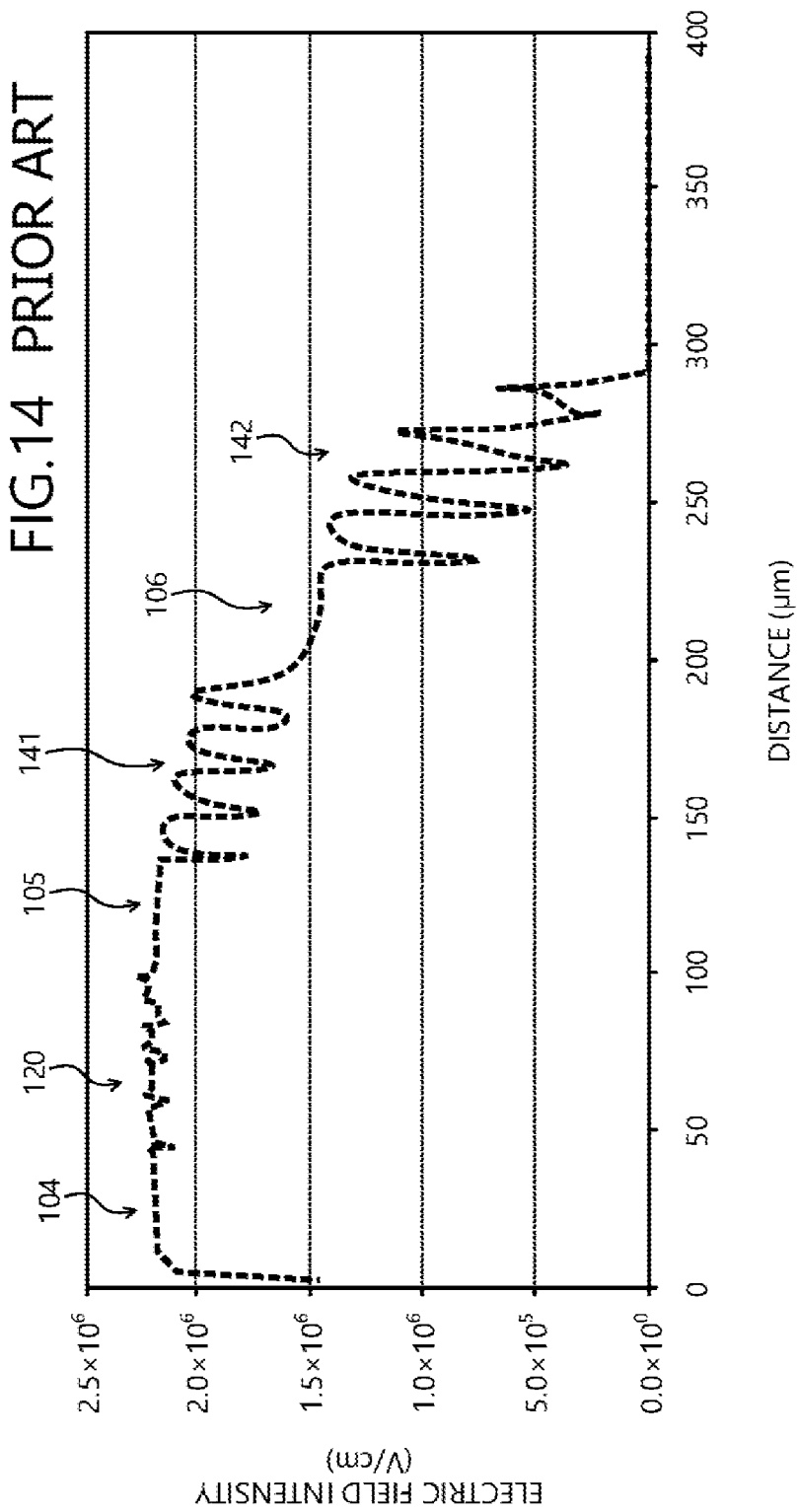
FIG. 14 is a characteristics diagram depicting electric field strength distribution of a semiconductor device according to conventional example 3.

Verification concerning the breakdown voltage and electric field strength distribution of the edge termination structure portion 12 having the 3-zone JTE structure was performed. FIG. 12 is a characteristics diagram depicting the electric field strength distribution of the semiconductor device according to example 2. FIG. 13 is a characteristics diagram depicting the electric field strength distribution of the semiconductor device according to conventional example 2. FIG. 14 is a characteristics diagram depicting the electric field strength distribution of the semiconductor device according to conventional example 3. The horizontal axis in FIGS. 12 to 14 represents the distance in a direction from the interface (0 μm) of the p-type guard ring and first JTE region toward the outside, and the vertical axis represents the electric field strength. At a depth 1 μm from the base front surface, the electric field strength of a portion indicating the maximum electric field strength is calculated (similarly in FIGS. 25, 43). The electric field strength distribution of the edge termination structure portion 12 when the electric field relaxation region 20 of example 2 is applied to the first to third electric field relaxation regions 20, 41, 42 (refer to FIG. 7C) of the 3-zone JTE structure is depicted in FIG. 12. The electric field strength distributions of the edge termination structure portions 112 when the electric field relaxation regions 120 of conventional examples 2, 3 are respectively applied to the first to third electric field relaxation regions 120, 141, 142 (refer to FIG. 19) of the 3-zone JTE structure are depicted in FIGS. 13 and 14, respectively.

FIGS. 12 to 14 respectively depict the results of simulating the electric field strength distribution of the edge termination structure portions 12, 112 at the time of reverse recovery when a constant voltage 3300V is applied to the 3-zone JTE structure SiC-SBD to which example 2 and conventional examples 2, 3 were applied. In example 2, the thickness and impurity concentration of the n⁻-type drift layer 2 were 30 μm and $3 \times 10^{15}/cm^3$, respectively. The impurity concentration ratio of the first to third JTE regions 4 to 6 was the first JTE region 4:the second JTE region 5:the third JTE region 6=1:0.6:0.4. The dose amounts of the first to third JTE regions 4 to 6 were $2.1 \times 10^{13}/cm^2$, $1.26 \times 10^{13}/cm^2$, and $0.84 \times 10^{13}/cm^2$, respectively. The configuration of the first to third JTE regions 104 to 106 of conventional examples 2, 3 was the same as that of the first to third JTE regions 4 to 6 of example 2.

The breakdown voltages of the SiC-SBD of the 3-zone JTE structure to which example 2 and conventional examples 2, 3 were applied were each calculated. According to the results, the breakdown voltage of example 2 was 4253V and it was confirmed that even when the width of the electric field relaxation region 20 was made small compared to conventional examples 2, 3, about the same breakdown voltage as in conventional example 2 (breakdown voltage 4252V) and conventional example 3 (breakdown voltage 4234V) was obtained. Further, as depicted in FIG. 12, in example 2, it was confirmed that electric field concentration between adjacent JTE regions (the first to third electric field relaxation region 20, 41, 42) among the first to third JTE regions 4 to 6 was relaxed similar to conventional examples 2, 3 (FIGS. 13, 14). From these results, it was confirmed that even in the edge termination structure portion 12 for which the edge length is reduced using the electric field relaxation region 20 having the configuration of the present invention, the same breakdown voltage as that of the conventional edge termination structure portion 112 is obtained and the electric field strength distribution of the edge termination structure portion 12 is also favorable.

A structure of the semiconductor device according to a seventh embodiment will be described. FIGS. 20A, 20B, and 20C are diagrams of a structure of the semiconductor device according to the seventh embodiment. FIGS. 20A, 20B, and 20C depict enlarged views of a portion of the JTE structure of FIGS. 1A and 1B. FIGS. 20A and 20B depict a planar layout and a cross-sectional view of the electric field relaxation region 20, respectively. FIG. 20C depicts the impurity concentration distribution of the electric field relaxation region 20. In the semiconductor device according to the seventh embodiment, the recursive pitch of the first and second subregions 21, 22 of the electric field relaxation region 20 differs from that of the semiconductor device according to the first embodiment. The impurity concentrations of the first and second subregions 21, 22; the arrangement of the electric field relaxation region 20; the average impurity concentration difference of the first and second JTE regions 4, 5 adjacent to the electric field relaxation region 20; and the configuration of the active region 11 are the same as those of the first embodiment.

In particular, the semiconductor device according to the seventh embodiment differs from the semiconductor device according to the first embodiment in the following two ways. First, the semiconductor device according to the seventh embodiment includes the electric field relaxation region 20 that is made up of multiple single sections (here, for example, four sections 61 to 64) that are arranged adjacently to each other and include one or more of the equivalent concentration regions 30 (microregions including one combination of a first subregion 21 and an adjacent second subregion 22) cyclically arranged therein. For example, FIGS. 20A to 20C depict the electric field relaxation region 20 in which two of the equivalent concentration regions 30 are arranged in the first section 61; three of the equivalent concentration regions 30 are arranged in the second section 62; four of the equivalent concentration regions 30 are arranged in the third section 63; and six of the equivalent concentration regions 30 are arranged in the fourth section 64. Double headed arrows from the active region side to the chip outer peripheral side (horizontal direction) depicted in FIG. 20C each indicates an equivalent concentration region 30.

The semiconductor device according to the seventh embodiment further differs from the semiconductor device according to the first embodiment in that for each of the sections 61 to 64, the width $x_1$ of the first subregion 21 changes and the width $x_1$ of the first subregion 21 is smaller the farther outward the section 62 to 64 is arranged. In other words, the first subregions 21 arranged in a single section all have the same the width $x_1$, and among the first subregions 21 arranged in the sections 61 to 64, the width $x_1$ of the first subregions 21 of the first section 61 is the greatest and the width $x_1$ of the first subregions 21 of the fourth section 64 is the smallest. Disposal of the second subregions 22 to have about the width $x_2$ irrespective of arrangement position is the same as the first embodiment. On other words, the farther outward the section 61 to 64 is arranged, the lower the average impurity concentration is and the average impurity concentration distribution (slope) of the electric field relaxation region 20 decreases in four steps from the inner side toward the outside.

The combination of the widths $x_1$, $x_2$ of the first and second subregions 21, 22 determining the average impurity concentration $N_p$ of the equivalent concentration region may be set such that the width $x_1$ of the first subregions 21 of the fourth section 64 having the lowest average impurity concentration is as close as possible to the minimum size determined by process limits of ion implantation. In other words, by determining the widths $x_1$ of the first subregions 21 of the first to fourth sections 61 to 64 such that the width $x_1$ of the first subregions 21 of the fourth section 64 become the process limit, the average impurity concentration of the equivalent concentration regions 30 of the first to fourth sections 61 to 64 is determined. The number of the equivalent concentration regions 30 arranged in each of the first to fourth sections 61 to 64 is determined by cyclic combinations of the equivalent concentration regions 30 of the first to fourth sections 61 to 64.

In this manner, since the equivalent concentration regions 30 arranged in the same section all have the same configuration, the average impurity concentration of each of the sections 61 to 64 each becomes that same as the average impurity concentration $N_p$ (refer to equation 3) of the equivalent concentration regions 30 therein. However, the respective impurity concentration slopes in the sections 61 to 64 becomes gradual. As a result, in the sections 61 to 64, electric field concentration at the interface of the first subregions 21 and the second subregions 22 is relaxed. The reason for this is as follows. In making the impurity concentration slope of one of the equivalent concentration regions 30 gradual, the width ($=x_1+x_2$) of the equivalent concentration region 30 is required to a certain extent. For example, when the edge termination structure portion 12 is designed to be rated for a 3300V breakdown voltage, the width of the equivalent concentration region 30 has to be above 10 μm or more and 20 μm or less. The widths of the equivalent concentration regions 30 become smaller the farther outward the equivalent concentration region 30 is arranged and therefore, it becomes difficult to make the impurity concentration slope gradual the farther outward the equivalent concentration region 30 is arranged. For example, the equivalent concentration region 30 is assumed where the width $x_1$ of the first subregions 21 is assumed to be about 10 μm and the width $x_2$ of the second subregions 22 is assumed to be the smallest size (about 1 μm to 2 μm) determined by the process limits of the ion implantation process. For an equivalent concentration region 30 of this size, when charge is applied, the concentration of electric field at the interface of one combination of a first subregion 21 and an adjacent second subregion 22 configuring the equivalent concentration region 30 was confirmed through simulation by the inventor. In the seventh embodiment, as described above, the equivalent concentration regions 30 arranged in the same section all have the same configuration, whereby the average impurity concentrations in the sections 61 to 64 may each be about constant. In other words, the average impurity concentration distribution of the electric field relaxation region 20 can make the equivalent concentration region 30 having a large width corresponding to one section have an average impurity concentration distribution equivalent to the number of sections (i.e., 4) into which the electric field relaxation region 20 is arranged (indicated by dotted line in FIG. 20C). In this case, although the average impurity concentration distribution of the electric field relaxation region 20 decreases stepwise at the interfaces of adjacent sections 61 to 64, the impurity concentration difference between the equivalent concentration regions 30 of differing average impurity concentrations is set so as to gradually decrease from the inner side toward the outside, similar to the first embodiment. Therefore, the electric field strength distribution of the electric field relaxation region 20 becomes an impurity concentration distribution that gradually decreases from the inner side toward the outside.

Figure 21:
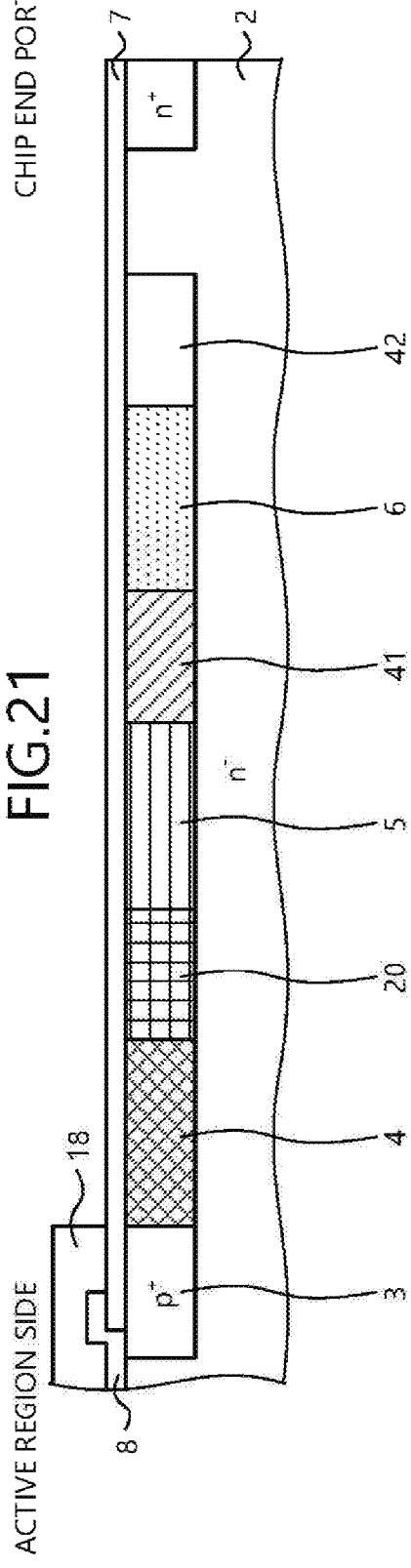
FIG. 21 is a cross-sectional view of another example of a structure of the semiconductor device according to the seventh embodiment.

In this manner, in the electric field relaxation region 20, the first and second subregions 21, 22 are alternately and repeatedly arranged at a recursive pitch that differs according to the section 61 to 64, so as to surround the inner JTE region in a concentric shape and satisfy a predetermined average impurity concentration difference between the adjacent first and second JTE regions 4, 5. The electric field relaxation region 20, for example, is applicable to the electric field relaxation regions arranged in a 3-zone JTE structure. FIG. 21 is a cross-sectional view of another example of a structure of the semiconductor device according to the seventh embodiment. FIG. 21 depicts a case where the first to third electric field relaxation regions 20, 41, 42 are arranged, similar to the fifth embodiment (refer to FIG. 7C). Arrangement of the first to third electric field relaxation regions 20, 41, 42 and the average impurity concentration difference with the adjacent JTE regions are the same as those in the fifth embodiment.

In this case, configuration of the first and second subregions 21, 22 of the first electric field relaxation region 20 arranged between the first and second JTE regions 4, 5 is the same as the electric field relaxation region 20 described above (refer to FIGS. 20A to 20C). Further, in the first and second subregions (not depicted) of the first and second electric field relaxation regions 41, 42, the cyclic combinations of the equivalent concentration region 30 of the sections 61 to 64 may be determined so as to satisfy a predetermined average impurity concentration of the second and third electric field relaxation regions 41, 42, similar to the first electric field relaxation region 20. In other words, the first to third electric field relaxation regions 20, 41, 42 have the same structure. As a result, even in the second and third electric field relaxation regions 41, 42, an effect may be obtained in that electric field concentration between the first and second subregions is relaxed and electric field distribution of the second and third electric field relaxation regions 41, 42 becomes more gradual.

The method of manufacturing a semiconductor device according to the seventh embodiment may be realized by patterning of an ion implantation mask for the planar layout of the first and second subregions 21, 22 in the sections 61 to 64 of the electric field relaxation regions 20, 41, 42 in the method of manufacturing a semiconductor device according to the sixth embodiment.

Figure 22A:
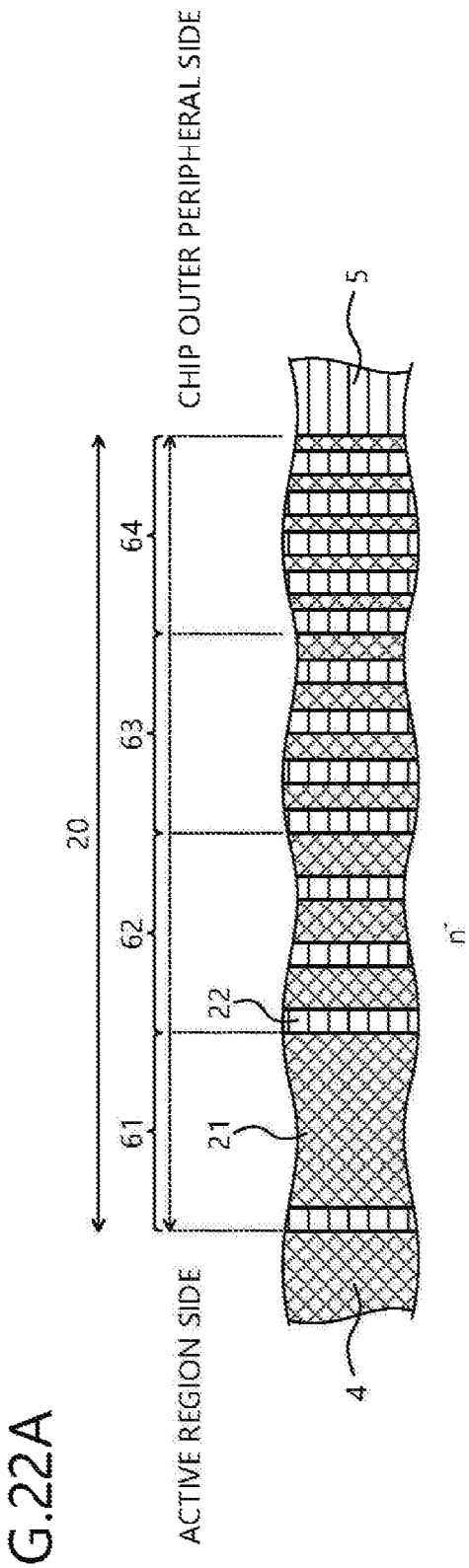
Figure 23B:
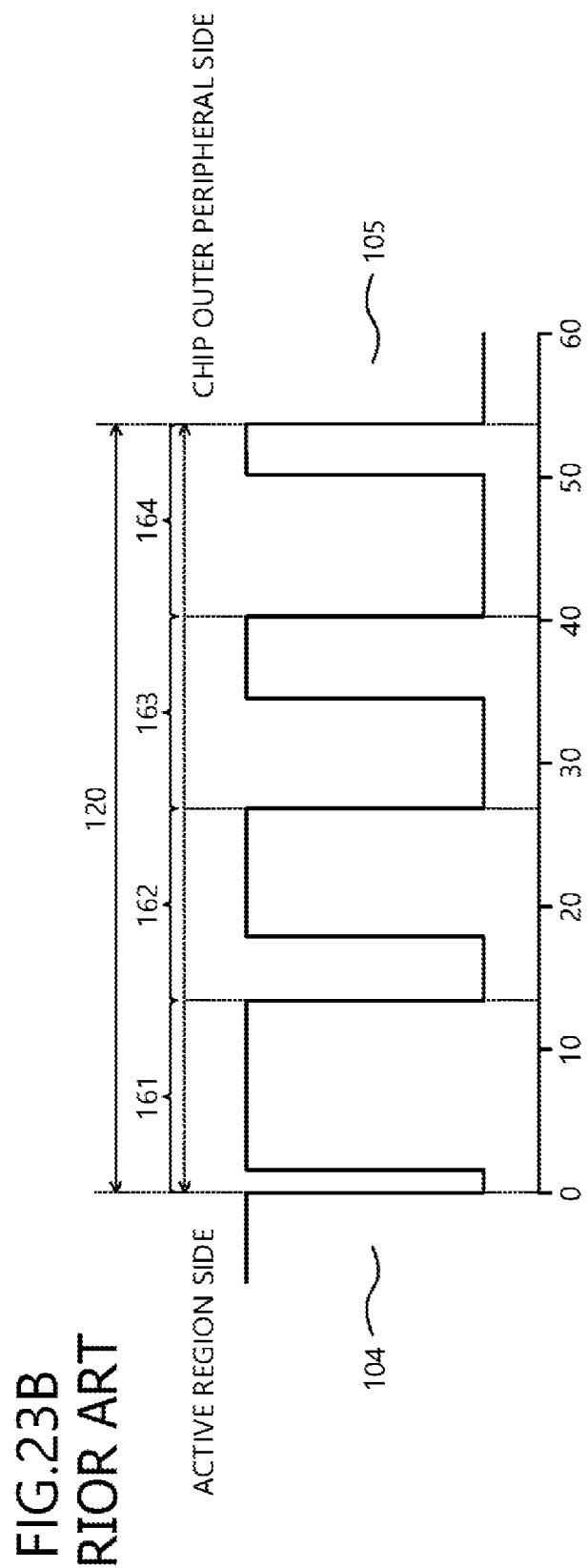
Figure 24:
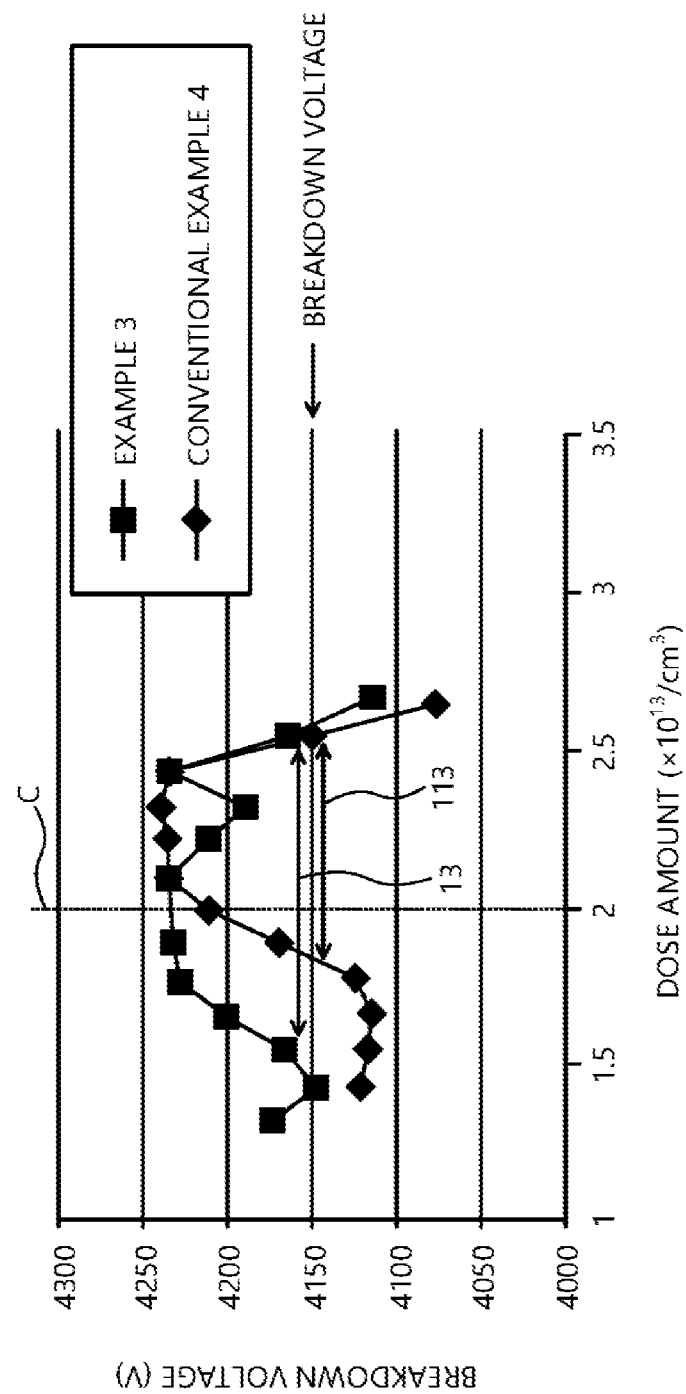
FIG. 24 is a characteristics diagram depicting breakdown voltage characteristics of an edge termination structure portion of the semiconductor device according to example 3.

Example 3 will be described. Verification concerning the breakdown voltage of the edge termination structure portion 12 of the semiconductor device according to the seventh embodiment was performed. FIGS. 22A and 22B are diagrams depicting a portion of the JTE structure of a semiconductor device according to example 3. FIGS. 23A and 23B are diagrams depicting a portion of the JTE structure of a semiconductor device according to conventional example 4. FIGS. 22A to 23B depict a planar layout and the impurity concentration distribution of the electric field relaxation regions 20, 120, respectively. FIG. 24 is a characteristics diagram depicting breakdown voltage characteristics of the edge termination structure portion of the semiconductor device according to example 3. FIG. 24 depicts simulation results of the breakdown voltage of the edge termination structure portion 12 when the electric field relaxation region 20 of example 3 depicted in FIGS. 22A and 22B is applied to the first to third electric field relaxation regions 20, 41, 42 (refer to FIG. 21) disposed in the 3-zone JTE structure. Further, FIG. 24 depicts, for comparison, simulation results of the breakdown voltage of the edge termination structure portion 112 when the electric field relaxation region 120 of conventional example 4 depicted in FIGS. 23A and 23B is applied to the first to third electric field relaxation regions 120, 141, 142 (refer to FIG. 19) disposed in a conventional 3-zone JTE structure. The horizontal axis in FIG. 24 represents dose amount of the first ion implantation for forming the first JTE regions 4, 104 and the vertical axis represents the breakdown voltage of the edge termination structure portions 12, 112. In other words, FIG. 24 depicts the dependency of the breakdown voltage of the edge termination structure portions 12, 112 on variation of the dose amount of the ion implantation for forming the first JTE regions 4, 104.

The first electric field relaxation region 20 of example 3 corresponds to the electric field relaxation region 20 (FIGS. 20A to 20C) the semiconductor device according to the seventh embodiment and is sectioned into the first to fourth sections 61 to 64. The width $x_1$ of the first subregion 21 configuring the first section 61 was 11 µm. The width $x_1$ of the first subregions 21 configuring the second section 62 was 3.3 µm. The width $x_1$ of the first subregions 21 configuring the third section 63 was 1.6 µm. The width $x_1$ of the first subregions 21 configuring the fourth section 64 was 1.0 µm. The width $x_2$ of the second subregions 22 was the same as that for the first to fourth sections 61 to 64, 1.8 µm. The average impurity concentration (average impurity concentration of the equivalent concentration region 30) ratio of the first to fourth sections 61 to 64 was the first section 61:the second section 62:the third section 63:the fourth section 64=0.86:0.65:0.47:0.36, assuming the ratio of the impurity concentration of the first JTE region 4 to be 1 and the ratio of the impurity concentration of the second JTE region 5 to be 0. The cyclic arrangement of the equivalent concentration region 30 of the sections 61 to 64 is as follows. One of the equivalent concentration regions 30 was arranged in the first section 61 (1 cycle). Three of the equivalent concentration regions 30 were arranged in the second section 62 (3 cycles). Four of the equivalent concentration regions 30 were arranged in the third section 63 (4 cycles). Five of the equivalent concentration regions 30 were arranged in the fourth section 64 (5 cycles). In other words, the total width of the first electric field relaxation region 20 is 55.7 µm(=120.8 µm×1 cycle+5.1 µm×3 cycles+3.4 µm×4 cycles+2.8 µm×5 cycles). The configuration of the second and third electric field relaxation regions 41, 42 is the same as that of the first electric field relaxation region 20. The average impurity concentration ratio of the first to fourth sections 61 to 64 in the second electric field relaxation region 41 is a ratio when the ratio of the impurity concentration of the second JTE region 5 is 1 and ratio of the impurity concentration of the third JTE region 6 is 0. The average impurity concentration ratio of the first to fourth sections 61 to 64 in the third electric field relaxation region 42 is a ratio when the ratio of the impurity concentration of the third JTE region 6 is 1 and the ratio of the impurity concentration of the n$^-$-type drift layer 2 is 0. The widths of the first to third JTE regions 4 to 6 were all 40 µm. The impurity concentration ratio of the first to third JTE regions 4 to 6 was the first JTE region 4:the second JTE region 5:the third JTE region 6=1:0.5:0.3. SBD device structures were disposed in the active region 11. The n$^-$-type drift layer 2 was a SiC epitaxial layer, the impurity concentration and thickness thereof were 3×10$^{15}$/cm$^3$ and 30 µm, respectively. The thickness of the interlayer insulating film 7 was 0.5 µm. The material of the anode electrode 8 was titanium (Ti). The material of an electrode pad 18 disposed so as to cover the anode electrode 8 was aluminum (Al).

The first electric field relaxation region 120 of conventional example 4 is made up of the first subregions 121 (the width $x_{11}$ of which is smaller the farther outward the first subregion 121 is arranged) and the second subregions 122 (the width $x_{12}$ of which is greater the farther outward the second subregion 122 is arranged), the first subregions 121 and the second subregions 122 are alternately and repeatedly arranged (corresponds to FIG. 11 of International Publication No. 2012/049872). In conventional example 4, four each of the first subregions 121 and the second subregions 122 were arranged. The equivalent concentration regions each including one set of a first subregion 121 and an adjacent second subregion 122 are assumed as the first to fourth equivalent concentration regions 161 to 164 sequentially from the inner side (the first JTE region 104 side). The average impurity concentrations of the first to fourth equivalent concentration regions 161 to 164 were the same as the average impurity concentrations of the first to fourth sections 61 to 64 in example 3 and the total width of the first electric field relaxation region 120 was the set to be the same as the total width 55.7 µm of the first electric field relaxation region 20 in example 3. The configuration of the second and third electric field relaxation regions 141, 142 is the same as that of the first electric field relaxation region 120. The average impurity concentration ratio of the first to fourth equivalent concentration regions 161 to 164 in the second electric field relaxation region 141 is the ratio when the impurity concentration ratio of the second JTE region 105 is 1 and the impurity concentration ratio of the third JTE region 106 is 0. The average impurity concentration ratio of the first to fourth equivalent concentration regions 161 to 164 in the third electric field relaxation region 142 is the ratio when the impurity concentration ratio of the third JTE region 106 is 1 and the impurity concentration ratio of the n⁻-type drift layer 102 is 0. The widths and impurity concentration ratios of the first to third JTE regions 104 to 106 are the same as those of the first to third JTE regions 4 to 6 in example 3. The configurations of the active region 111, the n⁻-type drift layer 102, the interlayer insulating film 107, the anode electrode 108, and the electrode pad 118 are the same as those of the active region 11, the n⁻-type drift layer 2, the interlayer insulating film 7, the anode electrode 8, and the electrode pad 18 in example 3, respectively.

From the results depicted in FIG. 24, it was confirmed that in example 3, the breakdown voltage may be made higher than that of conventional example 4, particularly, when the dose amount of the ion implantation for the formation of the first JTE region 4 is about $1.5 \times 10^{13}/cm^3$ or greater and $2.0 \times 10^{13}/cm^3$ or less. Further, in general, to increase the breakdown voltage of elements, the breakdown voltages of the edge termination structure portions 12, 112 are set to be higher than the breakdown voltage of the active region 11, 111 (breakdown voltages of the edge termination structure portions 12, 112>breakdown voltage of the active regions 11, 111). In FIG. 24, in example 3 and conventional example 4, ranges 13, 113 of the breakdown voltages of the edge termination structure portions 12, 112 higher than the breakdown voltage of the active regions 11, 111 are indicated by arrows. In example 3 and conventional example 4, the breakdown voltage of the active regions 11, 111 in the case of the conditions above is 4150 V and the breakdown voltages of the edge termination structure portions 12, 112 of the ranges 13, 113 higher than the breakdown voltage of the active regions 11, 111 may be made to have a margin of the dose amount of the ion implantation for forming the first JTE regions 4, 104 in the manufacturing process (hereinafter, dose amount margin). In other words, the dose amount margin of example 3 is about 1.5 times greater than the dose amount margin of the conventional examples.

Figure 25:
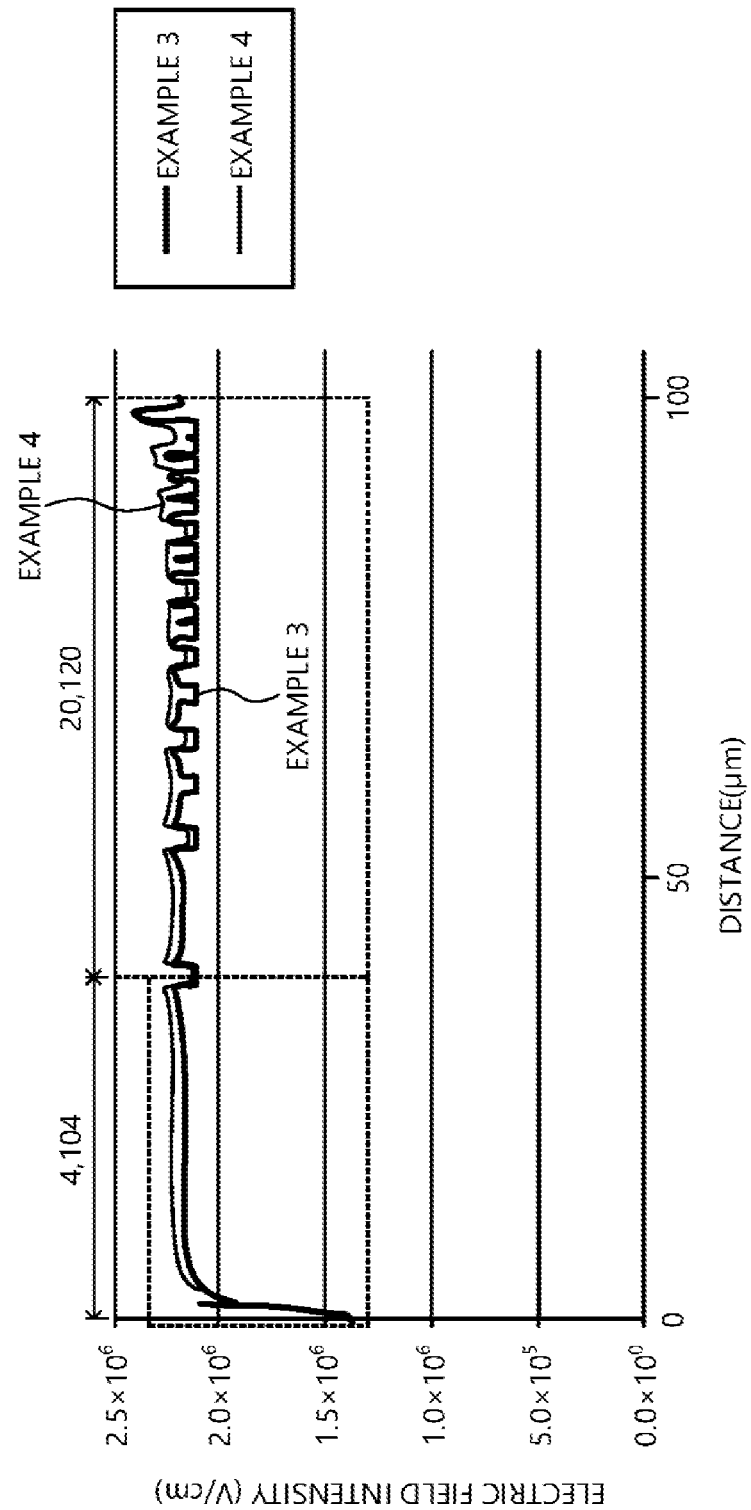
FIG. 25 is a characteristics diagram depicting electric field strength distribution of the semiconductor device according to example 3.

Verification concerning the electric field strength distribution of the edge termination structure portion 12 of the semiconductor device according to the seventh embodiment was performed. FIG. 25 is a characteristics diagram depicting the electric field strength distribution of the semiconductor device according to example 3. Results of simulation of the electric field strength distribution near the first JTE regions 4, 104 and the first electric field relaxation regions 20, 120 of example 3 and conventional example 4 are depicted in FIG. 25. The dose amount of the ion implantation for forming the first JTE regions 4, 104 was $2 \times 10^{13}/cm^3$ (dotted line C in FIG. 24). From the results depicted in FIG. 25, it was confirmed that according to the breakdown voltage of the edge termination structure portion 12 of example 3 being higher than the breakdown voltage of the edge termination structure portion 112 of conventional example 4, the electric field strength of the edge termination structure portion 12 of example 3 is reduced more than the electric field strength of the edge termination structure portion 112 of conventional example 4. Although cases where the dose amount of the ion implantation for forming the first JTE regions 4, 104 is other than $2 \times 10^{13}/cm^3$ are not depicted, from the results depicted in FIGS. 24, 25, it is known that the same results as the results depicted in FIG. 25 are obtained consequent to the breakdown voltage of the edge termination structure portion 12 becoming higher.

As described above according to the seventh embodiment, effects identical to those of the first, fifth, and sixth embodiments may be obtained. Further, according to the seventh embodiment, the equivalent concentration regions arranged in the same section all have the same configuration, whereby in each section of the electric field relaxation region, electric field concentration at the interface of the first subregion and the second subregion is relaxed. As a result, the breakdown voltage of the edge termination structure portion and the margin for variation of the dose amount of the ion implantation for forming the first and second subregions may be increased.

A structure of the semiconductor device according to the eighth embodiment will be described. FIGS. 26A and 26B are diagrams of a structure of the semiconductor device according to the eighth embodiment. FIG. 26A depicts a planar layout of the electric field relaxation region 20 and FIG. 26B depicts the impurity concentration distribution of the electric field relaxation region 20. The semiconductor device according to the eighth embodiment has a configuration obtained by applying the second embodiment to the seventh embodiment.

In particular, the first subregion portions 31 having an impurity concentration that is lower than that of the first subregions 21 are selectively disposed at a predetermined interval along the tangential direction Y in all of the first subregions 21 arranged in the fourth section 64 outermost in the electric field relaxation region 20. In other words, in the fourth section 64 outermost in the electric field relaxation region 20, the second subregions 22 and the third subregions 20a each made up of the first subregion 21 and the first subregion portions 31 are alternately and repeatedly arranged along the normal direction X, and one or more of the equivalent concentration regions 30a made up of one combination of a third subregion 20a and an adjacent second subregion 22 are cyclically arranged (assigned reference character 30a and indicated by five horizontal double-headed arrows continuous along the normal direction X (similarly for FIGS. 28A and 28B)). Thus, similar to the second embodiment, the p-type impurity concentration difference $\Delta n_{p1}$ (refer to FIG. 3C) of the second JTE region 5 and the fourth section 64 (the equivalent concentration region 30a) outermost in the electric field relaxation region 20 is reduced. For example, in a configuration where the first and second JTE regions 4, 5 and the first to third sections 61 to 63 are set by the same conditions described in the seventh embodiment and the ratio of the impurity concentration of the first subregion 21 and the first subregion portions 31 of the fourth section 64 is 1:1, the ratio of the average impurity concentration of the fourth section 64 may be decreased to about 0.2.

As described above, according to the eighth embodiment, effects identical to those of the first and fifth to seventh embodiments may be obtained. Further, according to the eighth embodiment, by selectively disposing the first subregion portions in all of the first subregions in the outermost section of the electric field relaxation region, the average impurity concentration of the outermost section of the electric field relaxation region may be brought close to the impurity concentration of the second JTE region and therefore, effects identical to those of the second embodiment may be obtained. Further, by selectively disposing the first subregion portions in all of the first subregions in the outermost section of the electric field relaxation region, the average impurity concentrations of all of the equivalent concentration regions in the outermost section of the electric field relaxation region become the same, whereby effects identical to those of the seventh embodiment are maintained.

As structure of the semiconductor device according to a ninth embodiment will be described. FIGS. 27A and 27B are diagrams of a structure of the semiconductor device according to the ninth embodiment. FIG. 27A depicts a planar layout of the electric field relaxation region 20 and FIG. 27B depicts the impurity concentration distribution of the electric field relaxation region 20. The semiconductor device according to the ninth embodiment has a configuration obtained by applying the third embodiment to the seventh embodiment.

In particular, the second subregion portions 32 having an impurity concentration that is higher than that of the second subregions 22 are selectively disposed at a predetermined interval along the tangential direction Y in all of the second subregions 22 arranged in the first section 61 innermost in the electric field relaxation region 20. In other words, in the first section 61 innermost in the electric field relaxation region 20, the first subregions 21 and the fourth subregions 20b each made up of the second subregions 22 and the second subregion portions 32 are alternately and repeatedly arranged along the normal direction X, and one or more of the equivalent concentration regions 30b made up of one combination of a fourth subregion 20b and an adjacent first subregion 21 are cyclically arranged. Thus, similar to the third embodiment, the p-type impurity concentration difference $\Delta n_{ph}$ (refer to FIG. 3C) of the first JTE region 4 and the first section 61 (the equivalent concentration region 30b) innermost in the electric field relaxation region 20 is reduced. For example, in a configuration where the first and second JTE regions 4, 5 and the second to fourth sections 62 to 64 are set by the same conditions described in the seventh embodiment and the ratio of the impurity concentration of the second subregions 22 and the second subregion portions 32 of the first section 61 is 1:1, the ratio of the average impurity concentration of the first section 61 may be increased to about 0.864.

As described above, according to the ninth embodiment, effects identical to those of the first and fifth to seventh embodiments may be obtained. Further, according to the ninth embodiment, by selectively disposing the second subregion portions in all of the second subregions in the innermost section of the electric field relaxation region, the average impurity concentration of the innermost section of the electric field relaxation region may be brought close to the impurity concentration of the first JTE region and therefore, effects identical to those of the third embodiment may be obtained. Further, by selectively disposing the second subregion portions in all of the second subregions in the innermost section of the electric field relaxation region, the average impurity concentrations of all of the equivalent concentration regions in the innermost section of the electric field relaxation region become the same, whereby effects identical to those of the seventh embodiment are maintained.

A structure of the semiconductor device according to a tenth embodiment will be described. FIGS. 28A and 28B are diagrams of a structure of the semiconductor device according to the tenth embodiment. FIG. 28A depicts a planar layout of the electric field relaxation region 20 and FIG. 28B depicts the impurity concentration distribution of the electric field relaxation region 20. The semiconductor device according to the tenth embodiment has a configuration obtained by combining the eighth embodiment and the ninth embodiment.

In other words, in the tenth embodiment, similar to the eighth embodiment, one or more of the equivalent concentration regions 30a made up of one combination of a third subregion 20a and an adjacent second subregion 22 are cyclically arranged in the fourth section 64 outermost in the electric field relaxation region 20, and the p-type impurity concentration difference $\Delta n_{p1}$ (refer to FIG. 3C) of the second JTE region 5 and the fourth section 64 (the equivalent concentration region 30a) outermost in the electric field relaxation region 20 is reduced. In addition, similar to the ninth embodiment, one or more of the equivalent concentration regions 30b made up of one combination of a fourth subregion 20b and an adjacent first subregion 21 are cyclically arranged in the first section 61 innermost in the electric field relaxation region 20, and the p-type impurity concentration difference $\Delta n_{ph}$ of the first JTE region 4 and the electric field relaxation region 20 is reduced.

As described above, according to the tenth embodiment, effects identical to those of the first to third, and fifth to ninth embodiments may be obtained.

A structure of the semiconductor device according to the eleventh embodiment will be described. FIGS. 29A and 29B are diagrams of a structure of the semiconductor device according to the eleventh embodiment. FIG. 29A depicts a planar layout of the electric field relaxation region 20, and FIG. 29B depicts the impurity concentration distribution of the electric field relaxation region 20. The semiconductor device according to the eleventh embodiment differs from the semiconductor device according to the eighth embodiment in that in all of the first subregions 21 from the first subregion 21 third from the inner side to the outermost first subregion 21, the first subregion portions 31 are selectively disposed at a predetermined interval along the tangential direction Y. In particular, two of the equivalent concentration regions 30 made up of one combination of a first subregion 21 and an adjacent second subregion 22 are arranged concentrically surrounding the first JTE region 4 (assigned reference numeral 30 and indicated by two horizontal, double-headed arrows continuous along the normal direction X from the left side). The equivalent concentration region 30a made up of one combination of a third subregion 20a and an adjacent second subregion 22 is arranged in plural concentrically surrounding the equivalent concentration region 30 (assigned reference character 30a and indicated by 11 horizontal, double-headed arrows continuous along the normal direction X from the right side).

The farther outward the third subregions 20a are arranged, the higher the ratio of the first subregion portion 31 to the first subregion 21 is. In other words, the pitch or the width along the tangential direction Y is changed such that the average impurity concentration of the third subregion 20a decreases the farther outward arrangement is, and the first subregion portions 31 are disposed in the first subregions 21 and adjusted so that the average impurity concentration of the equivalent concentration region 30a decreases the farther outward arrangement is. The average impurity concentration distribution of the equivalent concentration regions 30, 30a are indicated by dotted lines in FIG. 29B. Thus, the average impurity concentration in the first to fourth sections 61 to 64 may be gradually reduced in a direction from the inner side toward the outside, and the electric field strength at the interface of the adjacent equivalent concentration region 30a in the sections 61 to 64 may be reduced. Further, since the average impurity concentrations in the first to fourth sections 61 to 64 may be gradually reduced in a direction from the inner side toward the outside, the impurity concentration distribution of the electric field relaxation region 20 may be brought closer to the ideal impurity concentration distribution of gradual decrease from the inner side toward the outside. The average impurity concentrations of the first to fourth sections 61 to 64 may be reduced gradually by a predetermined slope in a direction from the inner side toward the outside and the first subregions 21 in which the first subregion portion 31 is not disposed may be present.

As described above, according to the eleventh embodiment, effects identical to those of the first, second, and fifth to eighth embodiments may be obtained.

A structure of the semiconductor device according to a twelfth embodiment will be described. FIGS. 30A and 30B are diagrams of a structure of the semiconductor device according to the twelfth embodiment. FIG. 30A depicts a planar layout of the electric field relaxation region 20, and FIG. 30B depicts the impurity concentration distribution of the electric field relaxation region 20. The semiconductor device according to the twelfth embodiment differs from the semiconductor device according to the ninth embodiment in that in substantially all of the second subregions 22, the second subregion portions 32 are selectively disposed at a predetermined interval along the tangential direction Y. In particular, the equivalent concentration region 30b made up of one combination of a fourth subregion 20b and an adjacent first subregion 21 is arranged in plural concentrically surrounding the first JTE region 4 (assigned reference character 30b and indicated by 13 horizontal, double-headed arrows continuous along the normal direction X).

The farther outward the fourth subregions 20b are arranged, the lower the ratio of the second subregion portion 32 to the second subregion 22 is. In other words, the pitch or the width along the tangential direction Y is changed such that the average impurity concentration of the fourth subregion 20b increases the farther inward arrangement is, and the second subregion portions 32 are disposed in the second subregions 22 and adjusted so that the average impurity concentration of the equivalent concentration region 30b decreases the farther outward arrangement is. The average impurity concentration distribution of the equivalent concentration regions 30b are indicated by the dotted lines in FIG. 30B. Thus, the average impurity concentration in the first to fourth sections 61 to 64 may be gradually reduced in a direction from the inner side toward the outside, and the electric field strength at the interface with the adjacent equivalent concentration region 30b in the sections 61 to 64 may be reduced. Further, since average impurity concentrations in the first to fourth sections 61 to 64 may be gradually reduced in a direction from the inner side toward the outside, the impurity concentration distribution of the electric field relaxation region 20 may be brought closer to the ideal impurity concentration distribution of gradual decrease from the inner side toward the outside. The average impurity concentrations of the first to fourth sections 61 to 64 may be reduced gradually by a predetermined slope in a direction from the inner side toward the outside and the second subregions 22 in which the second subregion portion 32 is not disposed may be present.

As described above, according to the twelfth embodiment, effects identical to those of the first, third, fifth to seventh, and ninth embodiments may be obtained.

Figure 31C:
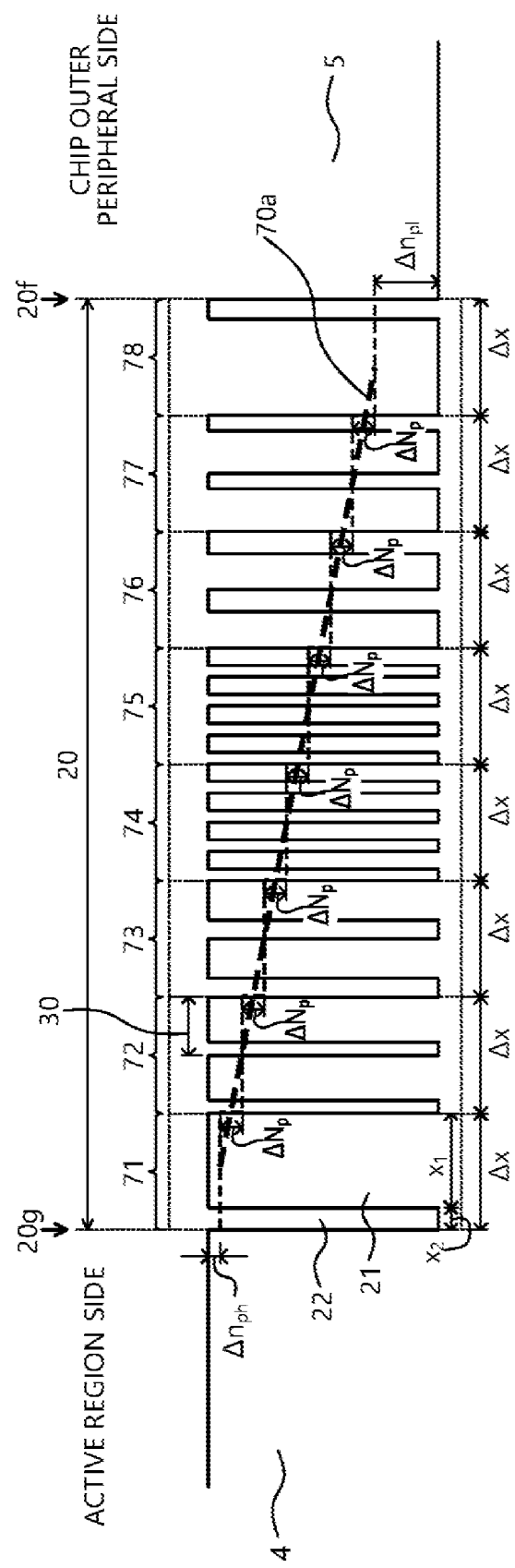
Figure 32:
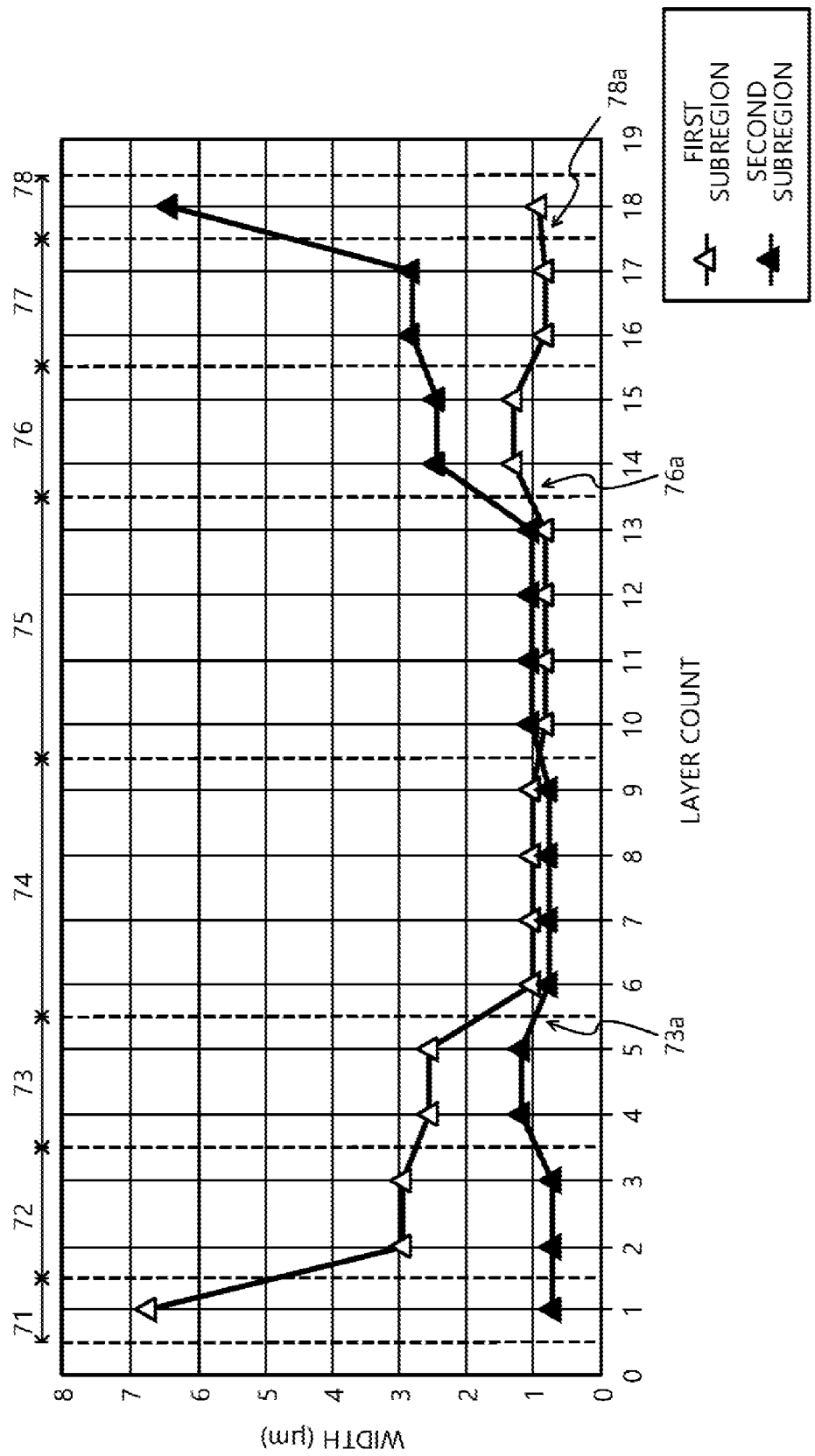

A structure of the semiconductor device according to a thirteenth embodiment will be described. FIGS. 31A, 31B, and 31C are diagrams of a structure of the semiconductor device according to the thirteenth embodiment. FIGS. 31A and 31B depict enlarged views of the electric field relaxation region 20 in FIGS. 1A and 1B. FIGS. 31A and 1B depict enlarged views of a planar layout and a cross-sectional view of the electric field relaxation region 20, respectively. FIG. 30C depicts the p-type impurity concentration distribution at cutting line C-C' in FIG. 31A. FIGS. 32 and 33 are diagrams of one example of widths of the first and second subregions of the sections in FIGS. 31A to 31C. In FIG. 32, one memory along the horizontal axis is one equivalent concentration region 30 (region including one combination of adjacent first and second subregions 21, 22) and the widths $x_1$, $x_2$ of the first and second subregions 21, 22 for each equivalent concentration region 30 are plotted along the vertical axis (similarly in FIGS. 35, 37, 39, 41, and 45).

The semiconductor device according to the thirteenth embodiment differs from the semiconductor device according to the seventh embodiment on the following three points. The first difference is that the widths (width in a direction from the inner side toward the outside) Δx of sections (here, for example, 8 sections) 71 to 78 configuring the electric field relaxation region 20 are all substantially equal. In other words, the electric field relaxation region 20 is sectioned by an equal width Δx into 8 sections 71 to 78. In each of the sections 71 to 78, similar to the seventh embodiment, one or more of the equivalent concentration regions 30 is arranged. The widths Δx of the respective sections 71 to 78 is the sum of the widths ($=x_1+x_2$) of one or more the equivalent concentration regions 30 forming the respective sections. In FIGS. 31A to 31C, reference numerals 71 to 78 are assigned sequentially to the sections, from the inner side toward the outside (similarly in FIGS. 32, 34A to 41).

The second difference is that the average impurity concentration differences ΔNp between adjacent sections 71 to 78 is equal. As described above, the widths Δx of the sections 71 to 78 are all equal, whereby the average impurity concentration slope 70a (decreasing ratio of the average impurity concentration in direction from inner side toward outside=ΔNp/Δx) of the electric field relaxation region 20 decreasing from the inner side toward the outside is constant across the entire electric field relaxation region 20 (i.e., all of the sections 71 to 78). In FIG. 31C, an approximated straight line representing the average impurity concentration slope 70a of the electric field relaxation region 20 is indicated by a dotted line (similarly in FIGS. 34C, 46B, and 47B. In each of the sections 71 to 78, similar to the seventh embodiment, one or more of the equivalent concentration regions 30 of the same conditions is arranged. Therefore, the average impurity concentrations of each of the sections 71 to 78 is equal to the average impurity concentration Np of the equivalent concentration regions 30 arranged therein. In other words, the average impurity concentration of each of the sections 71 to 78 is calculated by equation 3.

In the formation of the electric field relaxation region 20, the widths $x_1$, $x_2$ of the first and second subregions 21, 22 are determined such that the average impurity concentration differences ΔNp between adjacent sections 71 to 78 are all constant and the widths Δx of the sections 71 to 78 are all substantially constant. Although the smallest structure of the equivalent concentration region 30 may be set to be the smallest size determined by the widths $x_1$, $x_2$ of the first and second subregions 21, 22 and process limitations, the smallest structure of the equivalent concentration region 30 need not be arranged. In other words, the first and second subregions 21, 22 may be cyclically arranged at the predetermined widths $x_1$, $x_2$ such that the average impurity concentration slope 70a of the electric field relaxation region 20 is constant across the entire electric field relaxation region 20.

Further, even when the average impurity concentration slope 70a of the electric field relaxation region 20 is set to be constant across the entire electric field relaxation region 20, at an interface 20f of the second JTE region 5 and the electric field relaxation region 20, the p-type impurity concentration difference $\Delta n_{p1}$ of the second JTE region 5 and the eighth section 78 outermost in the electric field relaxation region 20 (the equivalent concentration region 30) occurs. The p-type impurity concentration difference $\Delta n_{p1}$ of the second JTE region 5 and the eighth section 78 may be advantageously reduced by increasing the width of the electric field relaxation region 20. The reason for this is that electric field concentration near the interface 20f of the second JTE region 5 and the electric field relaxation region 20 is relaxed and the breakdown voltage of the second JTE region 5 is enhanced.

Similarly, the p-type impurity concentration difference $\Delta n_{ph}$ of the first JTE region 4 and the first section 71 (the equivalent concentration region 30) innermost in the electric field relaxation region 20 further occurs at an interface 20g of the first JTE region 4 and the electric field relaxation region 20. The p-type impurity concentration difference $\Delta n_{ph}$ also affects the electric field strength near the interface 20g of the first JTE region 4 and the electric field relaxation region 20 and influences the breakdown voltage of the first JTE region 4. Therefore, the p-type impurity concentration difference $\Delta n_{ph}$ of the first JTE region 4 and the first section 71 may be made as small as possible and the breakdown voltage of the first JTE region 4 may be enhanced.

The minimum value of the p-type impurity concentration difference $\Delta n_{ph}$ of the first JTE region 4 and the first section 71 is uniquely determined by the widths $\Delta x$ of the sections 71 to 78 determined by a section count of the electric field relaxation region 20 and the minimum size of the width $x_2$ of the second subregions 22 determined by process limits. The average impurity concentration of the first section 71 may be value close to the average impurity concentration of the first JTE region 4 and may advantageously be 90 percent or more of the average impurity concentration of the first JTE region 4. In other words, the p-type impurity concentration difference $\Delta n_{ph}$ of the first JTE region 4 and the first section 71 may be advantageously 10 percent or less of the average impurity concentration of the first JTE region 4.

Although not particularly limited, for example, when the width of the electric field relaxation region 20 is 60 μm, and the electric field relaxation region 20 is sectioned into 8 sections, the sections 71 to 78, having the width $\Delta x$ 7.5 μm. Conditions of the sections 71 to 78 of the electric field relaxation region 20 are as follows. The average impurity concentration difference $\Delta Np$ between adjacent sections 71 to 78 when the ratio of the impurity concentration of the first JTE region 4 is 1 and the ratio of the impurity concentration of the second JTE region 5 is 0 is assumed to be 0.11, i.e., is equivalent to the impurity concentrations $n_{p1}$, $n_{p2}$ of the first and second subregions 21, 22 each decreasing by 11% the farther outward arrangement is.

Under these conditions, the widths $x_1$, $x_2$ of the first and second subregions 21, 22 of the sections 71 to 78 when the p-type impurity concentration difference $\Delta n_{ph}$ of the first JTE region 4 and the first section 71 is 0.91 are depicted in FIG. 32. Among the widths $x_1$, $x_2$ of the first and second subregions 21, 22 depicted in FIG. 32, detailed values of the widths $x_1$, $x_2$ of the first and second subregions 21, 22 in the first to fourth sections 71 to 74 are depicted in FIG. 33. The minimum size of the widths $x_1$, $x_2$ of the first and second subregions 21, 22 determined by process limitations is assumed to be, for example, 0.7 μm.

As depicted in FIGS. 32 and 33, one of the equivalent concentration regions 30 is arranged in the first section 71 (1 cycle). The widths $x_1$, $x_2$ of the first and second subregions 21, 22 configuring this equivalent concentration region 30 are 6.8 μm and 0.7 μm, respectively. The width $\Delta x$ of the first section 71 is 7.5 μm, equal to the width of the one equivalent concentration region 30 configuring the first section 71. The ratio of the average impurity concentration of the first section 71 is 0.91, the same as the p-type impurity concentration difference $\Delta n_{ph}$ of the first JTE region 4 and the first section 71.

Two of the equivalent concentration regions 30 are arranged in the second section 72 (2 cycles). The widths $x_1$, $x_2$ of the first and second subregions 21, 22 configuring these equivalent concentration regions 30 are 3.01 μm and 0.74 μm, respectively and the sum thereof (the width of the equivalent concentration region 30) is 3.75 μm. The width $\Delta x$ of the second section 72 is the sum (3.75 μm×2=7.5 μm) of the widths of the two equivalent concentration regions 30 configuring the second section 72. The ratio of the average impurity concentration of the second section 72 is lower than the ratio of the average impurity concentration of the first section 71 by 0.11, i.e., 0.80(=0.91−0.11).

Two of the equivalent concentration regions 30 are arranged in the third section 73 (2 cycles). The widths $x_1$, $x_2$ of the first and second subregions 21, 22 configuring these equivalent concentration regions 30 are 2.60 μm and 1.15 μm, respectively and the sum thereof is 3.75 μm. The width $\Delta x$ of the third section 73 is the sum (3.75 μm×2=7.5 μm) of the widths of the two equivalent concentration regions 30 configuring the third section 73. The ratio of average impurity concentration of the third section 73 is lower than the ratio of the average impurity concentration of the second section 72 by 0.11, i.e., 0.69(=0.80−0.11).

Four of the equivalent concentration regions 30 are arranged in the fourth section 74 (4 cycles). The widths $x_1$, $x_2$ of the first and second subregions 21, 22 configuring these equivalent concentration regions 30 are 0.795 μm and 1.080 μm, respectively and the sum thereof is 1.875 μm. The width of $\Delta x$ the fourth section 74 is the sum of the widths of the four equivalent concentration regions 30 configuring the fourth section 74 (1.875 μm×4=7.5 μm). The ratio of the average impurity concentration of the fourth section 74 is lower than the ratio of the average impurity concentration of the third section 73 by 0.11, i.e., 0.58(=0.69−0.11).

Similarly, four of the equivalent concentration regions 30 are arranged in the fifth section 75 (4 cycles). Two of the equivalent concentration regions 30 are arranged in each of the sixth and seventh sections 76, 77, (2 cycles). One of the equivalent concentration regions 30 is arranged in the eighth section 78 (1 cycle). In other words, in the present example, 18 each of the first and second subregions 21, 22 are arranged in the electric field relaxation region 20. Description of detailed values of the widths $x_1$, $x_2$ of the first and second subregions 21, 22 in the fifth to eighth sections 75 to 78 will be omitted. The ratios of the average impurity concentrations of the fifth to eighth sections 75 to 78 each decrease by 0.11 the farther outward arrangement is, i.e., 0.47, 0.36, 0.25, and 0.14, respectively. The p-type impurity concentration difference $\Delta n_{p1}$ of the second JTE region 5 and the eighth section 78 is 0.14.

The widths $x_1$, $x_2$ of the first and second subregions 21, 22 are determined based on the average impurity concentration $N_p$ and the width of the equivalent concentration region configured by the first and second subregions 21, 22. In particular, the widths of the equivalent concentration regions 30 are values obtained by dividing the widths $\Delta x$ of the respective sections 71 to 78 in which the equivalent concentration regions 30 are arranged by the number (cycles) of the equivalent concentration regions 30 in the respective sections 71 to 78. The average impurity concentration of the first section 71 is a value obtained by subtracting the predetermined p-type impurity concentration difference $\Delta n_{ph}$ of the first JTE region 4 from the impurity concentration of the first JTE region 4. The average impurity concentrations of the second to eighth sections 72 to 78 are values obtained by subtracting from the respective average impurity concentrations of adjacent sections 71 to 77 on the inner side, the average impurity concentration difference $\Delta Np$ between the adjacent sections 71 to 78. The widths $x_1$, $x_2$ of the first and second subregions 21, 22 are values such that the sum ($=x_1+x_2$) becomes substantially equal to the width of the equivalent concentration region 30 configured by the first and second subregions 21, 22 and the average impurity concentration $N_p$ of the equivalent concentration regions 30 becomes equal to the average impurity concentration of the section 71 to 78 in which the equivalent concentration regions are arranged, the widths $x_1$, $x_2$ are calculated using equation 3.

In determining the widths $x_1$, $x_2$ of the first and second subregions 21, 22, a third difference from the seventh embodiment is that the widths $x_1$ of the first subregions 21 need not decrease the farther outward arrangement is and the widths $x_2$ of all of the second subregions 22 need not be constant. For example, as depicted in FIG. 32, the widths $x_1$ of the first subregions 21 of the sixth and eighth sections 76, 78 (portions indicated by arrows 76a, 78a) may be greater than the widths $x_1$ of the first subregions 21 of the fifth and seventh sections 75, 77 respectively on the inner sides thereof. Further, the widths $x_2$ of the second subregions 22 may be increased the farther outward arrangement is and in this case, as depicted in FIG. 32, the width $x_2$ of the second subregions 22 of the third section 73 (portion indicated by arrow 73a) may be greater than the width $x_2$ of the second subregions 22 of the fourth section 74 on the outer side thereof. In other words, the widths $x_1$, $x_2$ of the first and second subregions 21, 22 need not have regularity with respect to the widths $x_1$, $x_2$ of the first and second subregions 21, 22 neighboring on the inner side or outer side thereof.

Further, the cycles of the equivalent concentration regions 30 in the sections may be changed variously. FIGS. 34A, 34B, and 34C are diagrams of another example of a structure of the semiconductor device according to the thirteenth embodiment. FIGS. 34A and 34B depict enlarged views of a planar layout and a cross-sectional view of the electric field relaxation region 20, respectively. FIG. 34C depicts the p-type impurity concentration distribution at cutting line D-D' in FIG. 34A. FIG. 35 is a diagram depicting one example of widths of the first and second subregions of the sections depicted in FIG. 34A to 34C. FIGS. 34A to 34C and 35 depict, for example, a case where two of the equivalent concentration regions 30 are arranged in each of the fourth and fifth sections 74, 75 (2 cycles). Conditions of sections other than the fourth and fifth sections 74, 75 of the electric field relaxation region 20 depicted in FIGS. 34A to 34C are the same as those of the electric field relaxation region 20 depicted in FIGS. 31A to 31C. FIGS. 34C and 31C illustrate that the average impurity concentration slope 70a of the electric field relaxation region 20 does not change. In other words, the average impurity concentration slope 70a of the electric field relaxation region 20 may be determined by the widths of the sections 71 to 78 and the average impurity concentration difference $\Delta Np$ between adjacent sections 71 to 78, irrespective of the cycles of the equivalent concentration region 30 in the respective sections 71 to 78.

As described above, according to the thirteenth embodiment, effects identical to those of the first and seventh embodiments may be obtained. Further, according to the thirteenth embodiment, the average impurity concentration slope of the electric field relaxation region may be made constant across the entire electric field relaxation region with an average impurity concentration satisfying predetermined electrical characteristics (sustaining breakdown voltage, etc.). As a result, the electric field between the first JTE region and the second JTE region may be further relaxed. Further, according to the thirteenth embodiment, the average impurity concentration slope of the electric field relaxation region may be determined with the width of electric field relaxation region, enabling the width of the electric field relaxation region to be reduced to be within a feasible range. Therefore, the breakdown voltage of the edge termination structure portion may be enhanced without increases in the width of the edge termination structure portion.

Figure 36C:
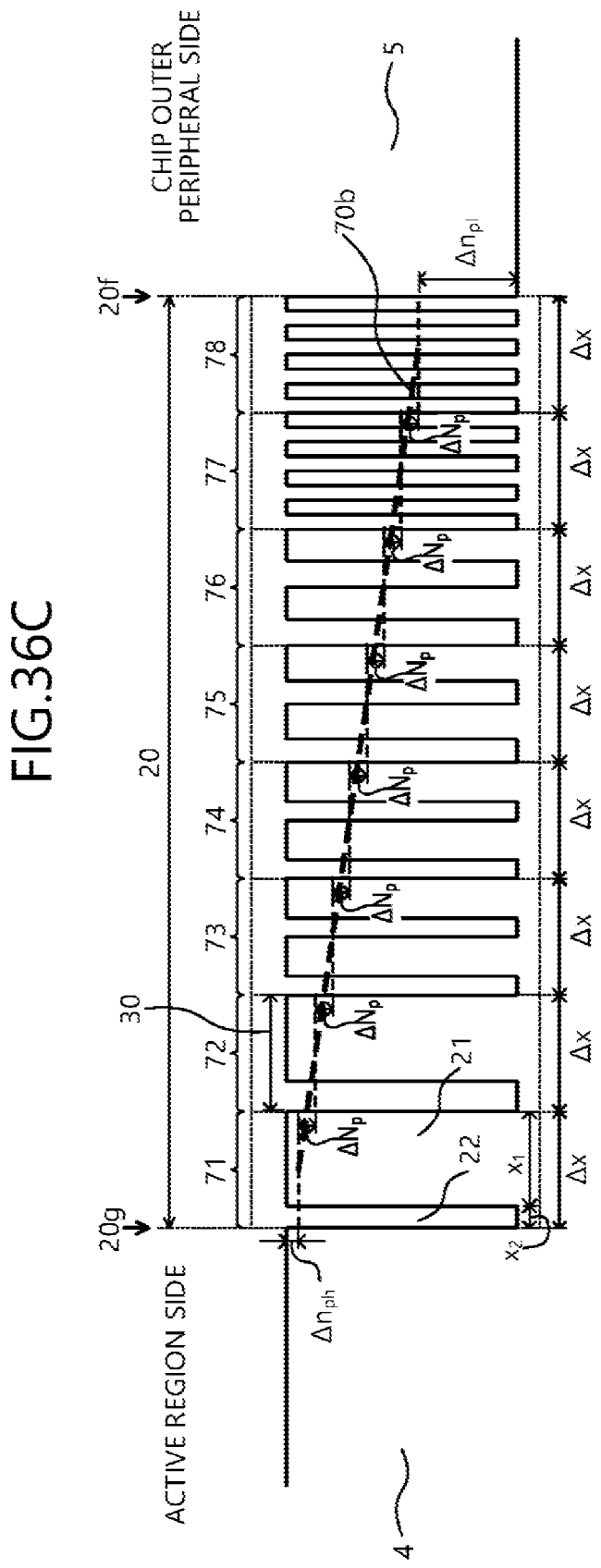
Figure 37:
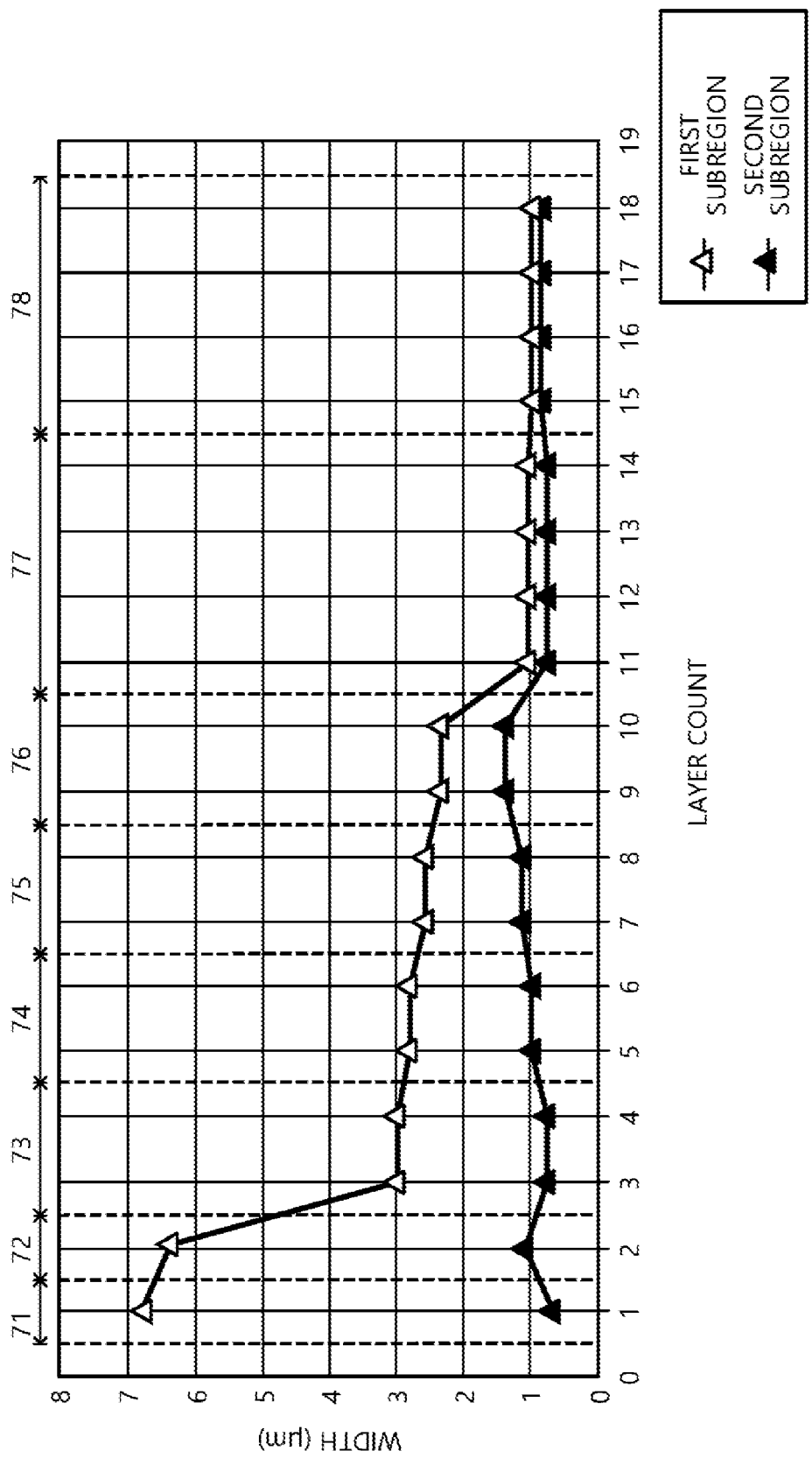
FIG. 37 is a diagram depicting an example of widths of the first and second subregions in the sections depicted in FIGS. 36A, 36B, and 36C.

A structure of the semiconductor device according to a fourteenth embodiment will be described. FIGS. 36A, 36B, and 36C are diagrams of a structure of the semiconductor device according to the fourteenth embodiment. FIGS. 36A and 36B depict enlarged views of the electric field relaxation region 20 in FIGS. 1A and 1B. FIGS. 36A and 36B depict enlarged views of a planar layout and a cross-sectional view of the electric field relaxation region 20, respectively. FIG. 36C depicts the p-type impurity concentration distribution at cutting line E-E' in FIG. 36A. FIG. 37 is a diagram depicting an example of widths of the first and second subregions in the sections depicted in FIGS. 36A, 36B, and 36C.

The semiconductor device according to the fourteenth embodiment differs from the semiconductor device according to the thirteenth embodiment in that the average impurity concentration difference $\Delta Np$ between adjacent sections 71 to 78 is lowered to make an average impurity concentration slope 70b of the electric field relaxation region 20 gradual. In FIG. 36C, an approximated straight line representing the average impurity concentration slope 70b of the electric field relaxation region 20 is indicated by a dotted line (similarly in FIGS. 38C, 44C). For example, the average impurity concentration slope 70b of the electric field relaxation region 20 when the average impurity concentration difference $\Delta Np$ between adjacent sections 71 to 78 is 0.055 is depicted in FIG. 36C. Here, as depicted in FIGS. 36A to 37, one of the equivalent concentration regions 30 is arranged in each of the first and second sections 71, 72 (1 cycle); two of the equivalent concentration regions 30 are arranged in each of the first to second sections 73 to 76 (2 cycles); and four of the equivalent concentration regions 30 are arranged in the seventh and eighth sections 77, 78 (4 cycles).

In the fourteenth embodiment, the average impurity concentration slope 70b of the electric field relaxation region 20 is gradual, whereby the electric field relaxation effect at the electric field relaxation region 20 may be increased. Further, the cycle of the equivalent concentration regions 30 in the seventh and eighth sections 77, 78 on the outer side is increased, enabling the electric field relaxation effect at the electric field relaxation region 20 to be increased. On the other hand, the average impurity concentration slope 70b of the electric field relaxation region 20 is gradual, whereby the p-type impurity concentration difference $\Delta n_{p1}$ of the second JTE region 5 and the eighth section 78 increases. Therefore, although the electric field concentration at the interface 20f of the second JTE region 5 and the electric field relaxation region 20 is a concern, this point may be resolved by, for example, sixteenth and eighteenth embodiments. Further, the p-type impurity concentration difference $\Delta n_{p1}$ of the second JTE region 5 and the eighth section 78 is reduced, whereby when the p-type impurity concentration difference $\Delta n_{ph}$ of the first JTE region 4 and the first section 71 increases, the electric field concentration at the interface 20g of the first JTE region 4 and the electric field relaxation region 20 is a concern. This point may be resolved by, for example, the sixteenth and seventeenth embodiments.

The widths $x_1$, $x_2$ of the first and second subregions 21, 22 of the sections 71 to 78, similar to the thirteenth embodiment, may be changed variously based on the section count of the electric field relaxation region 20 and the average impurity concentration difference ΔNp of adjacent sections 71 to 78. FIG. 37 depicts an example where the widths $x_2$ of the second subregions 22 are substantially constant, and the widths $x_2$ of the second subregions 22 of the third and seventh sections 73, 77 are each greater than the widths $x_2$ of the second subregions 22 of the fourth and eight sections 74, 78 on the respective outer sides thereof.

Figure 38C:
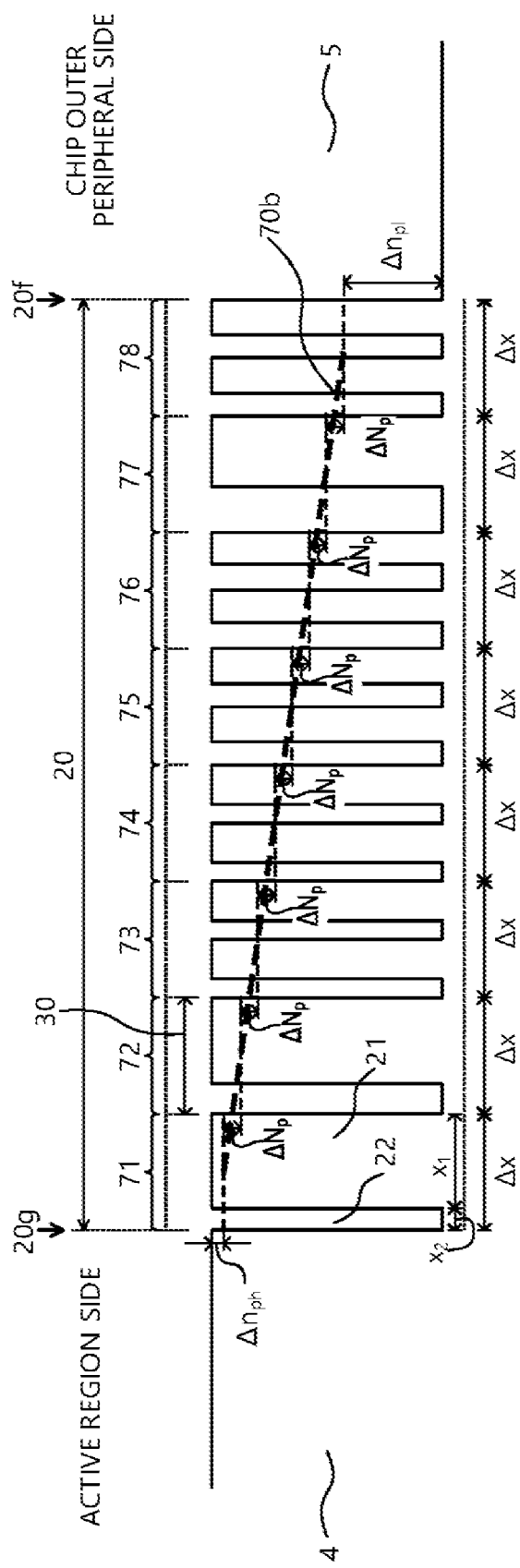

The cycles of the equivalent concentration regions 30 in the sections may be changed variously. FIGS. 38A, 38B, and 38C are diagrams depicting another example of the structure of the semiconductor device according to the fourteenth embodiment. FIGS. 38A and 38B depict enlarged views of a planar layout and a cross-sectional view of the electric field relaxation region 20, respectively. FIG. 38C depicts the p-type impurity concentration distribution at cutting line F-F' in FIG. 38A. FIG. 39 is a diagram depicting an example of widths of the first and second subregions in the sections depicted in FIGS. 38A to 38C. FIGS. 38A to 39 depict, for example, a case where one of the equivalent concentration regions 30 is arranged in the seventh section 77 (1 cycle) and two of the equivalent concentration regions 30 are arranged in the eighth section 78 (2 cycles). Conditions of sections other than the fourth and fifth sections 74, 75 of the electric field relaxation region 20 depicted in FIGS. 38A to 38C are the same as those of the electric field relaxation region 20 depicted in FIGS. 36A to 36C. Similar to the other example of the thirteenth embodiment (refer to FIGS. 34A to 35), in FIGS. 38C and 36C, the average impurity concentration slope 70b of the electric field relaxation region 20 does not vary.

As described above, according to the fourteenth embodiment, effects identical to those of the seventh and thirteenth embodiments may be obtained. According to the fourteenth embodiment, the average impurity concentration slope of the electric field relaxation region is made gradual, enabling the breakdown voltage of a portion (portion on the first JTE region side) on the inner side of the edge termination structure portion to be further enhanced.

A structure of the semiconductor device according to a fifteenth embodiment will be described. The semiconductor device according to the fifteenth embodiment is a semiconductor device in which the electric field relaxation region 20 of the semiconductor device according to the thirteenth embodiment (refer to FIGS. 31A to 33) is applied to the first to third electric field relaxation regions 20, 41, 42 of the 3-zone JTE structure, similar to the other example of the seventh embodiment (refer to FIG. 21). The arrangement of the first to third electric field relaxation regions 20, 41, 42 and the average impurity concentration difference thereof with adjacent JTE regions, for example, may be the same as those of the other example of the seventh embodiment.

Figure 40C:
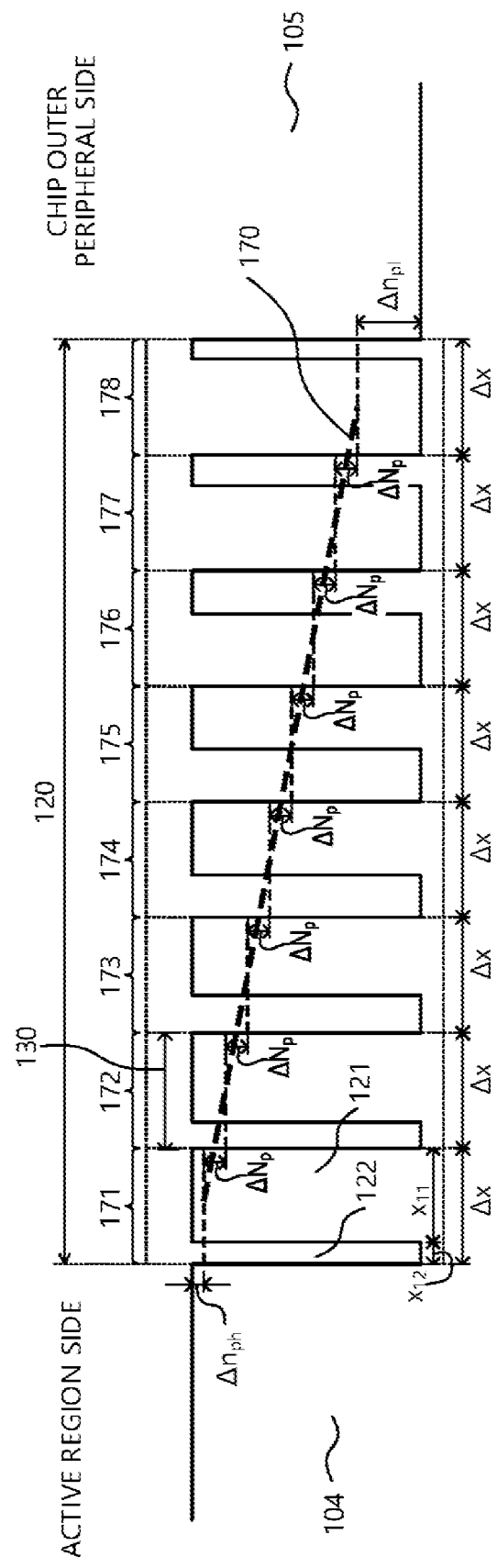

Example 4 will be described. Verification concerning the breakdown voltage of the edge termination structure portion 12 of the semiconductor device according to the fifteenth embodiment was performed. FIGS. 40a, 40B, and 40C are diagrams depicting a portion of the JTE structure of a semiconductor device according to conventional example 5. FIGS. 40A and 40B are views of the planar layout and the impurity concentration distribution of the electric field relaxation region 120, respectively. FIG. 40C depicts the p-type impurity concentration distribution at cutting line CC-CC' in FIG. 40A. FIG. 41 is a diagram depicting an example of widths of the first and second subregions of the sections depicted in FIGS. 40A to 40C. FIG. 42 is a characteristics diagram of breakdown voltage characteristics of the edge termination structure portion of the semiconductor device according to example 4. FIG. 42 depicts results of simulating the breakdown voltage of the edge termination structure portion 12 when the electric field relaxation region 20 of example 4 is applied to the first to third electric field relaxation regions 20, 41, 42 (refer to FIG. 21) of the 3-zone JTE structure. Further, FIG. 42 further depicts for comparison, results of simulating the breakdown voltage of the edge termination structure portion 112 when the electric field relaxation region 120 of conventional example 5 depicted in FIGS. 40A to 40C is applied to the first to third electric field relaxation regions 120, 141, 142 (refer to FIG. 19) of the conventional 3-zone JTE structure. In FIG. 42, the horizontal axis represents dose amount of the first ion implantation for forming the first JTE regions 4, 104 and the vertical axis represents the breakdown voltages of the edge termination structure portions 12, 112. In other words, FIG. 42 depicts the dependency of the breakdown voltage of the edge termination structure portions 12, 112 on variation of the dose amount of the ion implantation for forming the first JTE regions 4, 104.

The first electric field relaxation region 20 of example 4 is the JTE structure of a SiC-SBD having the configuration of the semiconductor device according to the fifteenth embodiment. In particular, the first electric field relaxation region 20 of example 4, as exemplified in the thirteenth embodiment, is configured by a total of 18 each of the first and second subregions 21, 22 and is sectioned into 8 sections (sections 71 to 78) in which one or more of the equivalent concentration regions 30 is arranged (refer to FIGS. 31A to 33). The width of the first electric field relaxation region 20 was 60 μm and the widths Δx of the sections 71 to 78 were each 7.5 μm. The p-type impurity concentration difference $\Delta n_{ph}$ of the first JTE region 4 and the first section 71 was 0.91. The ratio of the average impurity concentration difference ΔNp between adjacent sections 71 to 78 when the ratio of the impurity concentration of the first JTE region 4 is 1 and the ratio of the impurity concentration of the second JTE region 5 is 0 was 0.11 and the average impurity concentration of the first electric field relaxation region 20 was reduced in an outward direction by a constant concentration slope 70a. The configurations of the second and third electric field relaxation regions 41, 42 are the same as that of the first electric field relaxation region 20. The widths of the first to third JTE regions 4 to 6 and the impurity concentration ratio of the first to third JTE regions 4 to 6 are the same as those in example 3. The configurations of the active region 11, the n⁻-type drift layer 2, the interlayer insulating film 7, the anode electrode 8, and the electrode pad 18 are the same as those in example 3.

As depicted in FIGS. 40A to 41, the first electric field relaxation region 120 of conventional example 5 is made up of the first subregions 121 (the width $x_{11}$ of which is smaller the farther outward the first subregion 121 is arranged) and the second subregions 122 (the width $x_{12}$ of which is greater the farther outward the second subregion 122 is arranged), the first subregions 121 and the second subregions 122 being alternately and repeatedly arranged. In conventional example 5, an equivalent concentration region including one combination of adjacent first and second subregions 121, 122 is arranged in plural (here, 8) assumed as first to eighth equivalent concentration regions 171 to 178 sequentially from the inner side. The total width of the first electric field relaxation region 120 was 60 μm, the same as the total width of the first electric field relaxation region 20 in example 4, and the widths of the equivalent concentration regions 171 to 178 were all 7.5 μm. The p-type impurity concentration difference of the first JTE region 104 and the first equivalent concentration region 171 was 0.91. The average impurity concentrations of the first to eighth equivalent concentration regions 171 to 178 were the same as the average impurity concentrations of the first to eighth sections 71 to 78 in example 4, respectively and decreased outwardly by a constant concentration slope. The configurations of the second and third electric field relaxation regions 141, 142 were the same as that of the first electric field relaxation region 120. The width and impurity concentration ratio of the first to third JTE regions 104 to 106 were the same as those of the first to third JTE regions 4 to 6 in example 4. The configurations of the active region 111, the n⁻-type drift layer 102, the interlayer insulating film 107, the anode electrode 108, and the electrode pad 118 were the same as those of the active region 11, the n⁻-type drift layer 2, the interlayer insulating film 7, the anode electrode 8, and the electrode pad 18 in example 4, respectively. Reference numeral 170 is the average impurity concentration slope of the electric field relaxation region 120.

Simulation results of the breakdown voltage of the edge termination structure portions 12, 112 of example 4 and conventional example 5, as depicted in FIG. 42, confirm that in example 4, the breakdown voltage was higher than that of conventional example 5 substantially across the entire edge termination structure portion 12. The electric field strength distributions of the edge termination structure portions 12, 112 in the states at simulation points G1, G2 where the dose amount of the ion plantation form forming the first JTE regions 4, 104 in example 4 and conventional example 5 was $1.65 \times 10^{13}$/cm³ are depicted in FIG. 43. FIG. 43 is a characteristics diagram depicting the electric field strength distribution of the semiconductor device of example 4. From the results depicted in FIG. 43, it was confirmed that in both example 4 and conventional example 5, the electric field strength near point X1 about 50 μm outward from an interface X0 (0 μm) of the p-type guard ring 3 and the first JTE region 4 exhibits about the same maximum value. From the exhibition of the maximum electric field strength near the point X1, it is estimated that the electric field strength of the third JTE regions 6, 106 and the second JTE regions 5, 105 farther outward also increases. In example 4, it was confirmed that compared to conventional example 5, the amplitude (deflection width of the electric field strength) of the electric field at the first to third electric field relaxation regions 20, 41, 42 is small. In other words, the minimum value of the electric field strength at the first to third electric field relaxation regions 20, 41, 42 in example 4 is high compared to the minimum value of the same electric field strength in conventional example 5. Consequently, in example 4, the electric field strength near a point X2 farther outward than the first electric field relaxation region 20 and the electric field strength farther outward than the second electric field relaxation region 41 is estimated to be become high compared conventional example 5. Therefore, in example 4, it was confirmed that the electric field strength may be made higher than in conventional example 5 across the entire edge termination structure portion 12 and the breakdown voltage may be made higher than in conventional example 5.

As described above, according to the fifteenth embodiment, effects identical to those of the seventh, thirteenth, and fourteenth embodiments may be obtained.

Figure 44C:
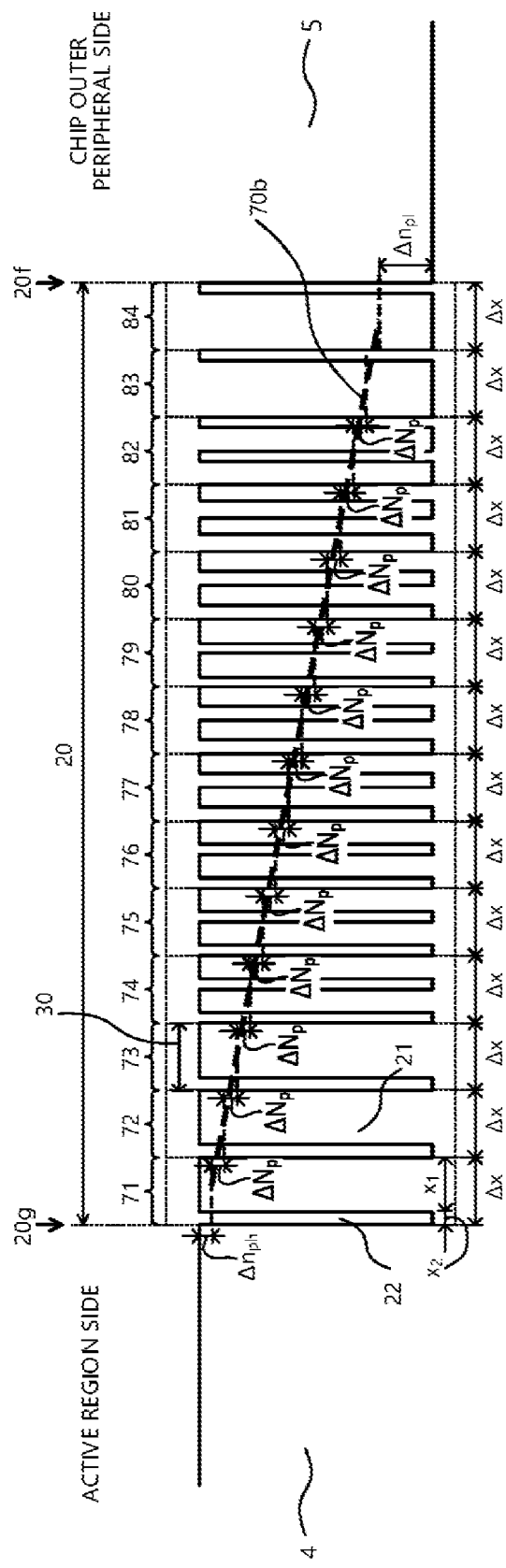

A structure of the semiconductor device according to a sixteenth embodiment will be described. FIGS. 44A, 44B, and 44C are diagrams of a structure of the semiconductor device according to the sixteenth embodiment. FIGS. 44A, 44B, and 44C depict enlarged views of the electric field relaxation region 20 in FIGS. 1A and 1B. FIGS. 44A and 44B depict enlarged views of a planar layout and a cross-sectional view of the electric field relaxation region 20, respectively. FIG. 44C depicts the p-type impurity concentration distribution at cutting line H-H' in FIG. 44A. FIG. 45 is a diagram of one example of widths of the first and second subregions in the sections depicted in FIGS. 44A, 44B, and 44C. The semiconductor device according to the sixteenth embodiment is a semiconductor device obtained by applying the fourteenth embodiment to the thirteenth embodiment.

In particular, the semiconductor device according to the sixteenth embodiment has a configuration where, similar to the fourteenth embodiment, the average impurity concentration slope 70b of the electric field relaxation region 20 is gradual and similar to the thirteenth embodiment, the p-type impurity concentration differences $\Delta n_{ph}$, $\Delta n_{p1}$ of the electric field relaxation region 20 and the first and second JTE regions 4, 5 is small. Further, in particular, the section count of the electric field relaxation region 20 and the average impurity concentration difference $\Delta Np$ between adjacent sections are determined so as to obtain the predetermined average impurity concentration slope 70b of the electric field relaxation region 20 and the predetermined p-type impurity concentration differences $\Delta n_{ph}$, $\Delta n_{p1}$ of the electric field relaxation region 20 and the first and second JTE regions 4, 5.

For example, in FIGS. 44A to 45, a case is depicted where the electric field relaxation region 20 was sectioned into 14 sections, sections 71 to 84, having the width $\Delta x$ 5.5 μm, and the average impurity concentration difference $\Delta Np$ between adjacent sections was 0.055. Reference numerals 71 to 84 are assigned to the sections sequentially from the inner side toward the outside. One of the equivalent concentration regions 30 is arranged in each of the first to third, thirteenth, and fourteenth sections 71 to 73, 83, 84 (1 cycle), and two of the equivalent concentration regions 30 are arranged in each of the fourth to twelfth sections 74 to 82 (2 cycles). The widths $x_1$, $x_2$ of the first and second subregions 21, 22 in the sections 71 to 84, similar to the thirteenth embodiment, may be changed variably based on the section count of the electric field relaxation region 20 and the average impurity concentration difference $\Delta Np$ between adjacent sections 71 to 84. Here, a state in which the widths $x_1$, $x_2$ of the first and second subregions 21, 22 differ in a direction from the inner side toward the outside, substantially similar to the thirteenth embodiment, is depicted. In this case, the width of the electric field relaxation region 20 is 77 μm.

As described above, according to the sixteenth embodiment, effects identical to those of the seventh, thirteenth, and fourteenth embodiments may be obtained. Further, according to the sixteenth embodiment, the breakdown voltage of the edge termination structure portion, which has a long electric field relaxation region width may be enhanced and the dose amount margin for forming the first JTE region may be expanded.

Figure 46A:
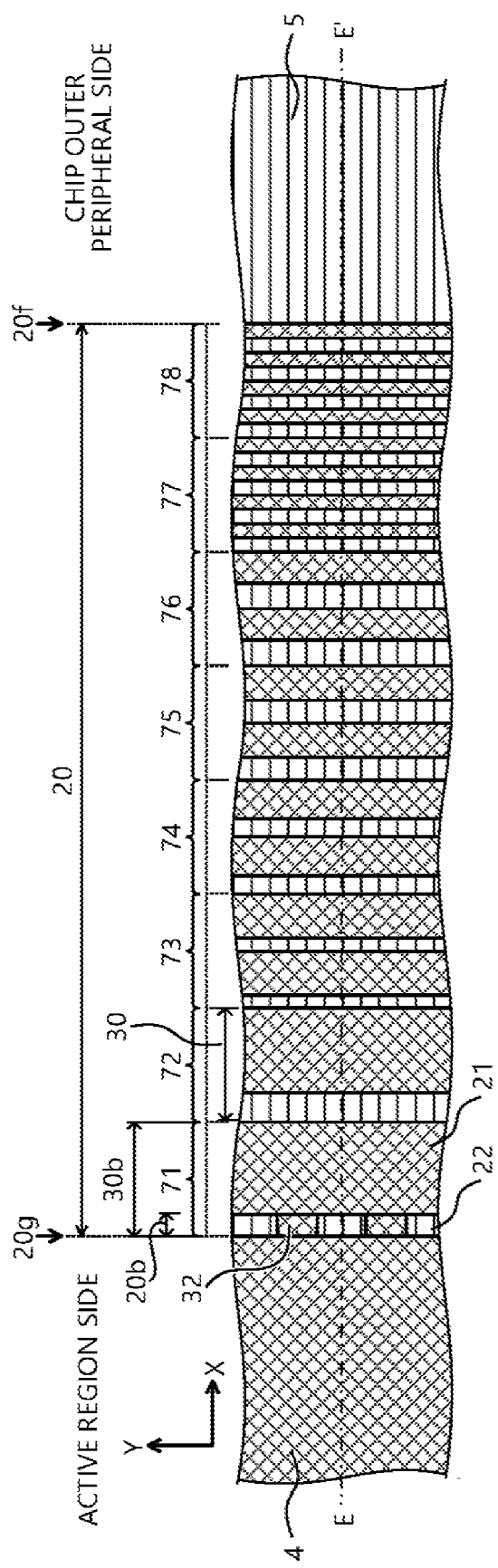
FIGS. 46A and 46B are diagrams of a structure of the semiconductor device according to a seventeenth embodiment.
Figure 46B:
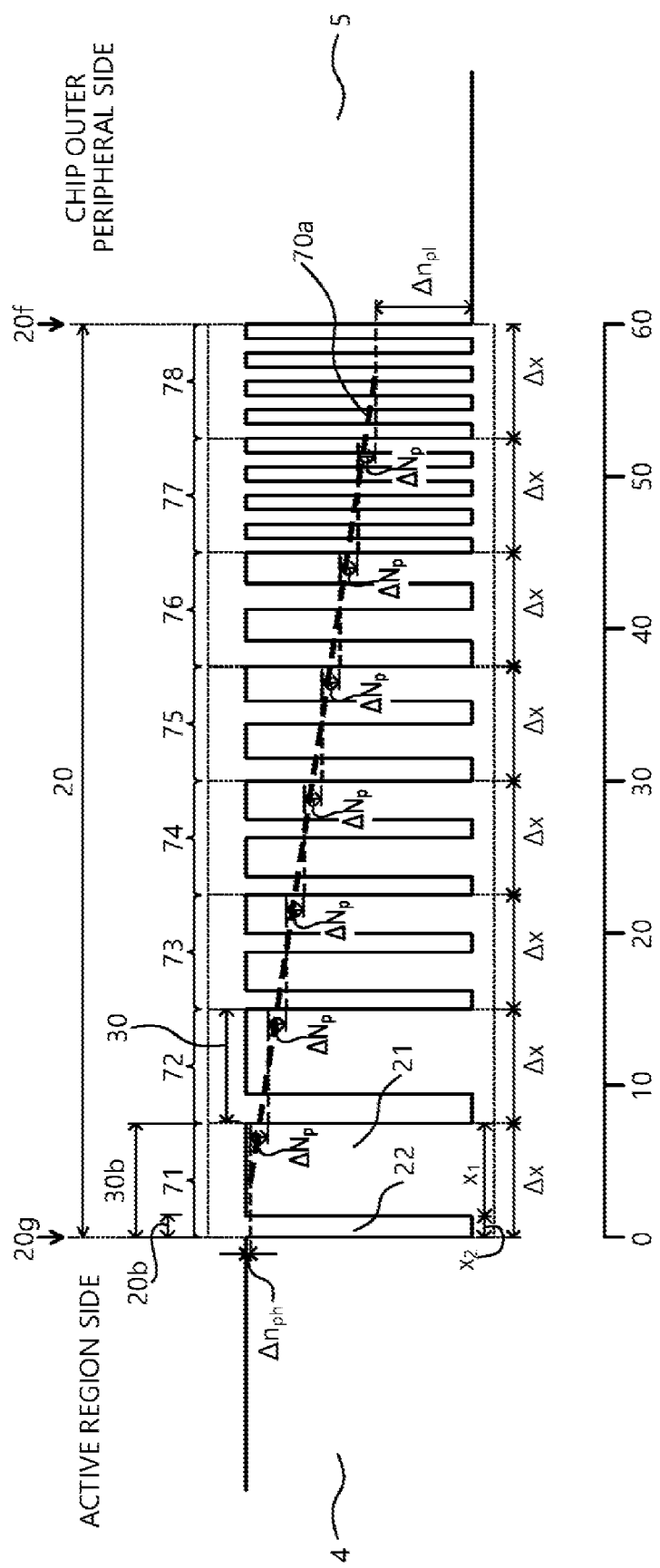

A structure of the semiconductor device according to a seventeenth embodiment will be described. FIGS. 46A and 46B are diagrams of a structure of the semiconductor device according to the seventeenth embodiment. FIG. 46A depicts a planar layout of the electric field relaxation region 20, and FIG. 46B depicts the impurity concentration distribution of the electric field relaxation region 20. The semiconductor device according to the seventeenth embodiment has a configuration obtained by applying the third embodiment to the thirteenth to sixteenth embodiments. FIGS. 46A and 46B depict a case where the third embodiment is applied to the fourteenth embodiment.

In particular, the second subregion portions 32 having an impurity concentration that is higher than that of the second subregions 22 are selectively disposed at a predetermined interval along the tangential direction Y in all of the second subregions 22 arranged in the first section 71 innermost in the electric field relaxation region 20. In other words, the first subregion 21 and the fourth subregion 20b configured by the second subregion 22 and the second subregion portions 32 are alternately and repeatedly arranged along the normal direction X in the first section 71 innermost in the electric field relaxation region 20 and one of more of the equivalent concentration regions 30b made up of one combination of a fourth subregion 20b and adjacent first subregion 21 are cyclically arranged. Thus, similar to the third embodiment, the p-type impurity concentration difference $\Delta n_{ph}$ of the first JTE region 4 and the first section 71 (the equivalent concentration region 30b) innermost in the electric field relaxation region 20 (refer to FIG. 3C) is reduced. For example, when the ratio of the impurity concentration of the second subregions 22 and the second subregion portions 32 of the first section 71 is 1:1, the average the ratio of the impurity concentration of the first section 71 may be increased to about 0.95.

Further, the innermost second subregion 22 alone may be set as the fourth subregion 20b in which the second subregion portions 32 are arranged.

As described above, according to the seventeenth embodiment, effects identical to those of the seventh embodiment may be obtained. Further, according to the seventeenth embodiment, the average impurity concentration of the innermost section of the electric field relaxation region may be made close to the impurity concentration of the first JTE region, enabling the breakdown voltage of a portion on the inner side of the edge termination structure portion to be enhanced.

Figure 47A:
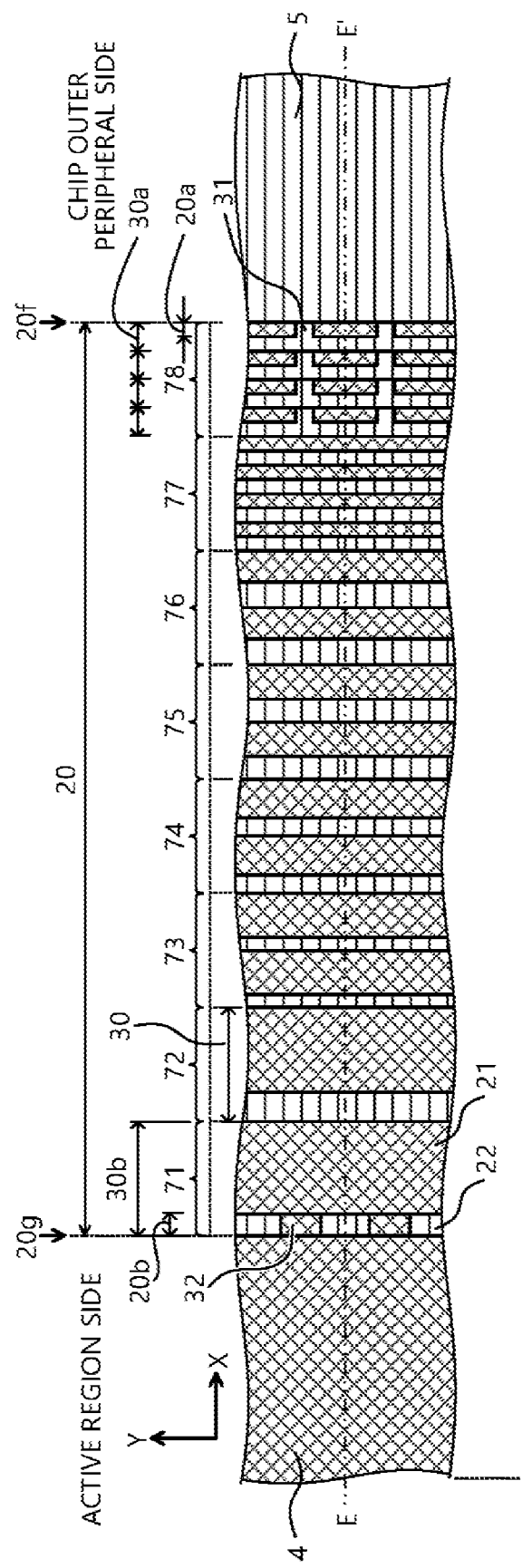

A structure of the semiconductor device according to an eighteenth embodiment will be described. FIGS. 47A and 47B are plan views depicting a planar layout of the semiconductor device according to the eighteenth embodiment. FIG. 47A depicts a planar layout of the electric field relaxation region 20 and FIG. 47B depicts the impurity concentration distribution of the electric field relaxation region 20. The semiconductor device according to the eighteenth embodiment has a configuration obtained by applying the second embodiment to the sixteenth embodiment.

In particular, as depicted in FIGS. 47A and 47B, the first subregion portions 31 having an impurity concentration that is lower than that of the first subregion 21 are selectively disposed at a predetermined interval along the tangential direction Y in all of the first subregions 21 arranged in the eighth section 78 outermost in the electric field relaxation region 20. In other words, in the eighth section 78 outermost in the electric field relaxation region 20, the second subregion 22 and the third subregion 20a configured by the first subregion 21 and the first subregion portions 31 are alternately and repeatedly arranged along the normal direction X, and one or more of the equivalent concentration regions 30a made up of one combination of a third subregion 20a and adjacent second subregion 22 are cyclically arranged (assigned reference character 30a and indicated by four horizontal double-headed arrows continuous along the normal direction X). As a result, similar to the second embodiment, the p-type impurity concentration difference $\Delta n_{p1}$ of the second JTE region 5 and the eighth section 78 outermost in the electric field relaxation region 20 (the equivalent concentration region 30a) is reduced (refer to FIG. 3C).

Further, the outermost first subregion 21 alone may be set as the third subregion 20a in which the first subregion portions 31 are arranged.

As described above, according to the eighteenth embodiment, effects identical to those of the second, seventh, and thirteenth embodiments may be obtained. According to the eighteenth embodiment, the average impurity concentration of the outermost section (or outermost equivalent concentration region) of the electric field relaxation region may be made close to the impurity concentration of the second JTE region, enabling the breakdown voltage of a portion on the outer side of the edge termination structure portion to be enhanced.

A method of manufacturing a semiconductor device according to the eighth to twelfth embodiments maybe realized by patterning an ion implantation mask with the planar layout of the subregion portions and the first and second subregions 21, 22 in the sections 61 to 64 of the electric field relaxation regions 20, 41, 42, in the method of manufacturing a semiconductor device according to the sixth embodiment.

Further, the electric field relaxation region 20 of the seventh to twelfth embodiments, similar to the first embodiment, is also made up of the first subregions 21 (the width $x_1$ of which decreases the farther out arrangement is) and the second subregions 22 (the width $x_2$ is constant independent of arrangement position), alternately and repeatedly arranged. Therefore, in the seventh to twelfth embodiments, effects identical to those of examples 1, 2 may be obtained. Further, the thirteenth to eighteenth embodiments, similar to the first embodiment, have the electric field relaxation region 20 between the first and second JTE regions 4, 5. As a result, in the seventh to twelfth embodiments, effects similar to those of examples 1, 2 may be obtained.

A method of manufacturing a semiconductor device according to the thirteenth to eighteenth embodiments maybe realized by patterning an ion implantation mask with the planar layout of the subregion portions and the first and second subregions 21, 22 in the sections 71 to 78 (or, the sections 71 to 84) of the electric field relaxation regions 20, 41, 42 in the method of manufacturing a semiconductor device according to the sixth embodiment.

Further, the electric field relaxation region 20 of the thirteenth, fourteenth, and sixteenth to eighteenth embodiments, similar to the fifteenth embodiment, has a configuration in which the widths Δx of all the sections are equal and the average impurity concentration is reduced across the entire electric field relaxation region 20 in an outward direction by a constant concentration slope. Therefore, in the thirteenth, fourteenth, and sixteenth to eighteenth embodiments, effects identical to those of example 4 may be obtained.

In the description above, the present invention may be changed variously within the spirit of the invention and in the embodiments above, for example, dimensions, impurity concentrations, and the like of elements are set according required specifications and the like. Further, in the present invention, although description is given taking a SBD as an example, without limitation hereto, the present invention is applicable to various semiconductor devices in which an edge termination structure is formed in the edge termination structure portion. In particular, for example, the present invention is applicable to a MOSFET, an Insulated Gate Bipolar Transistor (IGBT), and the like. Further, in the seventh to twelfth embodiments, although an example of a case where the electric field relaxation region is sectioned into 4 sections, without limitation hereto, the number of sections into which the electric field relaxation region is divided, the width and the number of equivalent concentration regions (cycles) arranged in the sections, the average impurity concentration difference between adjacent sections, the average impurity concentration slope of the electric field relaxation region (section), and the like may be changed to various values so that the electric field concentration of the electric field relaxation region becomes gradual.

In the embodiments, although an example is described for a case where a silicon carbide epitaxial substrate formed by depositing a silicon carbide epitaxial layer on a silicon carbide substrate is used, without limitation hereto, for example, all of the regions configuring the device may be set as a diffusion region formed by ion implantation in a silicon carbide substrate. The present invention is further applicable to semiconductor devices that use a silicon semiconductor material and achieves the same effects. Further, although in the embodiments, a first conductivity type is assumed as an n-type and a second conductivity type is assumed as a p-type, the present invention is similarly implemented when the first conductivity type is a p-type and the second conductivity type is an n-type.

However, as described above, conventionally, the silicon carbide semiconductor must have multiple JTE regions adjacently formed with the impurity concentration made lower in the regions disposed on the outer side so as to improve the breakdown voltage determined by the critical field strength in the outer peripheral portion of the JTE structure and, since the impurity concentration gradient is made discontinuous at boundaries between the JTE regions, concentration of the electric field occurs. With regard to this problem, in Japanese Laid-Open Patent Publication No. 2008-034646 and International Publication No. 2012/049872, the p$^-$-type subregions 121 having the same impurity concentration as the first JTE region 104 and the p$^{---}$-type subregions 122 having the same impurity concentration as the second JTE region 105 are alternately repeatedly arranged in a concentric shape between the first and second JTE regions 104, 105 and have a width narrower than the first and second JTE regions 104, 105. Since this is equivalent to disposing between the first and second JTE regions 104, 105, the electric field relaxation region 120 having an intermediate impurity concentration between the first and second JTE regions 104, 105, it is presumed that the gradient of impurity concentration reduced from the inner side toward the outside is made gradual in the JTE structure.

The spatial impurity concentration gradient in the entire electric field relaxation region 120 is determined by respective widths of impurity concentration gradients of the p$^-$-type subregions 121 and the p$^{---}$-type subregions 122 arranged alternately and an impurity concentration ratio between the p$^-$-type subregions 121 and the p$^{---}$-type subregions 122. For example, among a combination of a p$^-$-type subregion 121 and an adjacent p$^{---}$-type subregion 122, the width and impurity concentration of the p$^-$-type subregion 121 are assumed as $x_{11}$ and $n_{p11}$, respectively, and the width and the impurity concentration of the p$^{---}$-type subregion 122 are assumed as $x_{12}$ and $n_{p12}$, respectively. In this case, in the electric field relaxation region 120, an average impurity concentration N of the portion where the combination of the p$^-$-type subregion 121 and the adjacent p$^{---}$-type subregion 122 is arranged is expressed by equation 1 below. Therefore, the widths $x_{11}$, $x_{12}$ and the impurity concentrations $n_{p11}$, $n_{p12}$ of the adjacent p$^-$-type subregion 121 and p$^{---}$-type subregion 122 are continuously varied in direction toward the outside and the impurity concentration distribution of the electric field relaxation region 120 advantageously becomes as close as possible to an impurity concentration distribution where the impurity concentration gradually decreases from the inner side toward the outside.

$$N=((x_{11} \times n_{p11})+(x_{12} \times n_{p12}))/(x_{11} \times x_{12}) \qquad (1)$$

Nonetheless, when the impurity concentration distribution of the electric field relaxation region 120 becomes as close as possible to an ideal state by a configuration satisfying equation 1, the width of the depletion layer increases and ultimately, the width of the electric field relaxation region 120 increases, resulting in a problem of the chip size increasing. Therefore, to gradually decrease the impurity concentration distribution of the electric field relaxation region 120 from the inner side toward the outside, without an increase in the width of the depletion layer, it is important for the widths $x_{11}$, $x_{12}$ and the impurity concentrations $n_{p11}$, $n_{p12}$ of the p$^-$-type subregions 121 and the p$^{---}$-type subregions 122 to each be properly selected at the time of element design. In particular, International Publication No. 2012/049872 discloses that the widths $x_{11}$ of the p$^-$-type subregions 121 are the same or progressively decrease the farther the p$^-$-type subregion 121 is arranged toward the outside and the widths $x_{12}$ of the p$^{---}$-type subregions 122 are greater the farther the p$^{---}$-type subregion 122 is arranged toward the outside. Therefore, compared to a case where all of the p$^-$-type subregions 121 and the p$^{---}$-type subregions 122 are arranged to have the same width, although the impurity concentration distribution of the electric field relaxation region 120 can be gradually decreased in a direction toward the outside and the electric field relaxation effect is increased, the width of the electric field relaxation region 120 increases.

Concerning the width of the electric field relaxation region 120, the JTE structure of International Publication No. 2012/049872 was verified as an example. FIG. 19 is a cross-sectional view of an example of another conventional SiC-SBD structure. FIG. 19 corresponds to FIG. 11 of International Publication No. 2012/049872. In FIG. 19, the left side is the active region 111 side and the right side is the chip end portion. Typically, in a 3000 V or greater SBD, a 3-zone JTE structure is used in which three p-type regions having differing impurity concentrations are concentrically arranged outside the p-type guard ring 103 that surrounds the active region 111. FIG. 19 depicts, as one example of a JTE structure used in a SBD, a 3-zone JTE structure formed by three p-type regions 104 to 106 having differing impurity concentrations (hereinafter, first to third JTE regions, sequentially from a high impurity concentration side (i.e., the p-type guard ring 103 side) toward the outside). Between adjacent JTE regions among the first to third JTE regions 104 to 106, electric field relaxation regions (hereinafter, first to third electric field relaxation regions) 120, 141, 142 are arranged (the third electric field relaxation region 142 is between the third JTE region 106 and the n$^-$-type drift layer 102).

In the verification, the impurity concentration and thickness of the n$^-$-type drift layer 102 were $3 \times 10^{15}/\text{cm}^3$ and 30 μm, respectively. The impurity concentration ratio of the first to third JTE regions 104 to 106 was the first JTE region 104:the second JTE region 105:the third JTE region 106=1: 0.6:0.4. In each of the first to third electric field relaxation regions 120, 141, 142, a high concentration subregion having the same impurity concentration as the adjacent JTE region on the inward side and a low concentration subregion having the same impurity concentration as the adjacent JTE region on the outward side (in the third electric field relaxation region 142, the same impurity concentration as the n⁻-type drift layer 102) are alternately and repeatedly arranged in a concentric shape. Further, together with the first to third electric field relaxation regions 120, 141, 142, the widths of the high concentration subregions decrease the closer the high concentration subregion is arranged to the outside and the widths of the low concentration subregions increase the closer the low concentration subregion is arranged to the outside. An example of a result of simulating for optimal widths of the high concentration subregions and the low concentration subregions whereby electric field concentration does not occur in the first to third electric field relaxation regions 120, 141, 142 is depicted in FIG. 19. In FIG. 19, regions having the same impurity concentration are indicated by the same hatching.

As depicted in FIG. 19, in each of the first to third electric field relaxation regions 120, 141, 142, four high concentration subregions and four low concentration subregions are arranged. The widths of the high concentration subregions (the p⁻-type subregions 121 having the same impurity concentration as the first JTE region 104) of the first electric field relaxation region 120, sequentially from the inner side, were 12.5 µm, 11.0 µm, 9.5 µm, and 8.0 µm, respectively. The widths of the low concentration subregions (the p⁻⁻-type subregions 122 having the same impurity concentration as the second JTE region 105) of the first electric field relaxation region 120, sequentially from the inner side, were 1.5 µm, 3.0 µm, 4.5 µm, and 6.0 µm, respectively. The widths of the high concentration subregions and the low concentration subregions of the second and third electric field relaxation regions 141, 142 are the same measurements as those of the high concentration subregions and the low concentration subregions of the first electric field relaxation region 120 (not depicted). Therefore, in the present example, the width of one electric field relaxation region is 56 µm and the width of JTE structure increases by the total width 168 µm(=3×56 µm) of the first to third electric field relaxation regions 104 to 106. Consequently, the width of the edge termination structure portion 112 increases by the width of the JTE structure.

For example, a silicon carbide semiconductor material has a high cost than a silicon material and this difference is significant. In particular, in the case of the same wafer diameter, the silicon carbide semiconductor wafer is 20 times the cost of a semiconductor wafer, or more. Further, a silicon carbide semiconductor material has a much greater defect density than a silicon semiconductor material. Therefore, reductions in chip size greatly contribute to reductions in chip cost and improved quality. Consequently, the width of the electric field relaxation region is advantageously is as small as possible within a range satisfying predetermined electrical characteristics (sustaining breakdown voltage, etc.).

According to the invention above, an intermediate region is disposed between adjacent semiconductor regions, whereby the impurity concentration slope between the adjacent semiconductor regions may be made smaller as compared to a case where the intermediate region is not disposed. Therefore, since the electric field between the adjacent semiconductor regions may be relaxed, the dielectric breakdown resistance at an outer portion of the edge termination structure portion may be increased. Further, according to the described invention, the second subregions have a constant width and the first subregions have widths that are narrower the farther outward arrangement is thereby enabling the width of the intermediate region to be made narrower, whereby the edge length (width of the edge termination structure portion) may be reduced.

As described, the semiconductor device according to the present invention achieves an effect in that cost increases may be avoided and the breakdown voltage of the edge termination structure portion may be enhanced.

Further, the semiconductor device according to the present invention is useful for high voltage semiconductor devices having a JTE structure and is particularly suitable for silicon carbide semiconductor devices of breakdown voltage classes of 1200 V or higher (e.g., 1700 V or 3300 V).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor substrate of a first conductivity type, formed of a silicon carbide semiconductor;
an active region disposed on a front surface of the semiconductor substrate and through which a main current flows, the active region having a periphery; and
an edge termination structure surrounding the periphery of the active region, wherein
the edge termination structure includes:
a plurality of semiconductor regions disposed concentrically surrounding the periphery of the active region, the plurality of semiconductor regions having a lower impurity concentration the further each of the plurality of semiconductor regions is from the periphery of the active region, and
an intermediate region of the second conductivity type, disposed so as to mutually contact adjacent ones of the plurality of semiconductor regions, the intermediate region having an impurity concentration that is lower than that of the adjacent semiconductor region on a side closer to the periphery of the active region and an impurity concentration that is higher than that of the semiconductor region adjacent on a side further from the periphery of the active region, wherein
the intermediate region includes a plurality of microregions each of which includes a first subregion of the second conductivity type and a second subregion of the second conductivity type, each microregion concentrically surrounding the adjacent semiconductor region on the side closer to the periphery of the active region,
in each of the plurality of microregions, each of the first and second subregions has a width that is constant, the second subregion having an impurity concentration lower than that of the first subregion, and
among the plurality of microregions, the farther a microregion is positioned from the active region in the intermediate region, the narrower a width of the microregion becomes.

2. The semiconductor device according to claim 1, wherein
among the plurality of the first subregions, an outermost first subregion positioned outermost from the periphery of the active region includes at least one first portion of the second conductivity type that is selectively disposed therein, and has an impurity concentration lower than an impurity concentration of the rest of region other than the at least one first portion in the outermost first subregion first.

3. The semiconductor device according to claim 2, wherein
the at least one first portion includes a plurality of first portions, and the plurality of first portions are disposed at a predetermined interval along a direction of a border of the active region and the edge termination structure.

4. The semiconductor device according to claim 1, wherein
among the plurality of the second subregions, an innermost second subregion positioned innermost to the periphery of the active region includes at least one second portion of the second conductivity type that is selectively disposed therein, and has an impurity concentration higher than an impurity concentration of the rest of region other than the at least one second portion in the innermost second subregions.

5. The semiconductor device according to claim 4, wherein
the at least one second portion includes a plurality of second portions, and the plurality of second portions are disposed at a predetermined interval along a direction of a border of the active region and the edge termination structure.

6. The semiconductor device according to claim 1, wherein
an average of an impurity concentration $N_p$ of said each microregion satisfies the following equation:

$$N_p = ((x_1 \times n_{p1}) + (x_2 \times n_{p2}))/(x_1 + x_2)$$

where, a width and an impurity concentration of each first subregion are $x_1$ and $n_{p1}$, respectively, and a width and an impurity concentration of each second subregion are $x_2$ and $n_{p2}$, respectively.

7. The semiconductor device according to claim 1, wherein
each of the plurality of second subregions has the same width.

8. The semiconductor device according to claim 1, wherein
among the plurality of first subregions, the farther outward a first subregion is positioned, the narrower a width of the first subregion becomes.

9. The semiconductor device according to claim 1, wherein
one of the plurality of first subregions positioned outermost from the periphery of the active region has a width that is a smallest size formable by manufacture processing.

10. The semiconductor device according to claim 1, wherein
the first subregion of said each microregion includes a first portion of the second conductivity type that is selectively disposed therein, and has an impurity concentration lower than that of the rest of region other than the first portion in the first subregion, and
among the plurality of microregions, the farther outward a microregion is positioned, the higher a ratio of an area of the first portion to an area of the first subregion becomes.

11. The semiconductor device according to claim 1, wherein
the second subregion of said each microregion includes a second portion of the second conductivity type that is selectively disposed therein, and has an impurity concentration higher than an impurity concentration of the rest of region other than the second portion in the second subregion, and
among the plurality of microregions, the farther outward a microregion is positioned, the lower a ratio of an area of the second portion to an area of the second subregion becomes.

12. The semiconductor device according to claim 1, wherein
an average of the impurity concentration of the intermediate region is intermediate between an impurity concentration of an adjacent one of the semiconductor regions on a side closer to the periphery of the active region and an adjacent one of the semiconductor regions on a side further from the periphery of the active region.

* * * * *